(12) United States Patent
Graham

(10) Patent No.: US 6,695,034 B2
(45) Date of Patent: Feb. 24, 2004

(54) SYSTEM FOR CASTING A METAL ARTICLE

(75) Inventor: Lawrence D. Graham, Chagrin Falls, OH (US)

(73) Assignee: PCC Airfoils, Inc., Cleveland, OH (US)

( * ) Notice: Subject to any disclaimer, the term of this patent is extended or adjusted under 35 U.S.C. 154(b) by 0 days.

(21) Appl. No.: 10/308,578

(22) Filed: Dec. 3, 2002

(65) Prior Publication Data

US 2003/0079855 A1 May 1, 2003

Related U.S. Application Data

(63) Continuation-in-part of application No. 10/189,656, filed on Jul. 3, 2002, which is a continuation-in-part of application No. 09/569,906, filed on May 11, 2000, now Pat. No. 6,443,213.

(51) Int. Cl.[7] ........................... B22D 27/04; B22D 46/00
(52) U.S. Cl. ..................... 164/122.1; 164/125; 164/4.1
(58) Field of Search ................................ 164/122–128, 164/34, 35

(56) References Cited

U.S. PATENT DOCUMENTS 3,810,504 A    5/1974   Piwonka
3,841,384 A   10/1974   Tingquist et al.
4,573,516 A    3/1986   Quested et al.
5,778,961 A    7/1998   Hugo et al.
6,035,924 A    3/2000   Graham

FOREIGN PATENT DOCUMENTS

JP    54-106031    8/1979

Primary Examiner—M. Alexandra Elve
Assistant Examiner—Kevin McHenry
(74) Attorney, Agent, or Firm—Tarolli, Sundheim, Covell & Tummino L.L.P.

(57) ABSTRACT

The fluidized bed is formed of particulate material suspended in a flow of gas. A flow of particulate suspended in gas is conducted between a lower end portion of the fluidized bed and an upper end portion of the fluidized bed to cool the upper end portion of the fluidized bed. The flow of particulate suspended in gas may be conducted from a lower end portion of the fluidized bed to an upper end portion of a fluidized bed. Alternatively, the flow of particulate suspended in gas may be conducted from the upper end portion of the fluidized bed to the lower end portion of the fluidized bed. If desired, the flow of particulate suspended in gas may be conducted to the upper end portion of the fluidized bed from a location spaced from the fluidized bed.

69 Claims, 30 Drawing Sheets

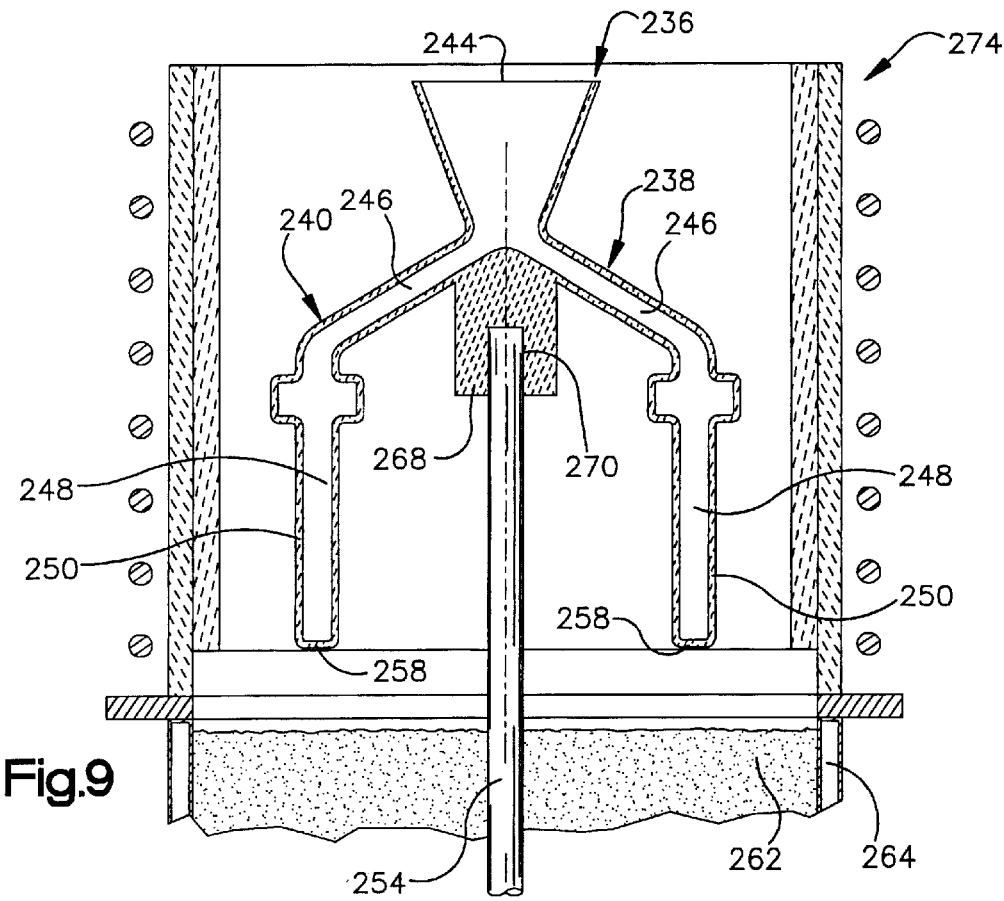
Fig.9
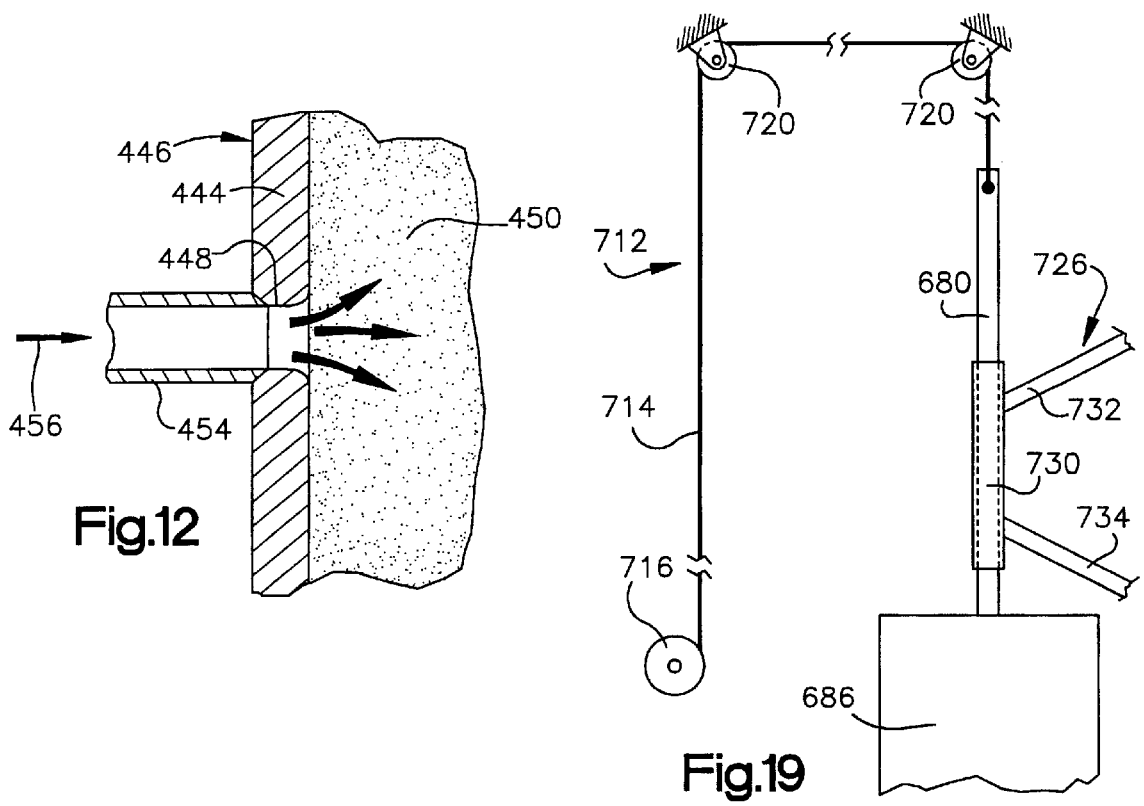
Fig.12
Fig.19

SYSTEM FOR CASTING A METAL ARTICLE

RELATED APPLICATIONS

This application is a continuation-in-part of U.S. patent application Ser. No. 10/189,656 filed Jul. 3, 2002. The aforementioned application Ser. No. 10/189,656 is itself a continuation-in-part of U.S. patent application Ser. No. 09/569,906 filed May 11, 2000, now U.S. Pat. No. 6,443,213. The benefit of the earlier filing dates of the aforementioned application Ser. No. 09/569,906 and 10/189,656 is hereby claimed for all subject matter common to this application and the aforementioned application Ser. Nos. 09/569,906 and 10/189,656. The disclosure in the aforementioned application Ser. Nos. 09/569,906 and 10/189,656 are incorporated herein in their entirety by this reference thereto.

BACKGROUND OF THE INVENTION

The present invention relates to a new and improved method and apparatus for casting a metal article. A mold for the metal article may be moved into a fluidized bed to promote heat transfer from the mold. The fluidized bed may be positioned adjacent to a furnace assembly.

An apparatus for molding a metal article is disclosed in U.S. Pat. No. 4,573,516. This apparatus includes a furnace assembly and a mold filled with molten metal. The apparatus also includes a fluidized bed which is disposed below the furnace assembly. The mold is lowered from the furnace assembly into the fluidized bed to effect solidification of the molten metal in the mold.

Another apparatus for use in casting metal articles and utilizing a fluidized bed is disclosed in U.S. Pat. No. 6,035,924. This apparatus includes a furnace assembly from which a mold containing molten metal is lowered into a fluidized bed. A layer of hollow spherical bodies is disposed on an upper end portion of the fluidized bed.

SUMMARY OF THE INVENTION

The present invention relates to a new and improved method and apparatus for use in casting one or more metal articles. During casting of a metal article, a mold may be moved into a fluidized bed. The fluidized bed may be formed of particulate materials suspended in a flow of gas. As the mold is moved into the fluidized bed, molten metal in the mold solidifies.

In accordance with one of the features of the present invention, an upper end portion of the fluidized bed may be cooled. Cooling of the upper end portion of the fluidized bed may be accomplished by conducting a flow of relatively cool particulate suspended in gas to the upper end portion of the fluidized bed. The flow of relatively cool particulate suspended in gas may be conducted from a lower end portion of the fluidized bed to an upper end portion of a fluidized bed. Alternatively, the flow of relatively cool particulate suspended in gas may be conducted from a location outside of the fluidized bed to the upper portion of the fluidized bed. If desired, the flow of particulate suspended in gas may be conducted from the upper end portion of the fluidized bed to the lower end portion of the fluidized bed.

It should be understood that any one of the features of the invention may be utilized by itself or in combination with other features of the invention. It should also be understood that the invention is not to be limited to any one of the specific embodiments disclosed herein. This is because there are many different ways in which the various features of the invention may be used together or separately and in which they may be changed from the specific embodiments disclosed herein.

BRIEF DESCRIPTION OF THE DRAWINGS

The foregoing and other features of the invention will become more apparent upon a consideration of the following description taken in connection with the accompanying drawings wherein:

FIG. 9. is a schematic fragmentary illustration depicting the relationship between a furnace assembly, mold, mold support and fluidized bed, the mold support being effective to engage a central portion of the mold;

FIG. 12. (on sheet 6 of the drawings) is a fragmentary sectional view illustrating the manner in which gas may be conducted through a side wall of the container into the fluidized bed;

FIG. 19. (on sheet 6 of the drawings) is a schematic illustration, taken generally along the line 19—19 of FIG. 18, depicting the manner in which the members suspending the mold in FIG. 18 are moved relative to a furnace assembly;

DESCRIPTION OF SPECIFIC PREFERRED EMBODIMENTS OF THE INVENTION

General Description

Figure 1:
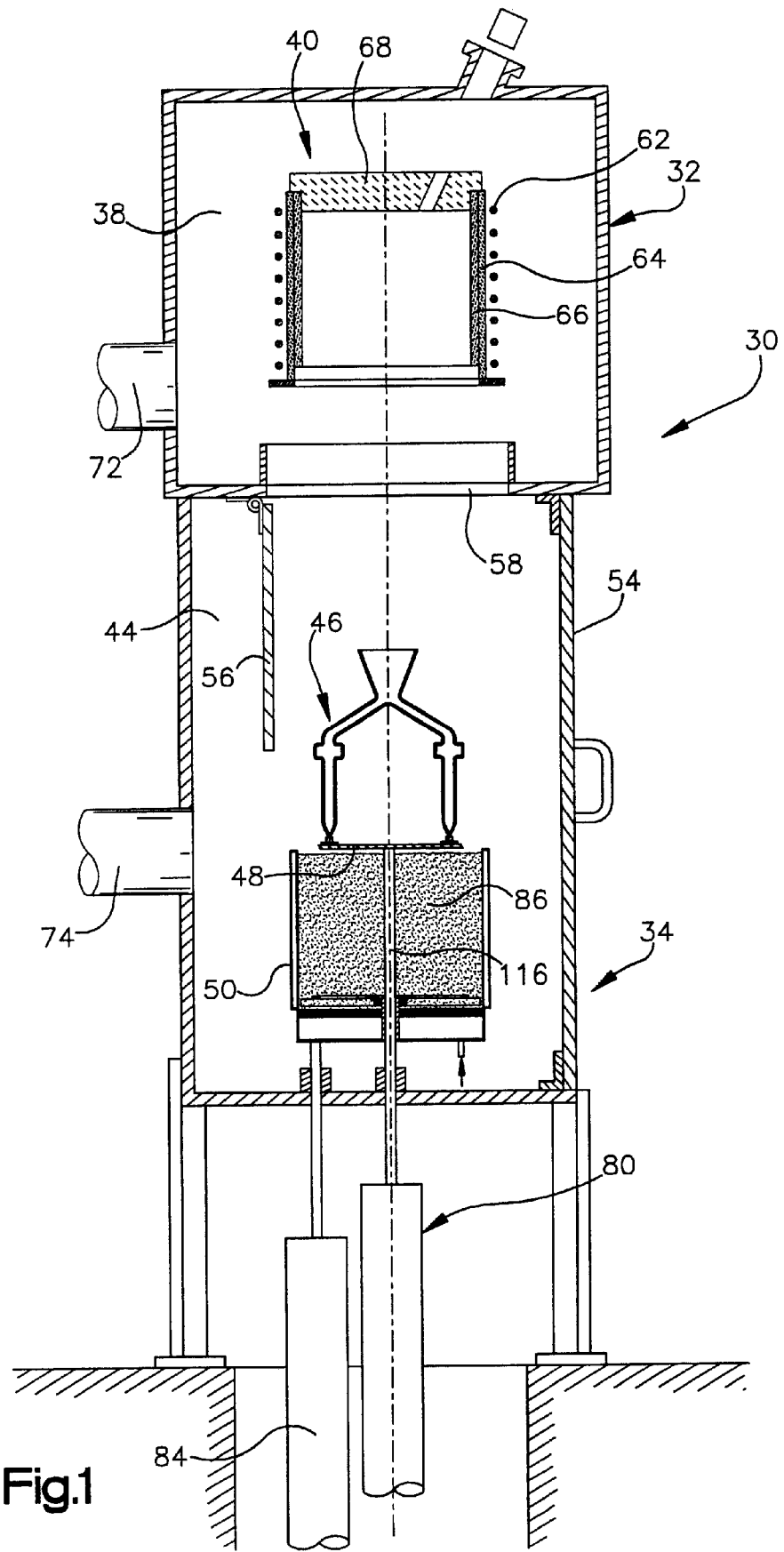
FIG. 1. is a schematic sectional view of one specific embodiment of an apparatus for use in casting a metal article and depicting the relationship between a furnace assembly, a mold and a container for a fluidized bed.
Figure 2:
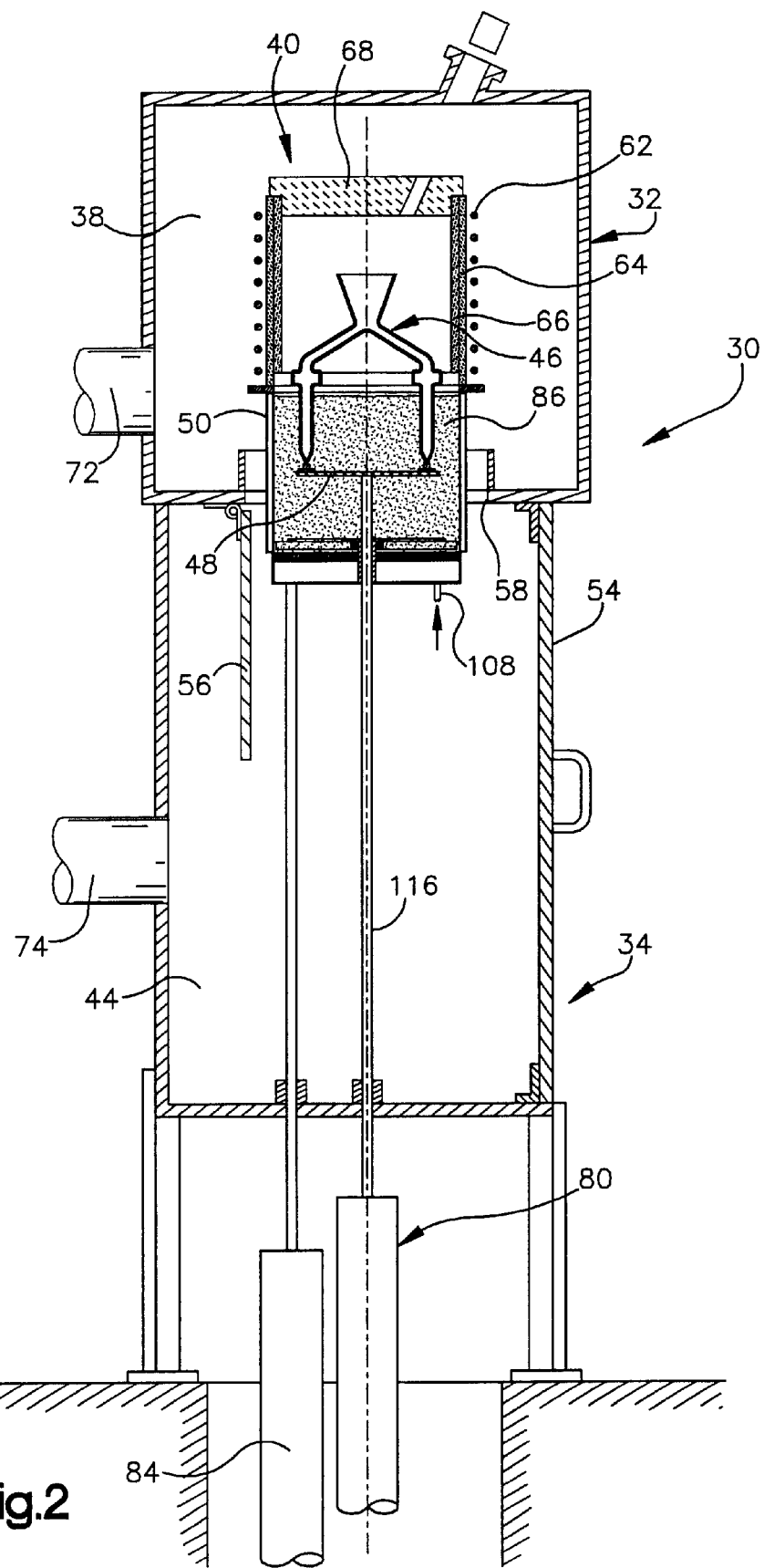
FIG. 2. is a schematic sectional view, generally similar to FIG. 1, illustrating the manner in which the mold is moved from the furnace assembly into the fluidized bed held by the container.

A casting apparatus 30 is illustrated schematically in FIGS. 1 and 2. The casting apparatus 30 includes an upper housing 32 and a lower housing 34. The upper housing 32 has a melt chamber 38 in which a furnace assembly 40 is disposed. The lower housing 34 has a loading chamber 44 in which a mold 46 is disposed.

The mold 46 is disposed on a movable support 48 above a container 50 for a fluidized bed. The lower housing 34 includes a door 54 which can be opened to provide access to the loading chamber 44. A flapper valve or panel 56 is pivotal to close an opening 58 between the melt chamber 38 and loading chamber 44 when the door 54 is open.

The furnace assembly 40 is of the know induction type and includes an induction coil 62. The coil is located in a surrounding relationship with a cylindrical refractory wall 64. A cylindrical radiation liner 66 is provided within the refractory wall 64. A cover 68 is provided over an upper end portion of the refractory wall 64.

Conduits 72 and 74 are connectable with a source of vacuum or low pressure. When the door 54 is closed, and the flapper valve 56 is in the open condition illustrated in FIG. 1, the conduits 72 and 74 are both connected with a source of low pressure to evacuate the melt chamber 38 and lower chamber 44. Prior to opening of the door 54, the flapper valve 58 is closed and the conduit 74 is connected to atmospheric pressure. This results in the evacuated atmosphere being maintained in the melt chamber 38 while the door 54 is opened to the atmosphere. The furnace assembly 40, upper housing 32, and lower housing 34 may have any one of many known constructions. It is believed that the furnace assembly 40 and upper and lower housings 32 and 34 may be constructed in the same manner as is disclosed in U.S. Pat. No. 3,841,384.

When the mold 46 is to be utilized to form a cast metal article, the flapper valve 56 is closed and the loading chamber 44 is exhausted to atmosphere. The door 54 to the loading chamber 44 is then opened. The mold 46 is placed on the mold support 48 while the empty mold support is disposed slightly above the container 50, in the manner illustrated schematically in FIG. 1.

Particulate within the container 50 is then fluidized to enable the support 48 to be lowered into the container. Once the particulate in the container 50 has been fluidized, a mold support drive assembly 80 is operated to lower the mold support 48 into the fluidized bed in the container 50. This moves the mold 46 out of the path of movement of the flapper valve 56 between its open and closed positions. However, at this time, the flapper valve 56 is maintained in its closed position.

The door 54 is then sealed and the conduit 74 is connected with a source of low pressure or vacuum to evacuate the loading chamber 44. Once the loading chamber 44 has been evacuated to the same pressure as the melt chamber 38, the flapper valve 56 is pivoted from its close position to the open position illustrated in FIG. 1. The mold support drive assembly 80 is then operated to move the mold 46 upward through the opening 58 into the furnace assembly 40.

After the mold 46 has been moved into the furnace assembly 40, the container 50 is moved from the lowered position shown in FIG. 1 to the raised position shown in FIG. 2 by operation of a container drive assembly 84. The container drive assembly 84 moves the container 50 and fluidized bed 86 to a location immediately below the furnace assembly 40. At this time, the mold support 48 is disposed above the container 50 in the furnace 40. The fluidized bed 86 in the container 50 is disposed immediately beneath the furnace assembly and is spaced from the mold support 48.

In the foregoing description of movement of the mold 46 into the furnace assembly 40, the mold has first been moved into the fluidized bed 86, to provide space in the loading chamber 44 for movement of the flapper valve 56. The mold 46 is then withdrawn from the fluidized bed 86 and moved into the furnace assembly 40, while the container 50 holding the fluidized bed 86 is stationary. The container 50 and fluidized bed 86 are subsequently moved upward to a position beneath the furnace assembly 40, while the mold 46 is stationary in the furnace assembly.

It should be understood that the mold 46 and container 50 can be moved relative to the furnace assembly 40 in a different manner if desired. For example, the loading chamber 44 could be large enough to enable the flapper valve 56 to be moved between its open and closed positions with the mold 46 disposed above the container 50, as illustrated in FIG. 1. If desired, the flapper valve 56 could be constructed so as to move between its open and closed positions along a path which does not interfere with the mold 46 when the mold is in the position shown in FIG. 1. For example, the flapper valve may move between its open and closed positions along a horizontal path.

It is contemplated that the mold 46 may be moved into the furnace assembly 40 before gas is conducted into the container to fluidize the particulate in the container. If this was done, the container 50 could be moved to the raised position with the bed 86 in a defluidized condition. The mold 46 and container 50 may be raised together, with the mold above the container, by effecting simultaneous operation of the mold support drive assembly 80 and container drive assembly 84. The bed 86 could be fluidized, by a flow of gas into the container 50, either before or after the container is moved from the lowered position to the raised position.

Alternatively, the bed 86 could be fluidized and the mold 46 moved into the bed while the container 50 is in the lowered position of FIG. 1. The container 50 and mold 46 could then be moved together to the raised position with the mold in the fluidized bed 86, by effecting simultaneous operation of the mold support drive assembly 80 and the container drive assembly 84. The mold support drive assembly 80 would then be operated to move the mold 46 out of the raised container 50 and fluidized bed 86 into the furnace assembly 40.

While the mold 46 is disposed in the furnace assembly 40, the mold is heated to a temperature between 2,500 degrees Fahrenheit and 3,000 degrees Fahrenheit. At this time, the fluid pressure in the melt chamber 38 and loading chamber 44 is between $6 \times 10^{-4}$ atmospheres and 1.0 atmosphere. The upper portion of the raised fluidized bed 86 is exposed to the same temperature and pressure as the mold 46 in the furnace assembly 40. It should be understood that the specific temperatures and pressures in the furnace assembly 40 and melt chamber 38 may vary depending upon the characteristics of the molten metal to be poured into the mold. It is contemplated that other temperatures and pressures may be utilized.

Once the mold 46 has been heated to the desired temperature in the furnace assembly 40, the mold is filled with molten metal. With the specific embodiment of FIG. 1, the molten metal is a nickel-chrome superalloy. Shortly after the mold 46 is filled with molten metal, the mold is lowered into the fluidized bed 86. To lower the mold 46 into the raised fluidized bed 86, the mold support drive assembly 80 is operated to lower the mold support 48 while the container 50 is held stationary relative to the upper housing 32 by the container drive assembly 84 (FIG. 2).

When the mold 46 is to be utilized to cast single crystal articles, such as airfoils, out of a nickel-chrome super alloy, the mold may be lowered from the furnace assembly 40 into the fluidized bed 86 at a rate of twenty inches or more per hour. Single crystal articles, such as airfoils, have previously been lowered from a furnace, similar to the furnace 40, at a rate of approximately six to eight inches per hour. It should be understood that the foregoing specific rates of lowering the mold 46 from the furnace assembly 40 will be different for different articles, metals and/or crystal structures. The relatively high rate at which the mold 46 can be lowered from the furnace assembly 40 is achieved due to the fact that the fluidized bed 86 is effective to rapidly cool the mold 46 and solidify molten metal in the mold. The rapid cooling of the mold 46 is obtained by conduction of heat to the particulate in the fluidized bed which is blown against the mold 46 by a flow of gas through the fluidized bed 86.

If desired, the mold 46 may be lowered into the fluidized bed 86 only far enough to completely immerse in the fluidized bed the portion of the mold in which article mold cavities are disposed. A gating system, which extends upward from the article mold cavities, does not have to be completely immersed in the fluidized bed 86. However, it is believed that it will probably be desired to lower the mold 46 at least far enough into the fluidized bed 86 so as to immerse the lower end portion of the gating system in the fluidized bed.

Once the mold 46 has been lowered into the fluidized bed 86, the mold support drive assembly 80 and the container drive assembly 84 are operated to simultaneously lower the mold 46 and the container 50. When the container 50 has been moved back to the lowered position illustrated in FIG. 1, the mold 46 will still be immersed in the fluidized bed 86. Therefore, the mold 46 will be beneath the path of movement of the flapper valve 56. The flapper valve 56 can be operated from the open position illustrated in FIG. 1 to the closed position sealing the opening 58.

Once the flapper valve 56 has been closed to isolate the melt chamber 38 from the loading chamber 44, the conduit 74 vents the loading chamber 44 to atmospheric pressure. The door 54 can then be opened. After the door 54 is opened, the mold support drive assembly 80 may be operated to move the mold out of the fluidized bed 86 to the position illustrated in FIG. 1. When the mold 46 is disposed above the fluidized bed 86, as illustrated in FIG. 1, the mold can be readily removed from the loading chamber 44 with the solidified molten metal in the mold. A next succeeding mold is then positioned on the mold support 48. Molten metal is then cast in the next succeeding mold in the manner previously described in conjunction with the mold 46.

Although one specific casting apparatus 30 has been illustrated in FIG. 1, a casting apparatus having a different construction may be utilized in association with the fluidized bed 86. For example, the furnace assembly 40, upper housing 32 and/or lower housing 34 may have a different construction if desired. The mold support drive assembly 80 and container drive assembly 84 could be constructed differently and operated to raise and lower the mold 46 and container in a different manner and/or sequence if desired. Of course, the mold 46 could have a different construction and be used to cast any desired article or articles. The mold 46 may be constructed to have a single article mold cavity rather than a plurality of article mold cavities. The mold 46 may be constructed to cast articles having any desired crystallographic structure.

Fluidized Bed

The fluidized bed 86 (FIG. 3) is held in the container 50. The container 50 has a cylindrical side wall 92 with a water cooling passage or jacket 94 which functions as a heat sink. The cooling jacket 94 extends completely around the container 50 and is effective to cool the fluidized bed 86.

The fluidized bed 86 is formed of particles suspended in a flow of gas. The gas may be argon. The particles may be alumina particles of 325 to 90 mesh size. Although the particles may be formed of alumina, it is believed that it may be preferred to utilize zircon particles which have a more rounded configuration than alumina particles. For example, it may be preferred to form the fluidized bed 86 by conducting gas through 200 mesh zircon particles. It should be understood that a gas and/or particulate other than the specific gas and/or particulate set forth herein may be used to form the fluidized bed 86.

The height of the fluidized bed 86 will vary depending upon the height of the mold 46 in which articles are to be cast. It is contemplated that the fluidized bed 86 may have a height of between ten and forty inches. However, it should be understood that the height of the bed may be outside of this range to accommodate a particular mold structure for the casting of a particular article. The fluidized bed 86 has a weight of approximately twelve pounds for each inch of bed height for each square foot of the bed in a horizontal plane.

Prior to fluidization of the bed, the particulate is held in the container 50. When the bed is fluidized, gas flows between the particles. There may be a relatively small increase in the volume occupied by the particles when the bed is fluidized. Thus, when the bed is fluidized, the volume occupied by the particles may increase by less than ten percent.

To fluidize the particles in the container 50, gas is conducted into a pile of the particles. In the embodiment of the invention illustrated in FIG. 3, the particles in the container 50 are fluidized by gas conducted from a cylindrical plenum chamber 98 disposed at the lower end of the container 50. The plenum chamber 98 is separated from a cylindrical particulate chamber 102 by a porous, gas permeable, layer 104.

Prior to fluidization of the bed 86, the particulate in the container 50 is supported by the cylindrical porous layer 104. When the bed 86 is to be fluidized, gas under pressure is conducted into the plenum chamber 98 through a conduit 108. When a predetermined minimum pressure, which is a function of the height of the fluidized bed 86, is obtained in the plenum chamber 98, a flow of gas is conducted from the plenum chamber through the porous layer 104 into the particulate. The flow of gas is effective to form the fluidized bed 86. For the aforementioned bed heights of between ten and forty inches, the rate of gas flow from the plenum chamber 98 into the fluidized bed may be between 5 and 100 cubic feet per hour for each square foot of a flat horizontal upper surface 112 of the porous layer 104.

The porous layer 104 may be formed in many different ways; for example, the porous layer 104 may be formed by a plurality of layers of screen. However, it is believed that it may be preferred to form the porous layer 104 of a gas permeable ceramic material, such as a porous stone.

When the bed 86 is to be fluidized, a gas, such as argon, is conducted under pressure through the conduit 86 to the plenum chamber 98. Prior to the pressure in the plenum chamber 98 reaching a minimum pressure determined by many different factors, the particulate in the container 50 is not fluidized. As the pressure in the plenum chamber 98 exceeds the predetermined minimum pressure, the particulate in the container 50 becomes fluidized.

When the particulate in the container 50 becomes fluidized, the bed 86 shimmers and the particles of particulate are suspended in the flow of gas through the bed. The smooth shimmering effect of the fluidized bed 86 is maintained as the fluid pressure in the plenum chamber 98 is increased to a predetermined maximum pressure. If the pressure in the plenum chamber 98 is further increased, the excessive rate of flow of fluid through the bed 86 causes a boiling of the bed with a resulting upward throwing of particles from the bed. It is preferred to maintain the pressure in the plenum chamber 98 at a level which is effective to maintain a smooth shimmering upper surface on the fluidized bed 86.

Prior to fluidization of the bed 86 by the flow of gas from the plenum chamber 98, the body of particulate rests on the porous layer 104 and is effective to block lowering of the mold support 48 into the container 50. When the particulate becomes fluidized, the mold support 48 can be moved downward into the fluidized bed 86, in the manner illustrated schematically in FIG. 3. Although the particulate in the container 50 has become fluidized, the increase in the volume of the particulate from its non-fluidized volume is relatively small. This results in the particulate in the fluidized bed being disposed in engagement with the surface area on the mold 46 disposed within the fluidized bed. Although the particles in the fluidized bed 86 are suspended in the flow gas and move with the flow of gas, they are disposed close to and engage each other.

Figure 3:
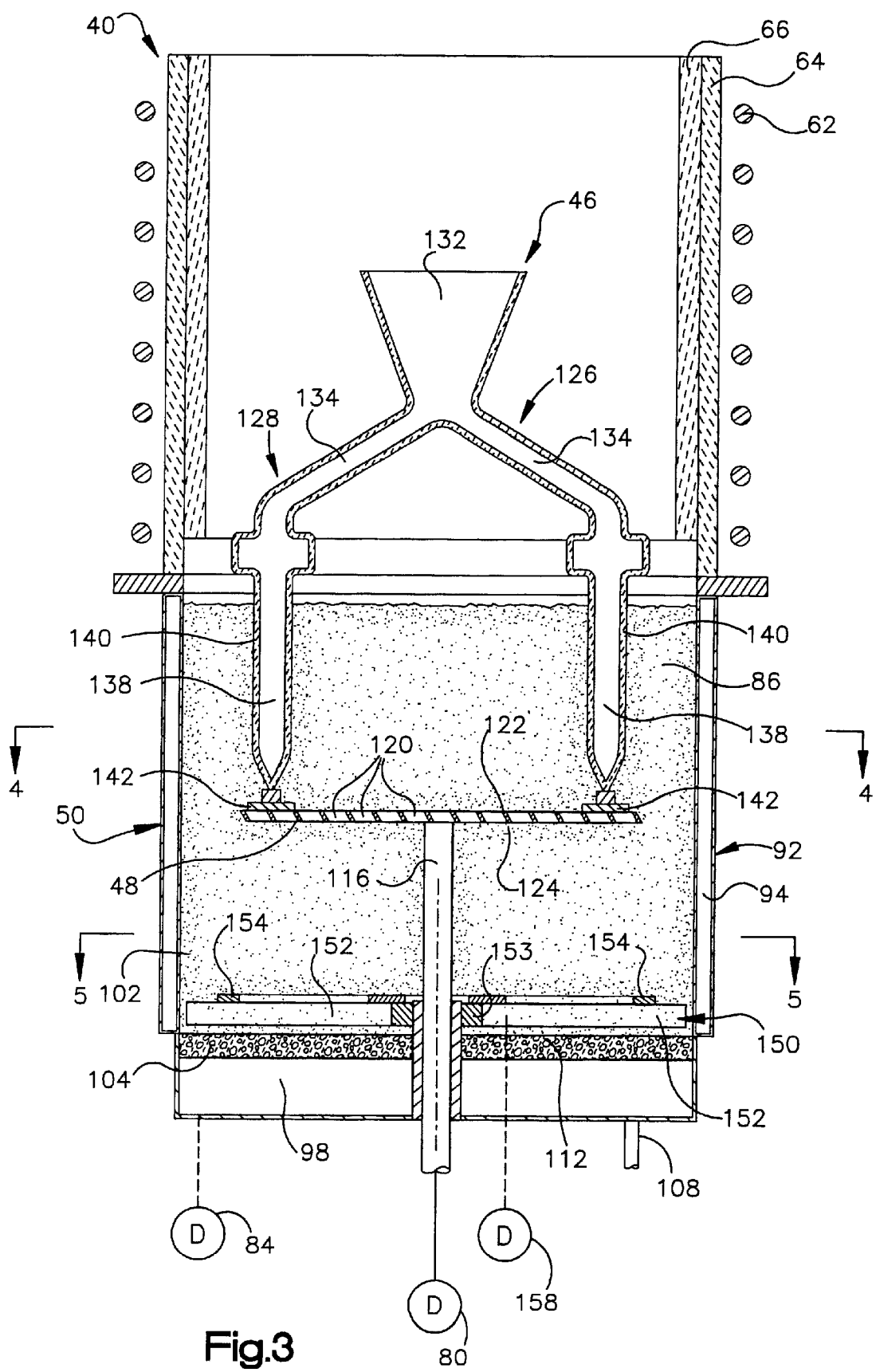
FIG. 3. is an enlarged fragmentary schematic illustration of a portion of FIG. 2 and further illustrating the relationship between the furnace assembly, mold and fluidized bed during movement of the mold into the fluidized bed.

When a portion of the mold 46 is lowered into the fluidized bed 86, in the manner illustrated schematically in FIG. 3, the particulate suspended in the flow of gas in the fluidized bed engages the outer side surface of the mold and moves along the outer side surface of the mold. Since the particles in the fluidized bed are closely adjacent to each other and are continuously moving relative to each other in the flow of gas through the fluidized bed, there is an excellent transfer of heat from the mold 46 to the fluidized bed 86. This transfer of heat occurs by conduction of heat from the mold 46 to the particulate in the fluidized bed 86. This heat is conducted from the particulate to the cooling jacket 94. The mass of the particulate, itself, may be sufficient to absorb the heat from the mold 46 without providing a cooling jacket 94 around the container 50.

The bed 86 in the container 50 may be maintained in a fluidized condition during movement of the container between the lowered position of FIG. 1 and the raised position of FIG. 2. Thus, the gas supply conduit 80 is flexible and capable of accommodating raising and lowering of the container 50 with the plenum chamber 98 during operation of the container drive assembly 84. This enables the fluidized bed 86 to be established when the container 50 is in the lowered position illustrated in FIG. 1 and maintained during movement of the container 50 from the lowered position to the raised position of FIG. 2. Similarly, the fluidized bed may be maintained in the container 50 during operation of the container drive assembly 84 to lower the container from the raised position of FIG. 2 back to the lowered position of FIG. 1.

If desired, fluidization of the bed may be interrupted after the mold 46 has been moved from the furnace assembly 40 into the fluidized bed. Thus, once the portion of the mold containing article mold cavities has been immersed in the fluidized bed 86, the flow of gas to the plenum chamber 98 may be interrupted. This results in the bed becoming defluidized so that the particulate is supported by the porous layer 104 and presses firmly against the outer side surface of the portion of the mold disposed in the fluidized bed 86. The loose packing of the particulate of the fluidized bed around the mold 46 provides an excellent path for conducting heat from the mold 46 through the particulate to the cooling jacket 94.

Once the container 50 has been moved to the lowered position of FIG. 1 with the mold in the non-fluidized bed 86, the bed may again be fluidized or the container 50 and non-fluidized particulate may be removed from the lower housing 34. However, it is believed that it may be desired to maintain the container 50 in the lower housing 34. If this is the situation, a flow of gas would again be established to the plenum chamber 98 and the particulate in the bed 86 would become fluidized. When the particulate in the bed 86 is fluidized, the mold can be readily withdrawn from the bed. However, it is believed that it may be preferred to maintain the bed 86 in a fluidized condition during movement of the bed between the raised and lowered positions.

Mold Support

The mold support 48 is disposed on a shaft 116 connected with the mold support drive assembly 80. Although the shaft 116 has a cylindrical configuration, it is contemplated that the shaft could have a different configuration, for example, polygonal. The longitudinal central axis of the shaft 116 extends through the center of the container 50 and the center of the mold support 48. The central axis of the shaft 116 is coincident with a central axis of the furnace assembly 40.

A plurality of openings 120 (FIGS. 3 and 4) extend through the mold support 48. The openings 120 extend between an upper major side surface 122 (FIG. 3) and a lower major side surface 124 of the mold support 48. The openings 120 enable gas with particulate suspended therein to flow through the mold support 48 as the mold support is lowered into the fluidized bed 86. The presence of the openings 120 in the mold support 48 tends to minimize resistance to movement of the mold support in the fluidized bed 86.

In the illustrated embodiment, the mold support 48 (FIG. 4) is formed by an expanded metal grid having generally rectangular openings 120. However, it is contemplated that the mold support 48 could be formed in a different manner if desired. For example, the mold support 48 could be cast so as to have an annular ring which is connected with the central portion of the mold support by a plurality of spokes. This would result in a relatively small number of relatively large openings between the spokes. The mold 46 would be supported on the annular ring which is connected with the central portion of the mold support 48 by the spokes. Of course, the mold support 48 could have a configuration which is different from the specific aforementioned configurations.

The mold 46 rests on the mold support 48. It is contemplated that the mold 46 will have many different configurations depending upon the configuration of the article to be cast. The specific mold 46 illustrated in FIGS. 3 and 4 includes a central portion 126 (FIG. 3) and a peripheral portion 128. The central portion 126 of the mold 46 has a generally circular configuration with an upstanding pour cup 132. Gating passages 134 extend radially outward from the generally conical pour cup 132.

The peripheral portion 128 of the mold 46 includes a plurality of article mold cavities 138 (FIGS. 3 and 4) which are disposed in upright article mold sections 140. The article mold sections 140 are disposed in a circular array and are connected with an annular base plate 142. The annular array of article mold cavities 138 (FIG. 4) may contain either a greater or lesser number of article mold cavities.

The article mold cavities 138 have configurations corresponding to the configuration of the articles to be cast. In the specific embodiment illustrated in FIGS. 3 and 4, the articles to be cast are airfoils for use in a turbine engine and formed of a nickel chrome super alloy. The airfoils are advantageously cast as a single crystal. However, the airfoils could be cast with a columnar grain or equiaxed grain structure if desired. Of course, a mold having a different configuration could be utilized to cast one or more articles of a different configuration.

Although the mold 46 may have any one of many different constructions, the illustrated mold 46 has the same construction as is disclosed in U.S. Pat. Nos. 4,774,992; 5,046,547; 5,062,468; and 5,295,530. The molds in these patents have a plurality of article mold cavities 138 to enable a plurality of articles to be cast at one time. However, it is contemplated that the mold could be constructed for the casting of a single article in the manner disclosed in U.S. Pat. No. 4,862,947. The mold 46 may be formed of a mold material similar to the mold material disclosed in U.S. Pat. No. 4,947,927.

The mold 46 was integrally formed as one piece by repetitively dipping a wax pattern in a slurry of ceramic mold material in the manner disclosed in U.S. Pat. No. 4,955,423. However, it should be understood that the mold 46 could be formed in many different ways and could be utilized to cast many different articles for use in environments other than in association with turbine engines. It is believed that the present invention will advantageously be used in conjunction with the casting of many different types of articles and is not intended to limit the invention to any specific mold construction, type of mold, article, or type of article.

Figure 4:
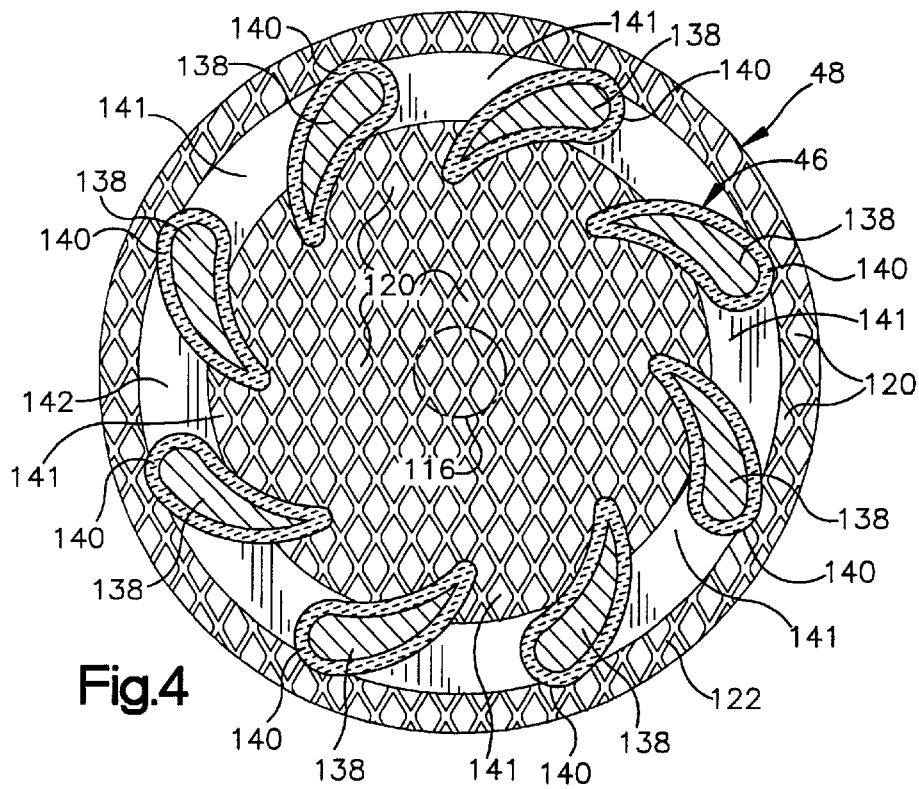
FIG. 4. is a schematic plan view, taken generally along the line 4—4 of FIG. 3, illustrating the relationship of an annular array of article mold cavities in a peripheral portion of the mold to a support having openings through which gas and particulate of the fluidized bed can flow.

The mold 46 has article mold sections 140 disposed in an annular array with the mold sections spaced apart from each other (FIG. 4). The central portion 126 (FIG. 3) of the mold 46 is disposed above the mold sections 140 and extends across the space between the mold sections.

Although the annular array of mold cavities 138 has a circular configuration, the ring of mold cavities could have a different configuration if desired. When the mold 48 is lowered into the fluidized bed 86, the gas with particulate suspended therein flows through the openings 120 in the mold support 48. The gas, with particulate suspended therein is at least partially blocked from moving upward, relative to the mold 46, by the central portion 126 of the mold. Therefore, as the mold 46 is lowered, the gas, with particulate suspended therein, flows radially outwardly through passages 141 (FIG. 4) disposed between the article mold sections 140.

The passages 141 between the article mold sections 140 extend for most of the height of the article mold sections. Therefore, there is a relatively free flow of gas, with particulate suspended therein, through the openings 120 in the mold support 48 and through the passages 141 between the article mold sections 140 as the mold 46 is lowered into the fluidized bed 86.

Stirrer Assembly

Figure 5:
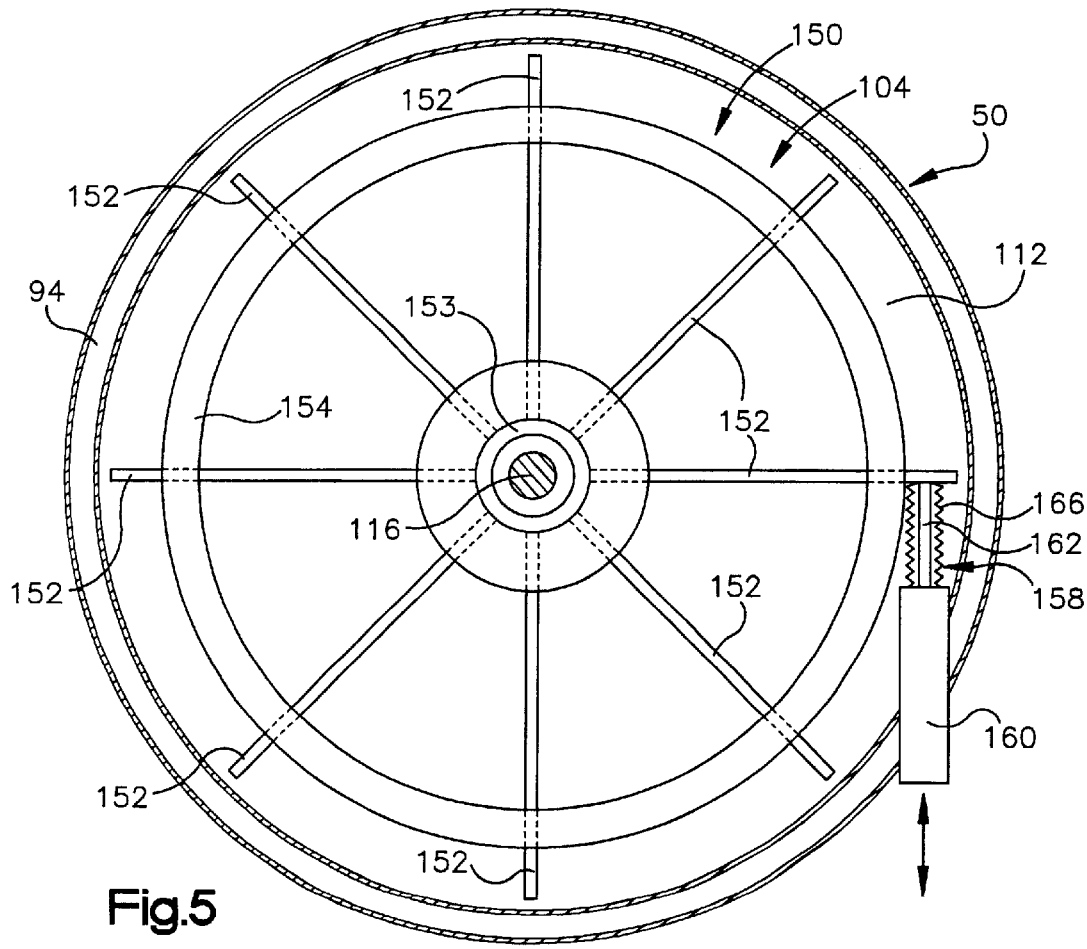
FIG. 5. is a simplified schematic view, taken generally along the line 5—5 of FIG. 3, illustrating a stirrer assembly disposed in the fluidized bed.

In order to promote a more even distribution of particulate in the flow of gas through the fluidized bed 86, a stirrer assembly 150 (FIGS. 3 and 5) is provided in the container 50. The stirrer assembly 150 includes a plurality of blades or members 152 (FIG. 5) which extend radially outward from a cylindrical collar 153 (FIG. 5). The collar 153 extends around a portion of the shaft 116 and is rotatable relative to the shaft.

The collar 153 and stirrer members 152 are fixedly connected and are rotatable together about the longitudinal central axis of the shaft 116. In the specific embodiment of the invention illustrated in FIG. 5, a connector ring 154 is connected with upper edge portions of the stirrer members 152 to interconnect the stirrer members. It should be understood that the stirrer assembly 150 could have a different construction with stirrer members in a different arrangement. For example, the stirrer members 152 could have an arcuately curving configuration.

A drive assembly 158 is connected with the stirrer members 152 and is operable to oscillate the stirrer members along an arcuate path, through a distance of approximately 30 degrees, about the central axis of the shaft 116. The illustrated drive assembly 158 is of the piston and cylinder type. The drive assembly 158 includes a piston and cylinder assembly 160 and a piston rod 162 which is connected with one of the stirrer members 152. The piston rod 162 is connected with one of the stirrer members 152 and is enclosed by a flexible bellows 166.

It should be understood that the drive assembly 158 could have a construction different than the different construction illustrated in FIG. 5. For example, the drive assembly 158 could have a rotatable output member which is connected with the collar 153 through a gear drive arrangement and is effective to continuously rotate the stirrer members 152 about the central axis of the shaft 116 rather than to oscillate the stirrer members in the manner effected by operation of the drive assembly 158.

It should be understood that the stirrer assembly 150 could have a different construction if desired. For example, it is contemplated that the stirrer assembly could include a plurality of drive shafts. These drive shafts would extend upward along the side wall 92 (FIG. 3) of the container 50. The drive shafts are connected with drive assemblies which are disposed outside of the container.

Each of the vertically extending drive shafts disposed along the side wall 92 of the container 50 would be connected to a stirrer member. Each of the drive shafts would oscillate about a vertical axis so that each stirrer member would sweep an arc across the upper side surface 112 of the porous layer 104. If desired, a plurality, for example, two stirrer members could be connected with each drive shaft and separated by a small angle, for example 30 degrees, so that two stirrer members would be oscillated together relative to the lower end portion of the container 50. It should be understood that the arcuate movement of the stirrer members would be coordinated so that the stirrer members would not interfere with each other.

Metal Solidification

As the mold 46 is moved into the fluidized bed 86 (FIG. 3), the molten metal in the mold solidifies. Due to the rapid cooling of the portion of the mold 46 which becomes immersed in the fluidized bed 86, there is a horizontal line of solidification across all of the article mold cavities 138 (FIG. 4). The horizontal line of solidification is disposed a very short distance below the upper surface of the fluidized bed 86. This horizontal solidification front results in directional solidification of the molten metal in the article mold cavities 138. The molten metal solidifies upward from the lower ends of the article mold cavities 138 to the gating passages 134 in the central portion 126 of the mold 46 as the mold is lowered into the fluidized bed.

The molten metal in the article mold cavities 138 may solidify with a single crystal grain structure, a columnar grain structure, or an equiaxed grain structure. The particular type of grain structure which is obtained will depend upon many different factors including the metal cast in the mold 46, the configuration of the mold, and whether or not a single crystal selector is provided in association with the mold. It should be understood that the present invention may be utilized to cast articles having any one of many known grain structures.

Figure 6:
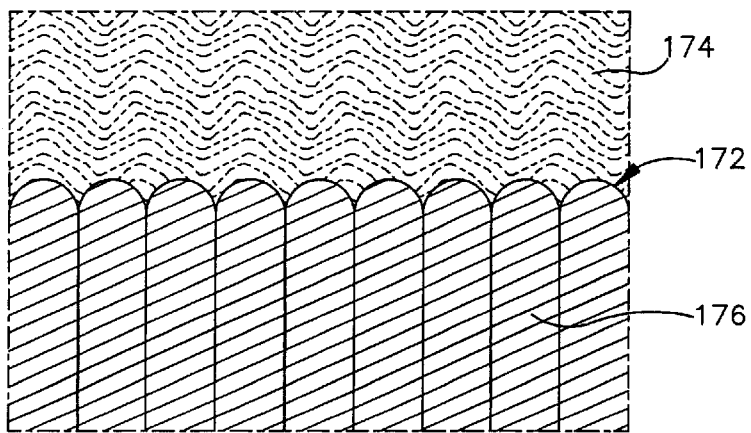
FIG. 6. is a highly schematized illustration depicting the manner in which molten metal in the mold in solidified with a cellular front as the mold moves into the fluidized bed.

When the molten metal solidifies in the article mold cavities, the rate of heat transfer to the fluidized bed 86 is such that a cellular solidification front can be obtained rather than a dendritic solidification front. A cellular solidification front 172 is illustrated schematically in FIG. 6. The cellular solidification front 172 is disposed in a portion of an article mold cavity 138 (FIG. 3) adjacent to the upper surface of the fluidized bed 86.

The cellular solidification front 172 (FIG. 6) separates molten metal 174 in the upper portion of the article mold cavity 138 from solid metal 176 in the lower portion of the article mold cavity. The cellular solidification front 172 is achieved by slowly lowering the mold 46 into the fluidized bed 86. As has been illustrated schematically in FIG. 6, the cellular solidification front 172 is free of dendrites which commonly project from a solidification front during the solidification of molten metal. The absence of the dendrites is obtained with the cellular solidification front due to the high rate at which heat is transferred from the mold 46 and a relatively low rate of lowering of the mold into the fluidized bed 86.

When molten metal solidifies with a dendritic solidification front, the dendrites tend to become interconnected with small pockets of molten metal between the dendrites. When this molten metal solidifies, there may be a tendency to form small voids in the metal. This increases the porosity of the resulting casting. By having the cellular solidification front 172, the formation of small voids in the casting is eliminated or at least minimized. This results in little or no porosity in the resulting casting.

The absence of porosity in a casting enhances the characteristics of the casting and, in certain environments, such as the hot environments found in turbine engines, it may be very advantageous. The advantages obtained by having a cellular solidification front 172 may be obtained with different types of grain structures, including a single crystal grain structure or an equiaxed grain structure.

It should be understood that the mold 46 may be lowered into the fluidized bed 86 in a manner which results in solidification of the molten metal in the mold along a dendritic solidification front. When the solidification front is either a dendritic solidification front or a cellular solidification front, the front has a horizontal configuration and extends across the metal in all of the article mold cavities 138.

The solidification front moves upward in all of the article mold cavities 138 as the mold 46 is lowered into the fluidized bed. By moving the mold 46 slowly into the fluidized bed 86, an annular cellular solidification front is obtained. When the speed at which the mold 46 is lowered into the fluidized bed 86 is increased, a dendritic solidification front is obtained.

Gas Dispensing Mold Support

Figure 7:
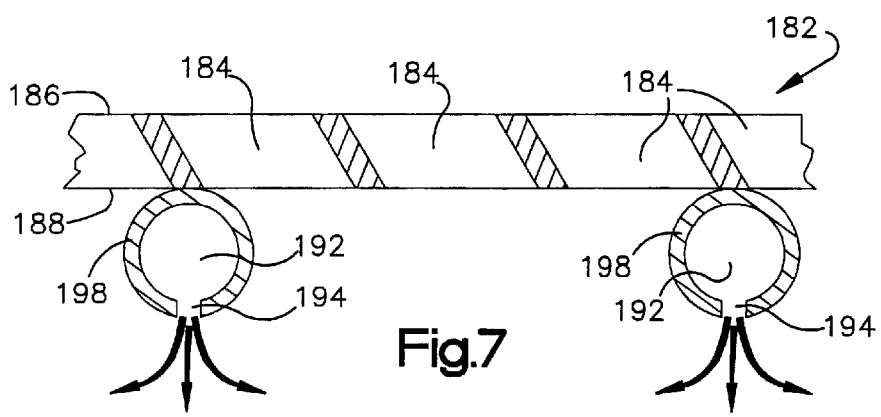
FIG. 7. is a fragmentary schematic illustration of another embodiment of the mold support of FIG. 4 and illustrating the manner in which gas is discharged from a lower side of the mold support.

In the embodiment illustrated in FIGS. 3 and 4, the mold support is a metal grid having a plurality of openings therein. In the embodiment illustrated in FIG. 7, the mold support is formed with openings, in the same manner as the mold support 48 of FIG. 4. However, in the embodiment illustrated in FIG. 7, the mold support dispenses gas to promote fluidization of the bed 86. Since the embodiment illustrated in FIG. 7 is generally similar to the embodiment illustrated in FIGS. 1–6, similar terminology will be utilized to refer to similar components. It should be understood that any one or more of the features of the embodiment illustrated in FIGS. 1–6 could be utilized with the embodiment illustrated in FIG. 7.

The mold support 182 (FIG. 7) has the same circular configuration as the mold support 48 of FIGS. 3 and 4. The mold support 182 has openings 184 which extend between upper and lower side surfaces 186 and 188 of the mold support 182. The openings 184 have the same configuration as the openings 120 in the mold support 48 of FIG. 4. The openings 184 enable gas with particulate suspended therein to flow through the mold support as the mold support is lowered into the fluidized bed 86 (FIG. 3).

In accordance with a feature of the embodiment of FIG. 7, gas is discharged from passages 192 in the mold support 182 through outlet openings 194. The outlet openings 194 face downward from the mold support 182. Therefore, the gas (argon) which is discharged from the outlet openings, in the manner indicated schematically by arrows in FIG. 7, is directed into the fluidized bed 86 (FIG. 3).

It is contemplated that the gas dispensed from the mold support 182 into the fluidized bed will promote fluidization of the bed immediately ahead of the mold support as the mold support is lowered into the bed. Thus, fluidization of the particulate in the bed 86 will be initially achieved by a flow of gas from the plenum chamber 98 (FIG. 3) into the bed in the manner previously explained. The gas discharged from the mold support 182 (FIG. 7) will promote fluidization of the bed 86 immediately ahead of the mold support as the mold support is lowered into the bed.

It may be desired to use the plenum chamber to effect the initial fluidization of the bed 86 and to utilize the fluid discharged from the mold support 182 to supplement the fluidization obtained by the flow of gas from the plenum chamber 98. It is also contemplated that the fluid discharged from the mold support 182 may be sufficient to effect fluidization of the bed 86. Thus, before the mold support 182 is lowered toward the bed 86, the particulate in the bed may not be fluidized or may only be partially fluidized adjacent to the mold support 182. As the mold support 182 moves down toward the bed 86, the flow of gas from the mold support is effective to fluidize the bed ahead of the mold support as the mold support moves into the bed.

Although the gas discharged from the mold support 182 may be the only source of gas for fluidizing the bed 86, it is believed that it may be preferred to utilize other sources of gas in association with the mold support 182. One of the sources of gas which could be utilized with the mold support 182 is the plenum chamber 98. The gas discharged from the mold support 182 could be effective to prevent aggregation of particulate immediately below the mold support 182 in such a manner as to facilitate movement of the mold support into the fluidized bed 86.

In addition to being directed downwardly from passages 192 connected with the mold support 182, it is contemplated that gas could also, be directed toward the side wall 92 (FIG. 3) of the container 50 from the mold support 182. This would prevent the aggregation or packing of particulate adjacent to the side wall 92 of the container 50.

In the embodiment illustrated in FIG. 7, the passages 192 are disposed in conduits 198 connected to the lower side of the mold support 182. However, it is contemplated that the passages 192 could be formed in the material of the mold support 182 and the conduits 198 eliminated. For example, the mold support 182 could be a cast member with openings extending through the cast member and internal gas passages formed in the member. If this is done, nozzles could be provided in association with the mold support 182 to direct gas from the passages in the mold support in various directions relative to the mold support.

Different Gas Pressures

Figure 8:
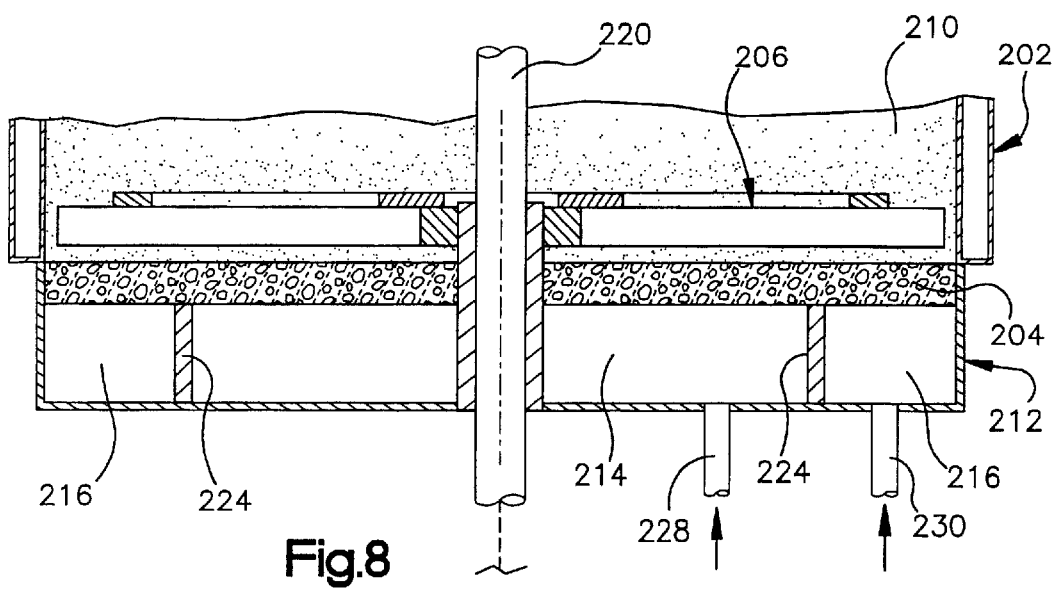
FIG. 8. is a schematic illustration of an embodiment in which a plenum chamber at a lower portion of a fluidized bed is pressurized with gas at different pressures.

In the embodiment illustrated in FIG. 3, the plenum chamber 98 is supplied with gas at one pressure by the gas supply conduit 108. This results in uniform pressurization of the porous layer 104 and a uniform flow of gas through the porous layer. In the embodiment illustrated in FIG. 8, the plenum chamber is supplied with gas at different pressures to obtain different flow rates through different portions of the porous layer. Since the embodiment illustrated in FIG. 8 is generally similar to the embodiment illustrated in FIG. 3, similar terminology will be utilized to refer to similar components. It should be understood that one or more of the features of the embodiments illustrated in FIGS. 1–7 could be utilized with the embodiment illustrated in FIG. 8, if desired.

A container 202 (FIG. 8) has the same construction as the container 50 of FIG. 3. A porous layer 204 has the same construction as the porous layer 104 of FIG. 3. A stirrer assembly 206 is provided immediately above the porous layer 204 to promote distribution of particulate in a fluidized bed 210 held in the container 202. The stirrer assembly 206 has the same construction as the stirrer assembly 150 of FIG. 5. The fluidized bed 210 is formed in the same manner and functions in the same way as previously explained in conjunction with the fluidized bed 86 of FIG. 3.

In accordance with one of the features of the embodiment of FIG. 8, a plenum 212 includes an annular inner section or chamber 214 and an annular outer section or chamber 216. A shaft 220 extends through the plenum 212 and functions to raise and lower a mold support in the same manner as previously explained in conjunction with the shaft 116 of FIG. 3.

The inner chamber 214 of the plenum 212 extends around and is coaxial with the shaft 220. The outer chamber 216 of the plenum 212 extends around and is coaxial with the inner chamber 214. The inner chamber 214 is separated from the outer chamber 216 by a circular plenum wall 224.

Gas, such as argon, at a first pressure is supplied to the inner chamber 214 of the plenum 212 through a conduit 228. Gas at a second pressure is supplied to the outer chamber 216 of the plenum 212 through a conduit 230. Since the inner and outer chambers 214 and 216 of the plenum 212 contain gas at different pressures, gas flows at different rates through different portions of the porous layer 204 into the fluidized bed 210. By directing gas at higher pressures toward areas of the fluidized bed where particulate tends to aggregate or become packed, uniform fluidization of the bed 210 can be achieved.

It is believed that, in some situations, particulate may tend to collect or aggregate adjacent to a cylindrical inner surface of the container 202. If this tends to occur, gas at a relatively high pressure is conducted through the conduit 230 to the outer plenum chamber 216. Gas at a relatively low pressure is conducted through the conduit 228 to the inner plenum chamber 214.

The relatively high fluid pressure in the outer plenum chamber 216 results in a greater rate of flow of gas through the portion of the porous layer 204 disposed above the outer plenum chamber 216 than is obtained through the portion of the porous layer disposed above the inner plenum chamber 214. This results in a greater rate of flow of gas being directed into the fluidized bed 210 adjacent to the side wall of the container 202. Since particulate may tend to accumulate in the fluidized bed 210 adjacent to the side wall of the container 202, the increased flow rate of gas along the side wall is effective to promote fluidization of this particulate.

It is also believed that, in some situations, particulate may tend to collect or aggregate adjacent to a central portion of the container 202. If this tends to occur, gas at a relatively high pressure is conducted through the conduit 228 to the inner plenum chamber 214. Gas at a relatively low pressure is conducted through the conduit 230 to the outer plenum chamber 214.

The relatively high fluid pressure in the inner plenum chamber 214 results in a greater rate of flow of gas through the portion of the porous layer 204 disposed above the inner plenum chamber 214 than is obtained through the portion of the porous layer disposed above the outer plenum chamber 216. This results in a greater rate of flow of gas being directed into the fluidized bed 210 at a central portion of the fluidized bed. Since particulate may tend to accumulate in the fluidized bed 210 at the central portion of the fluidized bed, the increased flow rate of gas into the central portion of the fluidized bed is effective to promote fluidization of this particulate.

It is believed that the location in the fluidized bed 210 where the particulate tends to accumulate may vary with variations in the construction of the mold support 48 (FIG. 3) and the configuration and size of the mold 46. The location in the fluidized bed 210 where the particulate tends to accumulate may also vary with variations in locations where gas is conducted into the fluidized bed. Thus, gas may be conducted into the fluidized bed 210 from a mold support similar to the mold support 182 of FIG. 7. Gas may be conducted into the fluidized bed 210 from side walls of the container 202. By conducting gas into the fluidized bed 210 at various locations, conducting gas into the fluidized bed at different pressures at different locations, and using the stirrer assembly 206, uniform fluidization of the bed is promoted.

Although only a pair of plenum chambers 214 and 216 are provided in the embodiment of the invention illustrated in FIG. 8, it is contemplated that a plurality of plenum chambers could be formed. Thus, by the addition of a second circular plenum wall, in a coaxial relationship with the plenum wall 224 and with an additional gas supply conduit, three different gas pressures could be obtained in the plenum 212. This would allow gas at relatively high pressure to be conducted through the portion of the porous layer disposed adjacent to the side wall of the container 202 and through the portion of the porous layer 204 disposed adjacent to the shaft 220. The central portion of the plenum chamber may be at a lower pressure than the radially inner and outer plenum chambers so that there is a lower gas flow rate through the central plenum chamber. When this is done, it is believed that the discharging of gas from the mold support, in the manner illustrated schematically in FIG. 7, may be particularly advantageous.

Alternative Mold Support

In the embodiments illustrated in FIGS. 1–8, the mold 46 is supported on a mold support 48 (FIG. 3) or a mold support 182 (FIG. 7) disposed at one end of a shaft 116. The mold supports 48 and 182 engage the peripheral portion 128 (FIG. 3) of the mold 46 while the central portion 126 of the mold is spaced from the mold support. In the embodiment illustrated in FIG. 9, the mold is supported by engagement of a support member with the central portion of the mold. The peripheral portion of the mold is spaced from the mold support. Since the embodiment illustrated in FIG. 9 is generally similar to the embodiments illustrated in FIGS. 1–8, similar terminology will be utilized to designate similar components. It should be understood that any of the features of the embodiments illustrated in FIGS. 1–8 may be utilized in association with the embodiment illustrated in FIG. 9.

A mold 236 (FIG. 9) has the same general construction as the mold 46 of FIG. 3. The mold 236 includes a central portion 238 and an annular peripheral portion 240. The central portion 238 of the mold 236 includes a pour cup 244 which is connected with the peripheral portion 240 of the mold by gating passages 246. The gating passages 246 extend radially outward and downward from the pour cup 244 and connect the pour cup in fluid communication with the peripheral portion 240 of the mold 236.

A plurality of article mold cavities 248 are disposed in article mold sections 250 of the peripheral portion 240 of the mold 236. The article mold cavities 248 and mold sections 250 may have the same construction and configuration as the article mold cavities 138 and article mold sections 140 (FIG. 4) of the mold 46. In the embodiment of the mold 236 illustrated in FIG. 9, the article mold sections 250 are not interconnected by a base plate, corresponding to the base plate 142 (FIG. 4) of the mold 46. However, a base plate similar to the base plate 142 of FIG. 4 could be provided as a part of the mold 236 if desired. It should be understood that the mold 236 could be constructed so as to have only a single article mold cavity.

In accordance with a feature of the embodiment illustrated in FIG. 9, the mold 236 is supported by engagement of a support member, such as a shaft 254, with a central portion 238 of the mold. The peripheral portion 240 of the mold is spaced from the shaft 254. This results in bottoms or lower ends 258 of the article mold sections 250 being completely exposed to a fluidized bed 262 held in a container 264.

The central portion 238 of the mold 236 includes a mounting section 268 which connects the mold 236 with the shaft 254. The mounting section 268 is integrally formed as one piece with the remainder of the mold 236. Thus, the mounting section 268 is formed of ceramic mold material.

The mounting section 268 includes a socket or recess 270 in which an end of the shaft 254 is received. It should be understood that the mold 236 and shaft 254 could be interconnected in a different manner if desired. For example, suitable support prongs or arms could be provided on the shaft 254 to engage the central portion 238 of the mold around and between sections of the mold in which the gating passages 246 are formed. Alternatively, a downpole from the pour cup 244 could be received in a socket connected to the shaft 254.

When the mold 236 is to be utilized to cast molten metal articles, the mold is raised into a furnace assembly 274 in the same manner as previously explained in conjunction with the embodiment of the invention illustrated in FIGS. 1–6. The container 264 is raised to position the fluidized bed 262 immediately beneath the furnace assembly 274. Once the mold 236 has been filled with molten metal, the mold is lowered into the fluidized bed 262.

To lower the mold 236 into the fluidized bed 262, the shaft 254 is lowered. As the shaft 254 is lowered, the bottom or lower ends 258 of the article mold sections 250 move into the fluidized bed 262. As this occurs, the particulate suspended in the flow of gas in the fluidized bed 262 impinges against the bottom or lower ends 258 of the article mold sections 250. This initiates solidification of molten metal at the lower ends of the article mold cavities 248.

As the mold 236 is lowered into the fluidized bed 262, the molten metal in the article mold cavities 248 completely solidifies. The solidification of the molten metal in the article mold cavities 248 may occur along a cellular solidification front in the manner previously explained in conjunction with the drawing of FIG. 6. Of course, the speed of lowering the mold 236 into the fluidized bed could be increased so as to effect solidification of the molten metal in the article mold cavities 248 along a dendritic solidification front.

The molten metal in the article mold cavities 248 may be solidified with any desired crystallographic structure. Thus, the articles cast in the mold 236 may have a single crystal, columnar grain, or equiaxed crystallographic structure. Although only the furnace assembly 274 and upper end portion of the fluidized bed 262 and container 264 have been illustrated in FIG. 9, it should be understood that the mold 236 is utilized with casting apparatus having the same construction as the casting apparatus 30 of FIGS. 1 and 2.

Alternative Container and Gas Flow Monitoring

Figure 10:
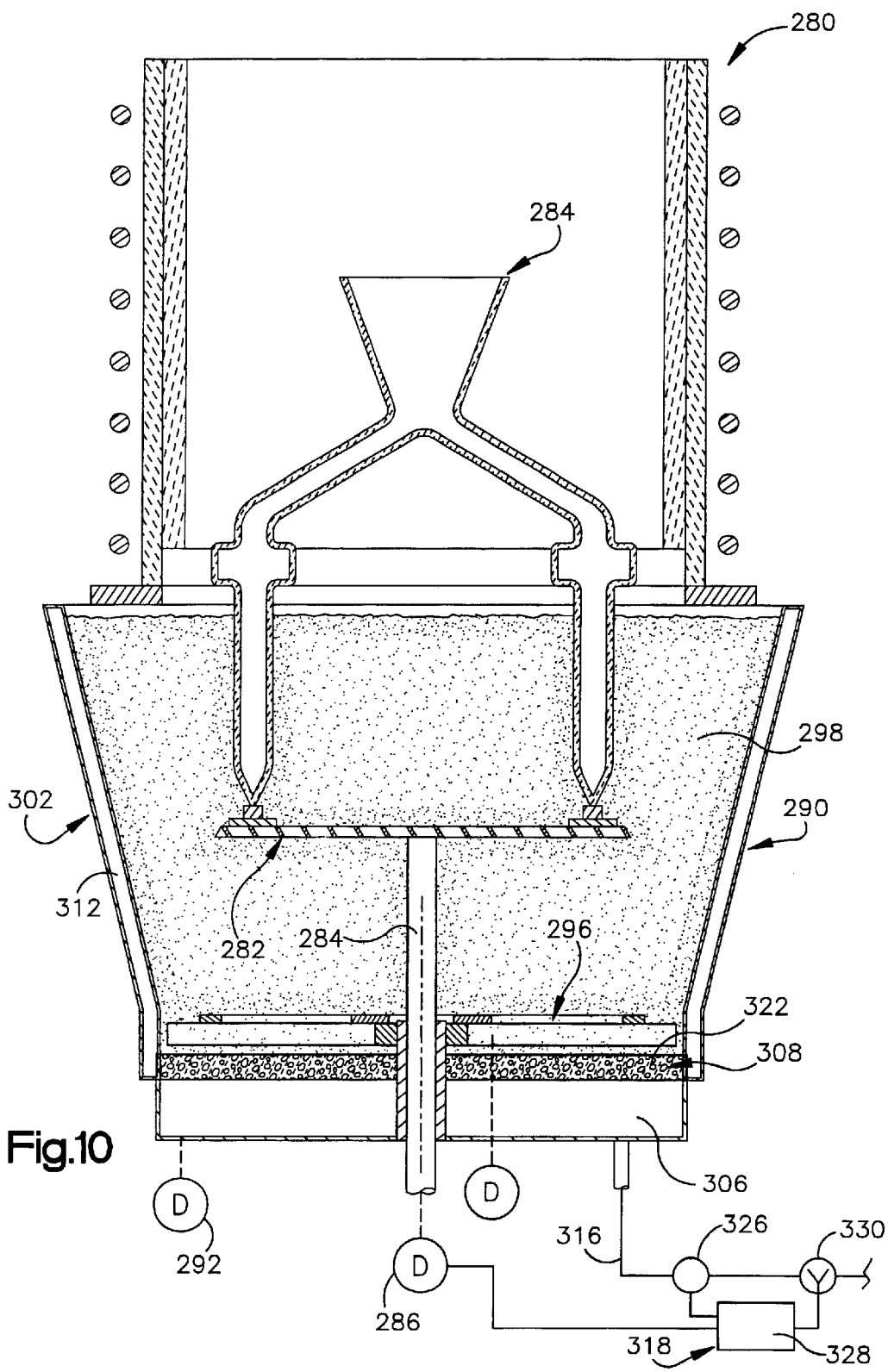
FIG. 10. is a fragmentary schematic illustration, generally similar to FIG. 3, illustrating the manner in which side walls of a container for the fluidized bed may flare upward and outward.

In the embodiments illustrated in FIGS. 1–9, the fluidized bed was held in a container, such as the container 50 of FIG. 3, having a cylindrical configuration. However, it is contemplated that the container holding the fluidized bed could have a different configuration in order to vary the rate of flow of gas and particulate in the fluidized bed. Since the embodiment illustrated in FIG. 10 is generally similar to the embodiments illustrated in FIGS. 1–9, similar terminology will be utilized to designate similar components. It should be understood that the features of any of the embodiments illustrated in FIGS. 1–9 may be utilized with the embodiment illustrated in FIG. 10.

The apparatus of FIG. 10 includes a furnace assembly 280 having the same construction as the furnace assembly 40 of FIGS. 1–3. A mold support 282 is provided to support a mold 284. The mold support 282 and mold 284 have the same construction as the mold support 48 and mold 46 of FIGS. 3 and 4. A shaft 284 is connected with a mold support drive assembly 286. The mold support drive assembly 286 is operable to move the shaft 284 axially relative to the furnace assembly 280 in the manner previously explained in conjunction with the embodiment illustrated in FIGS. 1–3. It should be understood that the apparatus of FIG. 10 could have a construction which is different than the construction illustrated in FIGS. 1–3 and 10 if desired.

A container 290, corresponding to the container 50 of FIG. 3, can be raised and lowered by a container drive assembly 292. The container drive assembly 292 has the same construction as the container drive assembly 84 of FIGS. 1–3. A stirrer assembly 296 is disposed in the lower end portion of the container 290. The stirrer assembly 296 has the same construction as the stirrer assembly 150 of FIGS. 3 and 5. The stirrer assembly 296 is operable to promote distribution of particulate in a fluidized bed 298. The fluidized bed 298 is formed by the suspension of particulate in the flow of gas in the same manner as previously explained in conjunction with the fluidized bed 86 of FIG. 3.

In accordance with a feature of the embodiment illustrated in FIG. 10, the container 290 has a side wall 302 which slopes upward and outward from a lower end portion of the container. The side wall 302 is formed as the frustum of a right circular cone. The central axis of the side wall 302 is coincident with a central axis of the shaft 284 and furnace assembly 280. By having the side wall 302 slope upward and outward, the cross sectional area of the fluidized bed 298, as viewed in a horizontal plane, increases in a direction away from the lower end portion of the fluidized bed.

Since the fluidized bed 298 has a relatively small cross section at the lower end portion of the fluidized bed, there is greater fluidization of the particulate in the lower portion of the fluidized bed 298 than in the upper portion of the fluidized bed. This is because the speed at which the gas flows upward from the plenum chamber 306 and through a porous layer 308 from the lower portion of the container 290 to the upper portion of the container will decrease as the cross sectional area of the container increases. This promotes a greater extent of fluidization of the particulate in the lower end portion of the container 290 than in the upper end portion of the container without boiling of the fluidized bed 298 at the upper end of the container 290.

The side wall 302 of the container 390 is enclosed by a cooling jacket 312 in the same manner as in which the side wall of the container 50 is enclosed by the cooling jacket 94 (FIG. 3). However, the side wall 302 and cooling jacket 312 of the container 290 (FIG. 11) are formed as a portion of a right circular cone. It is contemplated that the side wall 302 of the container 290 and cooling jacket 312 could have a different configuration if desired. For example, the side wall of the container 290 could flare outward in a stepwise manner rather than in the continuous manner illustrated in FIG. 10.

During operation of the apparatus illustrated in FIG. 10, there is a continuous flow of gas through the conduit 316 to the plenum chamber 306. A control apparatus 318 is provided to maintain a desired rate of flow of gas into the, plenum chamber 306. As was previously mentioned, when the container 290 is at a vertical height of between 10 and 40 inches, it is contemplated that the rate of flow of gas from the plenum chamber 306 through the porous layer 308 into the fluidized bed 298 may advantageously be in a range between 5 and 100 cubic feet per hour for each square foot of a horizontal upper side surface 322 of the porous layer 308. The control apparatus 318 is effective to monitor the rate of flow of gas to the plenum chamber 306 and maintain a desired flow rate of gas to the plenum chamber.

The control apparatus 318 includes a gas flow measurement device 326 which provides an output to a microprocessor 328 indicative of the rate of flow of gas through the conduit 316. The microprocessor 328 is operable to control a valve 330 to maintain a desired flow rate of gas through the conduit 316.

It is contemplated that it may be desired to vary the rate of flow of gas through the conduit 316 as the mold 284 is lowered into the fluidized bed 298. Thus, as the mold support 282 and mold 284 are moved into the fluidized bed 298, there may be a tendency for the rate of flow of gas through the conduit to decrease as the mold 284 and mold support 282 restrict the flow of gas through the fluidized bed 298. When this occurs, the gas flow measuring device 326 provides an output signal to the controller 328 indicative of the decrease in the rate of flow of gas through the fluidized bed 298. In response to this signal, the controller 328 operates the valve 330 to increase the rate of flow.

As the mold 284 is lowered into the fluidized bed 298, the total amount of heat to be transferred from the mold to the fluidized bed increases. In order to effect a corresponding increase in the rate of heat transfer from the mold to the fluidized bed, the controller 328 may be programmed to operate the valve 330 and increase the rate of flow of gas as the mold 284 is lowered. To enable the controller 328 to detect the position of the mold 284 relative to the fluidized bed 298, a transducer, not shown, connected with the mold support drive assembly 286 provides an output signal which is indicative of the position of the shaft 284 and the mold support 282 relative to the porous layer 308 at the lower end of the container 290.

The output from the transducer connected with the mold support drive assembly 286 enables the controller 328 to either increase or decrease the rate of flow of gas to the plenum chamber 306 and fluidized bed 298 as a function of extent to which the mold 284 is lowered into the fluidized bed. For example, the greater the distance which the mold 284 is lowered into the fluidized bed 298, the greater may be the rate of gas flow through the conduit 316 to the plenum chamber 306 and fluidized bed. Therefore, as the mold 284 is lowered into the fluidized bed 298, the extent of fluidization of the bed is varied to promote the transfer of heat from the mold to the fluidized bed 298.

Although the control apparatus 318 has been illustrated in association with only the container 290 of FIG. 10, it should be understood that a similar control apparatus could be associated with the container 50 to control the rate of flow of gas into the fluidized bed 86 of FIG. 3 or any of the other embodiments disclosed herein.

Container and Gas Flow Controls

Figure 11:
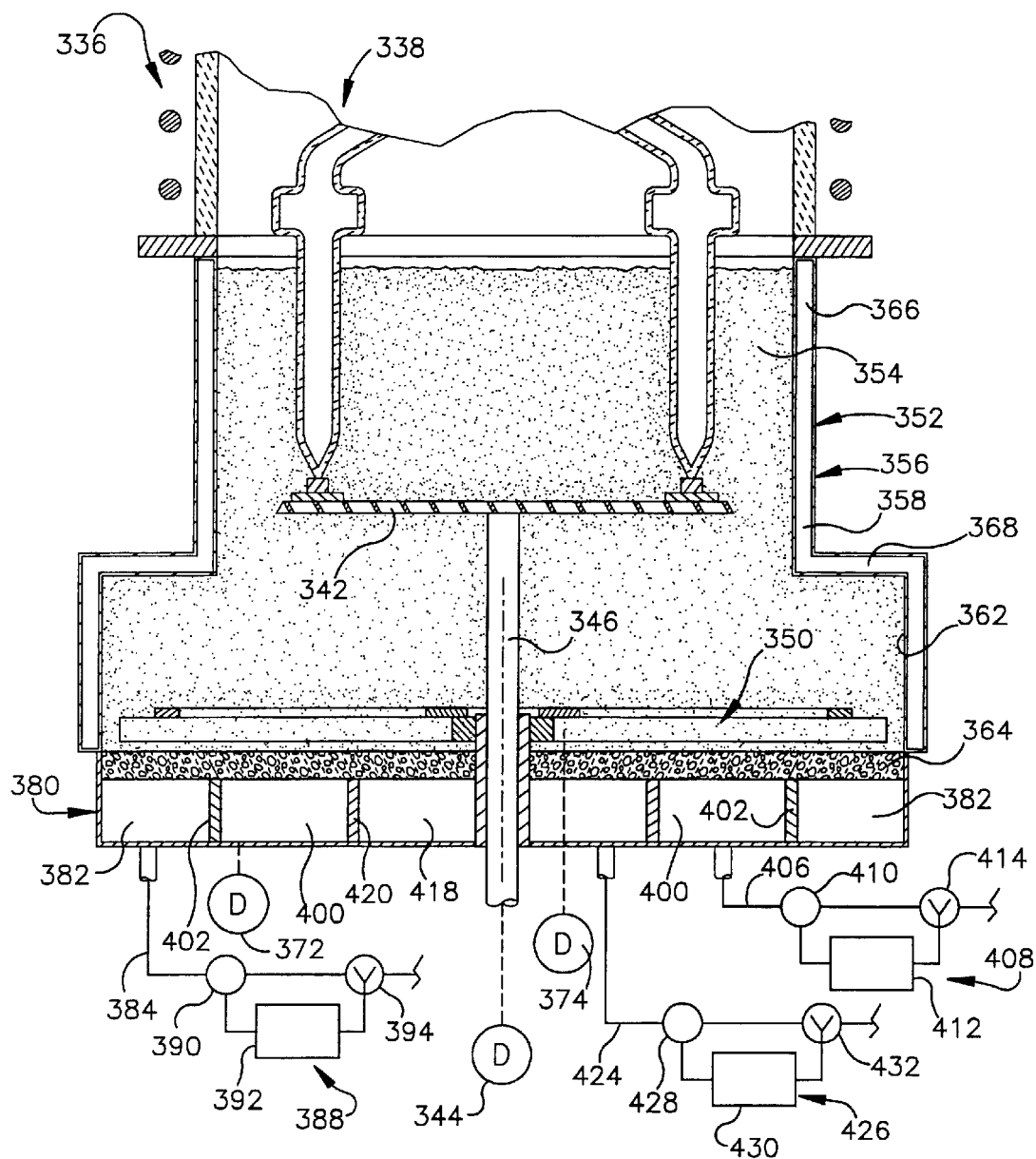
FIG. 11. is a fragmentary sectional view, generally similar to FIG. 10, illustrating the manner in which side walls of the container for the fluidized bed may be configured to reduce the cross sectional area of the upper portion of the fluidized bed.

In the embodiment illustrated in FIG. 10, the cross sectional area of the container, as viewed in a horizontal plane, increased as the distance above the lower end portion of the fluidized bed increased. In the embodiment illustrated in FIG. 11, the cross sectional area of the fluidized bed decreases as the distance above the lower end portion of the fluidized bed increases. By decreasing the cross sectional area of the fluidized bed, as viewed in a horizontal plane, as the gas flows upward from the lower end portion of the fluidized bed, the speed of movement of the gas increases. By increasing the speed of movement of the gas, the extent of fluidization of the bed tends to be increased. Since the embodiment illustrated in FIG. 11 is generally similar to the embodiments illustrated in FIGS. 1–10, similar terminology will be utilized to designate similar components. It should be understood that any of the features of the embodiments illustrated in FIGS. 1–10 may be utilized with the embodiment illustrated in FIG. 11.

A furnace assembly 336 (FIG. 11) is provided to receive a mold 338. The furnace assembly 336 and mold 338 have the same construction as the furnace assembly 40 and mold 46 of FIG. 3. The mold 338 engages a mold support 342. The mold support 342 is connected with a mold support drive assembly 344 by a shaft 346. The construction of the mold support 342 and mold support drive assembly 344 is the same as the construction of the mold support 48 and mold support drive assembly 80 of FIGS. 1–6.

A stirrer assembly 350 (FIG. 11) is disposed in a lower end portion of a container 352 which holds a fluidized bed 354. The container 352 has a side wall 356 with a cooling jacket 358. In accordance with a feature of the embodiment of the invention illustrated in FIG. 12, the side wall 356 of the container 358 has a relatively large cross sectional area, as viewed in a horizontal plane, adjacent to a lower end portion of the container 352. The side wall 356 of the container 352 has a smaller cross sectional area, as viewed in a horizontal plane, adjacent to an upper end portion of the container.

The side wall 356 of the container 352 includes a relatively large diameter cylindrical lower end portion 362 which is connected with a circular porous layer 364. The side wall 356 also includes a cylindrical upper end portion 366 which is disposed in a coaxial relationship with the lower end portion 362 and porous layer 364. The upper end portion 366 of the side wall 356 is connected with the lower end portion 362 of the side wall 356 by an annular connector wall 368.

The upper end portion 366 of the side wall 356 has a smaller diameter than and is coaxial with the lower end portion 362 of the side wall 356. Therefore, as gas flows upward from the porous layer 364 through the fluidized bed 354, the velocity of the gas increases as it moves from the lower end portion of the fluidized bed into the upper end portion of the fluidized bed. This increase in the velocity of the gas as it moves into the upper portion of the fluidized bed is particularly apparent immediately adjacent to the upper end portion 366 of the side wall 356. Therefore, there is relatively little tendency for particulate to aggregate or become packed adjacent to the upper end portion of the side wall 356.

In the embodiment illustrated in FIG. 11, the side wall 356 of the container 352 changes in cross sectional area in a stepwise manner. However, it is contemplated that the side wall 356 of the container 352 could continuously taper in an upward direction. This would result in the side wall 356 of the container 352 being formed as a portion of a right circular cone.

A container drive assembly 372 is operable to raise and lower the container 352 with the fluidized bed 354 in the same manner as previously explained in conjunction with the embodiment of the invention illustrated in FIGS. 1–6. A drive assembly 374 effects operation of the stirrer assembly 350 in the same manner as previously explained in conjunction with the drive assembly 158 for the stirrer assembly 150 of FIG. 5. The drive assembly 374 for the stirrer assembly 350 is advantageously connected with the container 352 for movement with the container relative to the furnace assembly 336. However, the drive assembly 374 could remain stationary during movement of the container 352.

A plenum 380 is disposed adjacent to a lower side of the porous layer 364. The plenum 380 includes a plurality of annular chambers which hold gas at different pressures. Thus, an annular radially outer chamber 382 is connected with a source of gas through a conduit 384. A control assembly 388 is provided to maintain a desired rate of flow of gas to the radially outer chamber 382. The control assembly includes a gas flow measuring device 390 which provides an output signal to a controller 392 indicative of the rate of flow of gas through the conduit 384 to the outer chamber 382. The controller 392 effects operation of a valve 394 to maintain a desired rate of flow of gas to the outer chamber 382.

An annular intermediate chamber 400 is separated from the radially outer chamber 382 by a circular plenum wall 402. Gas is conducted to the intermediate chamber 400 through a conduit 406. A control assembly 408 is operable to control the rate of flow of gas through the conduit 406 to the intermediate chamber 400. The control assembly 408 includes a gas flow measuring device 410 which provides an output signal to a controller 412 indicative of the rate of flow of gas through the conduit 406. The controller 412 effects operation of a valve 414 to maintain a desired rate of flow of gas to the intermediate chamber 400.

A radially inner plenum chamber 418 has an annular configuration and is separated from the intermediate chamber 400 by a circular plenum wall 420. A shaft 346 extends through the center of inner chamber 418.

The inner chamber 418 is supplied with gas under pressure through a conduit 424. A control apparatus 426 includes a gas flow measuring device 428 which provides an output signal to a controller 430 indicative of the rate of flow of gas through the conduit 424. The controller 430 effects operation of a valve 432 to maintain a desired gas flow rate through the conduit 424 to the inner plenum chamber 418.

The controllers 392, 412 and 430 may receive output signals from a transducer connected with the mold support drive assembly 344 to effect variations in the rate of flow of gas to the plenum chambers 382, 400 and 418 as a function of the position of the mold 338 and mold support 342 relative to the fluidized bed 354. This enables the fluid pressure in the plenum chambers to be varied as the mold 338 and mold support 342 are lowered into the fluidized bed 354. It should be understood that the pressure in one of the plenum chambers 392, 412 or 430 may be decreased while pressure in one or more of the other plenum chambers is increased. For example, the fluid pressure in the intermediate plenum chamber 400 could remain constant while the pressure in the outer plenum chamber 382 is increased and the pressure in the inner plenum chamber 418 is decreased.

Container Wall Gas Supply

Figure 13:
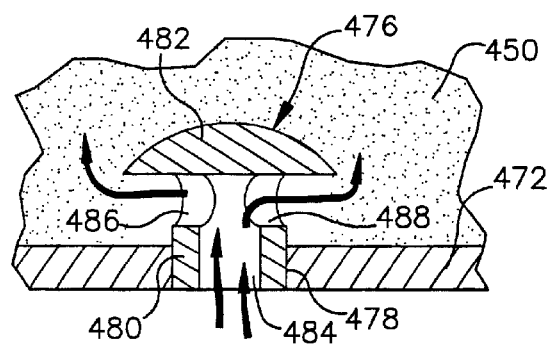
FIG. 13. is a fragmentary sectional view illustrating the manner in which gas may be conducted from fixtures connected to a bottom wall of a container for a fluidized bed.
Figure 14:
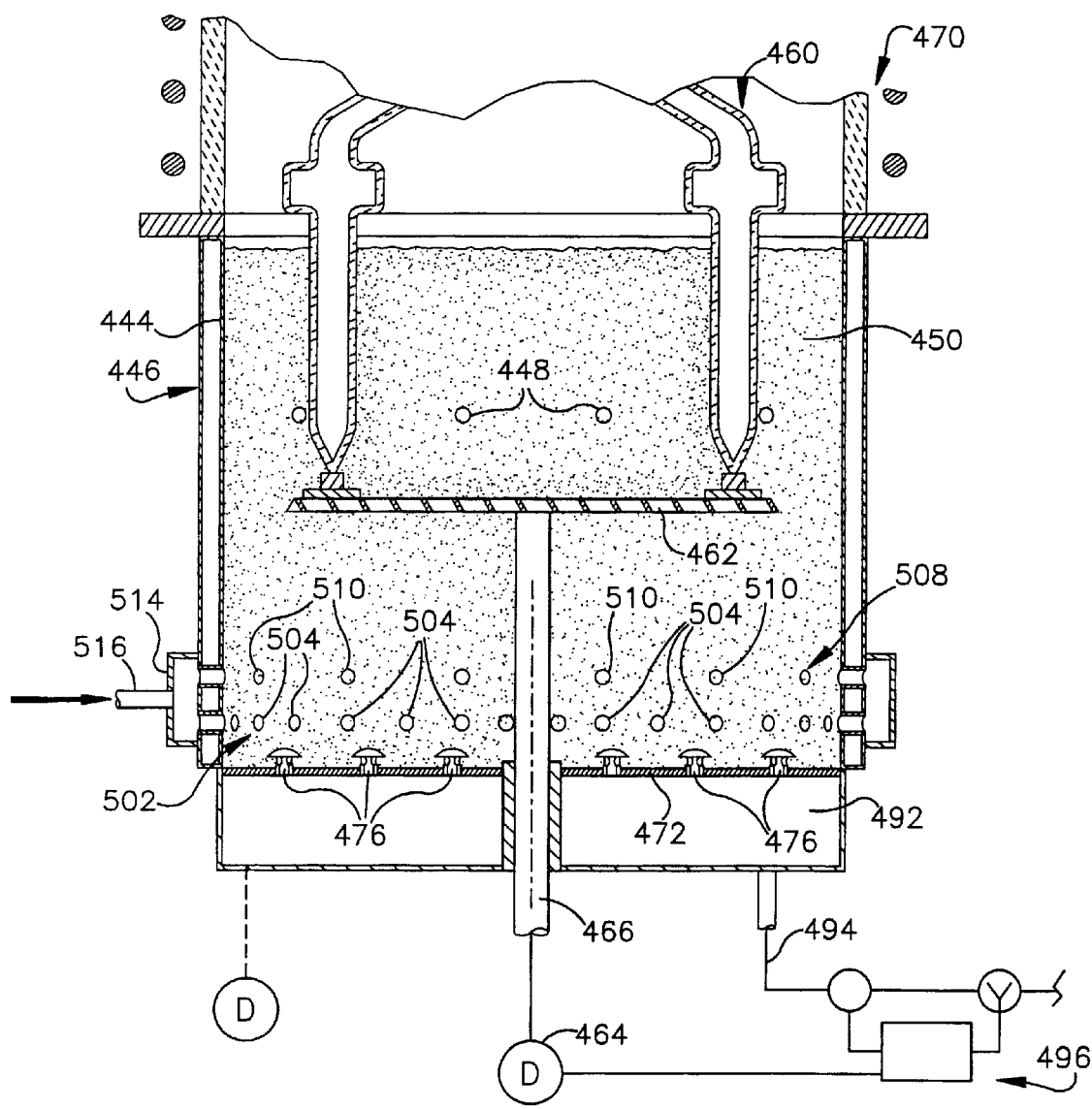
FIG. 14. is a fragmentary sectional view, generally similar to FIG. 3, illustrating the manner in which gas may be conducted through side and bottom walls of a container for a fluidized bed.

In the embodiments illustrated in FIGS. 3, 8, 10 and 11, the flow of gas to fluidize particulate in the container is supplied through a porous layer in the lower end portion of the container. In the embodiment illustrated in FIGS. 12–14, the gas for fluidizing the particulate is supplied through side and/or bottom walls of the container. Since the embodiment illustrated in FIGS. 12–14 is generally similar to the embodiments illustrated in FIGS. 1–11, similar terminology will be utilized to designate similar components. It should be understood that one or more of the features of the embodiments illustrated in FIGS. 1–11 may be utilized with the embodiment illustrated in FIGS. 12–14.

A side wall 444 of a container 446 is illustrated in FIGS. 12 (sheet 6 of the drawings) and 14 (sheet 9 of the drawings). In accordance with a feature with this embodiment, gas is directed through an opening 448 (FIG. 12) in the side wall 444 of the container 446 into a fluidized bed 450. In the embodiment illustrated in FIG. 12, the gas is conducted under pressure to the opening 448 through a conduit 454 in the manner indicated schematically by an arrow 456 in FIG. 12.

The conduit 454 has a longitudinal central axis which is coincident with a longitudinal central axis of the generally cylindrical opening 448. The coincident central axes of the opening 448 and conduit 454 extend radially outward from a central axis of the container 446. This results in the flow of gas being directed into the fluidized bed along a radial path which extends perpendicular to the longitudinal central axis of the container 446.

If desired, the conduit 454 and the opening 448 could have a horizontal axis skewed at an acute angle relative to a radius of the container 446. This would result in the flow of gas from the conduit 454 to the opening 448 promoting a swirling or rotating action in the fluidized bed 450. For example, the coincident horizontal central axes of the conduit 454 and opening 448 could extend at an angle of 45 or 60 degrees to a diametrical plane containing the central axis of the cylindrical container 446. This would promote a swirling action in the fluidized bed adjacent to the side wall 444 where particulate may tend to aggregate or become packed during lowering of a mold 460 (FIG. 14) disposed on a mold support 462.

The mold support 462 is connected with a mold support drive assembly 464 by a shaft 466. The mold support drive assembly 464 is operable to raise and lower the shaft 466 and mold support 462 along with the mold 460 in the manner previously described in conjunction with the embodiment of the invention illustrated in FIGS. 1–6. The mold support 462 has the same construction as the mold support of FIG. 4. Operation of the mold support drive assembly 464 is operable to move the mold 460 into and out of a furnace assembly 470. If desired, the mold support 462 could have the same construction as the mold support 182 of FIG. 7.

In accordance with another feature of the embodiment of FIGS. 13 and 14, gas distribution outlets are provided in a bottom or lower end wall 472 of the container 446. In order to prevent the gas outlets in the bottom wall from becoming blocked with particulate, a fixture 476 (FIG. 13) extends axially upward from an opening 478 in the bottom wall 472. The fixture 476 includes a cylindrical stem portion 480 and a hemispherical head portion 482. A central passage 484 extends through the stem portion 480 to outlet openings 486 and 488 which are disposed immediately beneath the head portion 482. The head portion 482 protects the outlet openings 486 and 488 from being blocked by particulate prior to fluidization of the bed 450.

There are a plurality of the fixtures 476 connected with the bottom wall 472 of the container 446 (FIG. 14). The array of fixtures 476 is connected in fluid communication with a plenum chamber 492. The plenum chamber 492 is supplied with gas under pressure through a conduit 494. The flow gas through the conduit 494 is regulated by a control apparatus 496 having the same construction and mode of operation the control apparatus 318 of FIG. 10. If desired, the plenum chamber 492 could be divided into a plurality of sections in the manner illustrated in FIGS. 8 and 11.

In addition to the, outlets 448 (FIGS. 12 and 14) in the side wall 444 of the container 446, a lower series 502 (FIG. 14) of outlets 504 are disposed in the lower end portion of the side wall 444 of the container 446. In addition, an upper series 508 of outlets 510 is provided in the lower end portion of the side wall 444 of the container 446. The outlets 504 and 510 are connected in fluid communication with an annular manifold 514 which is supplied with air under pressure through a conduit 516. A control apparatus (not shown) having the same construction as the control apparatus 318 of FIG. 10 and the control apparatus 496 of FIG. 14, is provided to monitor the rate of flow of gas through the conduit 516 to the manifold 514. Although only an upper and lower series 502 and 508 of outlets is illustrated in FIG. 14 as being disposed adjacent to the lower end portion of the container 446, it is contemplated that additional outlets could be provided along the side wall 444 of the container if desired.

In the embodiment illustrated in FIG. 14, the flow of gas from the outlets 504 and 510 is directed radially inward toward the longitudinal central axis of the fluidized bed 450. However, if desired, the outlets 504 and 510 could have horizontal central axes which are skewed relative to radial planes extending through the longitudinal central axis of the container 446. If this is done, the flow of gas from the outlets 504 and 510 would promote a swirling action in the fluidized bed to further promote uniform distribution of particulate in the fluidized bed 450.

Although the outlets 504 and 510 have been shown as being formed in the side wall 444 of the container 446, the outlets could be formed in small nozzles which extend from the side wall in either a radial direction or in a direction skewed to radial planes extending through the central axis of the container 446. The central axes of the nozzles could be disposed in horizontal planes. Alternatively, the central axes of the nozzles could slope upward or downward. The upward and/or downward sloping central axes may be skewed relative to radial planes to promote a swirling action in the fluidized bed 450.

In the embodiment illustrated in FIG. 14, a stirrer assembly has not been provided adjacent to the lower end portion of the fluidized bed 450. However, a stirrer assembly having the same general construction as the stirrer assembly 150 of FIGS. 3 and 5, could be provided in the lower portion of the fluidized bed 450 if desired. Of course, if this was done, the stirrer assembly would have to be disposed a sufficient distance above the bottom wall 472 to clear the upper ends of the fixtures 476.

Although the mold support 462 of FIG. 14 has the same construction as the mold support 48 of FIGS. 3 and 4, it is contemplated that the mold support 462 could be provided with gas outlets, in a manner similar to the mold support of FIG. 7. It is believed that the provision of gas outlets from the mold support 462 may be particularly advantageous when the outlets 504 and 510 are angled so as to promote a swirling action in the flow of gas around the side wall 444 in the fluidized bed 450.

Mold Moving Apparatus

Figure 15:
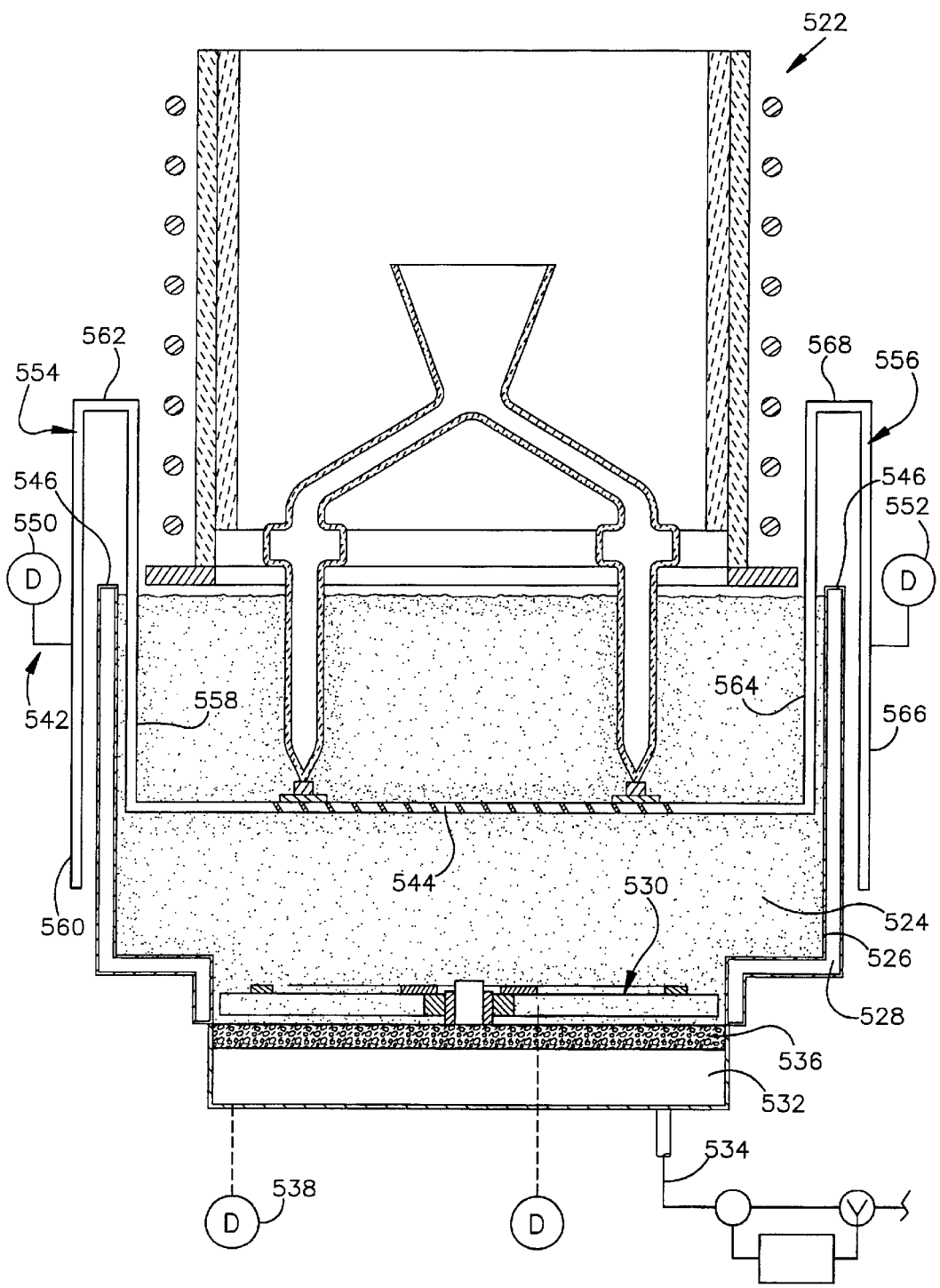
FIG. 15. is a schematic illustration depicting the manner in which a mold may be supported in a fluidized bed by a support assembly which extends across an upper end portion of a container for the fluidized bed and is connected with a drive assembly disposed outside of the fluidized bed.

In the embodiments illustrated in FIGS. 1–14, the apparatus for raising and lowering the mold includes a shaft which extends through a seal at the lower end portion of the fluidized bed. In the embodiment illustrated in FIG. 15 the necessity for providing a seal around a mold support shaft is eliminated. Since the embodiment illustrated in FIG. 15 is generally similar to the embodiments illustrated in FIGS. 1–14, therefore, similar terminology will be utilized to designate similar components. It should be understood that any one of the features of the embodiments illustrated in FIGS. 1–14 could be utilized in association with the embodiment illustrated in FIG. 15.

A furnace assembly 522 has the same general construction as the furnace assembly 40 of FIGS. 1–6. A fluidized bed 524 is disposed in a container 526 which is enclosed by a cooling jacket 528. A stirrer assembly 530 is disposed adjacent to a lower end portion of the fluidized bed 524 and is operable to promote distribution of the particulate in the fluidized bed. The stirrer assembly 530 has the same construction as the stirrer assembly 150 of FIGS. 3 and 5.

Gas is supplied to a plenum chamber 532 through a conduit 534. The gas flows from the plenum chamber 532 through a porous layer 536 into the fluidized bed 524 in the manner previously explained in conjunction with the embodiment of the invention illustrated in FIG. 3. A gas flow control apparatus, corresponding to the control apparatus of FIG. 10, may be provided to control the flow of gas to the plenum chamber 306. A container drive assembly 538 has the same construction as the container drive assembly 84 of FIGS. 1–6 and is operable to move the container 524 relative to the furnace assembly 502 in the manner previously described in conjunction with the embodiment of the invention illustrated in FIGS. 1–6.

In accordance with a feature of the embodiment illustrated in FIG. 15, a drive assembly 542 for raising and lowering a mold support 544 extends across an upper end portion 546 of the container 526. The mold support 544 is connected with a pair of drive units 550 and 552 by a plurality of generally U-shaped support members 554 and 556. Since the support members 554 and 556 extend across the circular upper end portion of the container 526, it is not necessary to provide seals in association with the support members.

The support member 554 includes an inner leg 558 which extends into the fluidized bed 524 and is connected with the mold support 544. In addition, the support member 554 includes an outer leg 560 which is connected with the drive unit 550. The inner and outer legs 558 and 560 are interconnected by a connector section 562. Similarly, the support member 556 includes an inner leg 564 and an outer leg 566. The outer leg 566 is connected with the drive unit 552. A connector section 568 interconnects the inner and outer legs 564 and 566.

The drive units 550 and 552 may be of the recirculating ball and nut type. The recirculating ball and nut drive units 550 and 552 may cooperate with screw threads formed on the outer legs 560 and 566 of the support members 554 and 556. Although only two support members 554 and 556 and drive units 550 and 552 have been illustrated in FIG. 15, it should be understood that additional support members and drive units may be connected with the mold support 544 if desired.

Since the support members 554 and 556 extend across the upper end portion 546 of the container 526, it is unnecessary to provide a seal between the fluidized bed 524 and a shaft, similar to the shaft 116 of FIG. 3, which supports a mold support, similar to the mold support 48 of FIG. 3. Although the mold support 544 has the same general construction as the mold support 48 of FIG. 4, the mold support 544 may be provided with gas discharge outlets in the same manner as is the mold support 182 of FIG. 7. It should also be understood that gas outlets could be provided along the side walls of the container in the manner illustrated in FIGS. 12–14.

Alternative Embodiment of Mold Moving Apparatus

Figure 16:
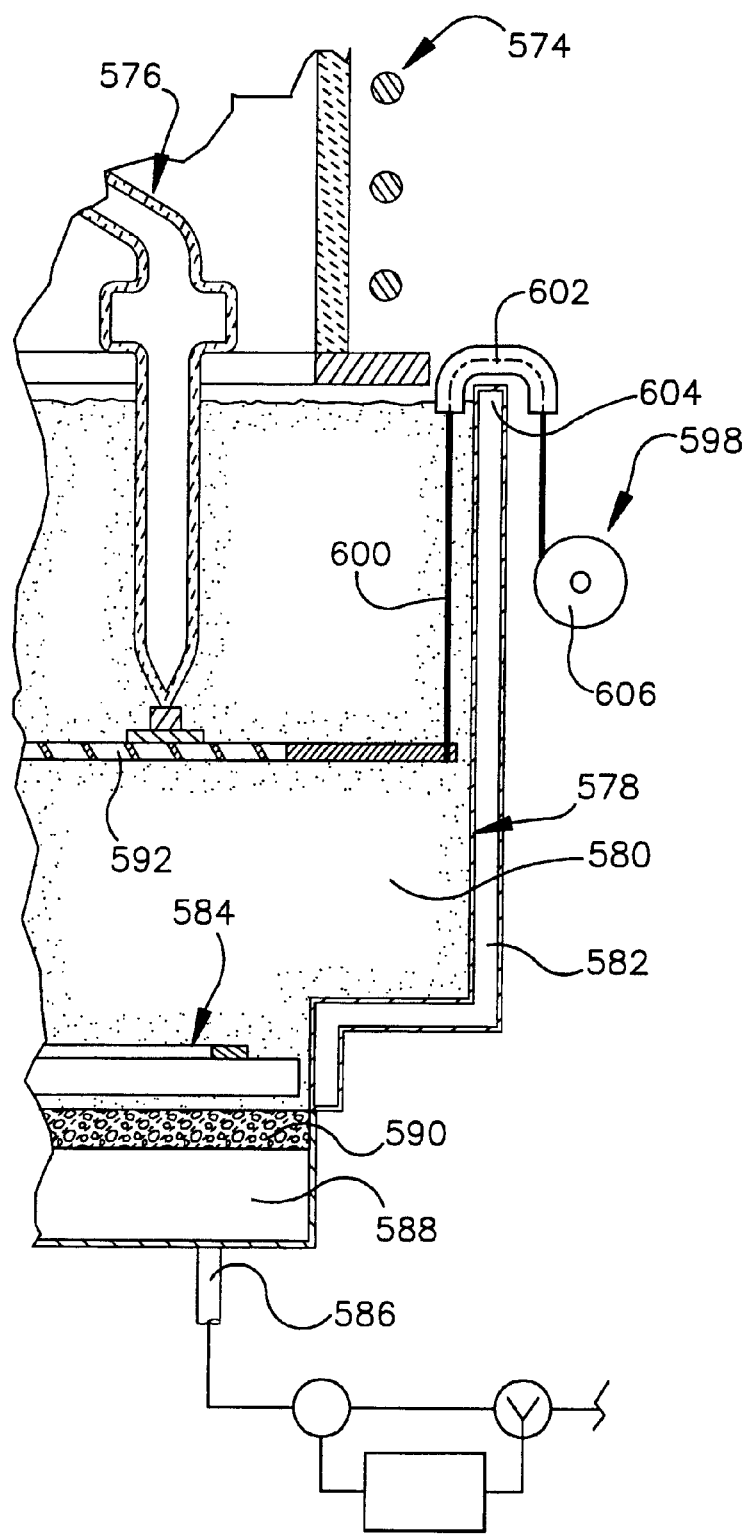
FIG. 16. is a fragmentary schematic illustration of an embodiment in which a support for a mold is suspended in a fluidized bed on elongated flexible members.

In the embodiment illustrated in FIG. 15, the mold support drive assembly 542 includes rigid support members 554 and 556 which are moved relative to the container 526. In the embodiment illustrated in FIG. 16, the rigid support members 554 and 556 of FIG. 15 have been replaced by flexible support members. Since the embodiment illustrated in FIG. 16 is generally similar to the embodiment illustrated in FIG. 15, similar terminology will be utilized to designate similar components. It should be understood that any of the features of the embodiments illustrated in FIGS. 1–15 may be utilized with the embodiment illustrated in FIG. 16.

A furnace assembly 574 (FIG. 16) receives a mold 576 in the same manner as previously discussed in conjunction with the embodiment of the invention illustrated in FIGS. 1–6. A container 578 holds a fluidized bed 580 and is enclosed by a cooling jacket 582. A stirrer assembly 584 is disposed in a lower end portion of the fluidized bed 580.

Gas under pressure is conducted through a conduit 586 to a plenum chamber 588. The gas flows from the plenum chamber 588 through a porous layer 590 into the fluidized bed 580. The mold 576 is supported in the fluidized bed 580 on a mold support 592.

The mold support 592 has the same construction as the mold support 48 of FIGS. 3 and 4. The stirrer assembly 584 has the same construction as the stirrer assembly 150 of FIGS. 3 and 5. The manner in which the gas under pressure is conducted from the plenum chamber 588 through the porous layer 590 into the fluidized bed 580 is the same as was previously described in conjunction with the embodiment illustrated in FIGS. 1–6.

In accordance with a feature of the embodiment of FIG. 16, a drive assembly 598 is provided to raise and lower the mold support 592. Although only a single drive assembly 598 has been illustrated in FIG. 16 in association with the mold support 592, it should be understood that additional drive assemblies (not shown) are connected with the mold support 592. The additional drive assemblies have the same construction as the drive assembly 598.

The drive assembly 598 includes an elongated flexible member 600. The elongated flexible member 600 may be a wire rope or similar article. The elongated flexible member 600 extends through a hollow tubular member 602 which is connected with an upper end portion 604 of the container 578. The drive assembly 598 includes a winch 606 which is connected with the elongated flexible member 600.

When the mold support 592 is to be raised relative to the fluidized bed 580, winches, corresponding to the winch 606, in the drive assemblies, corresponding to the drive assembly 598, are operated to wind up flexible elongated members 600. Similarly, when the mold support 592 is to be lowered, the winches, corresponding to the winch 606, are operated in the drive assemblies, corresponding to the drive assembly 598, to unwind the elongated flexible members and lower the mold support 592 into the fluidized bed 580.

Container Drive Assembly

Figure 17:
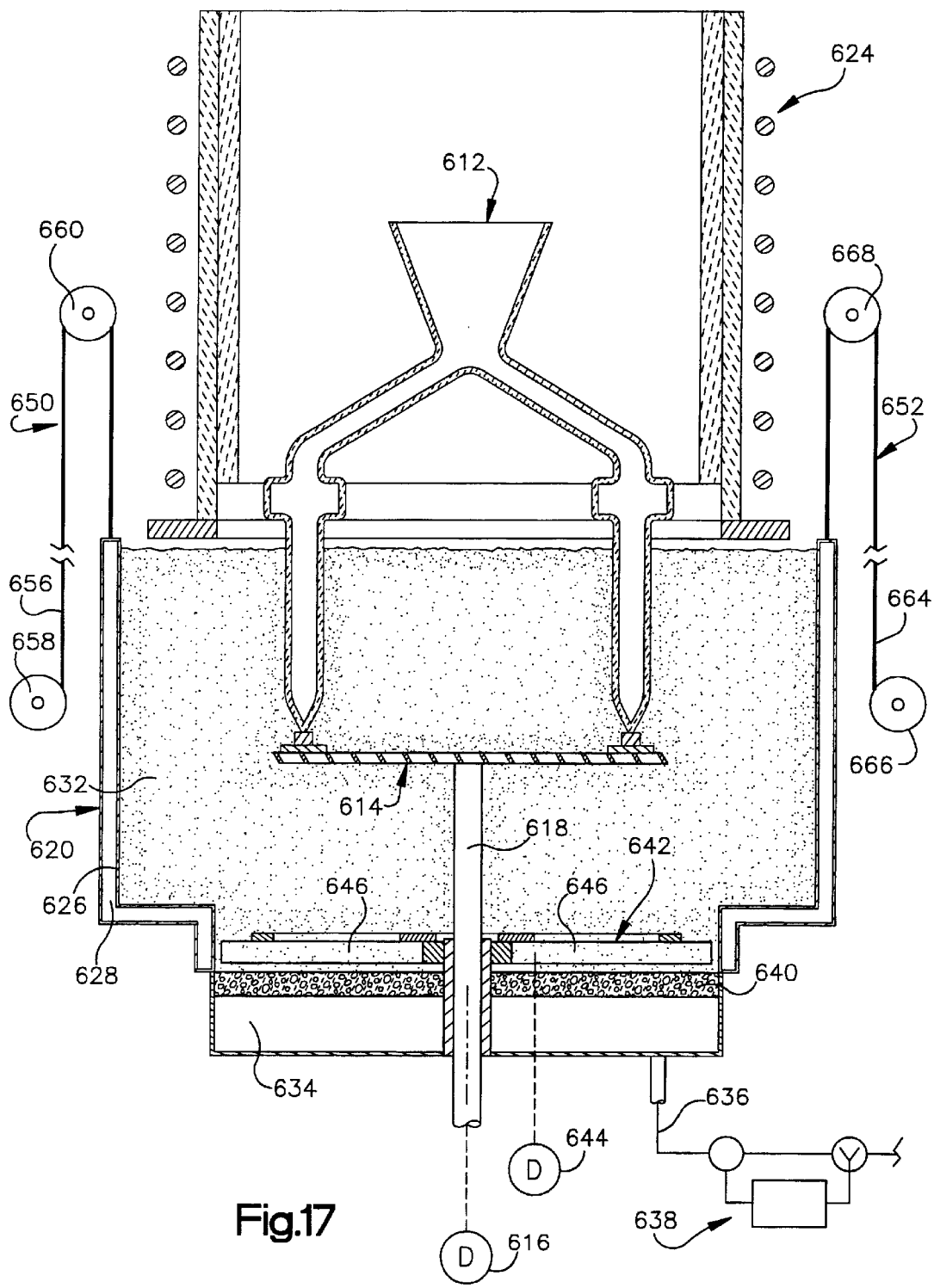
FIG. 17. is a fragmentary schematic illustration, generally similar to FIG. 3, illustrating an embodiment in which a fluidized bed is supported by flexible elongated members.

In the embodiment illustrated in FIGS. 1–16, a piston and cylinder type container drive assembly is utilized to raise and lower the container which holds the fluidized bed. In the embodiment illustrated in FIG. 17, elongated flexible members or cables are utilized to support, raise, and lower the container. Since the embodiment illustrated in FIG. 17 is generally similar to the embodiments illustrated in FIGS. 1–16, similar terminology will be utilized to designate similar components. It should be understood that one or more of the features of the embodiments illustrated in FIGS. 1–16 could be utilized with the embodiment illustrated in FIG. 17.

A mold 612 (FIG. 17) is supported on a mold support 614. A mold support drive assembly 616 is operable to move a shaft 618 relative to a container 620. Operation of the mold support drive assembly 616 moves the mold 612 into and out of a furnace assembly 624. If desired, the mold support drive assembly 616 could have the same construction as the mold support drive assembly 542 of FIG. 15 or the mold support drive assembly 598 of FIG. 16.

The container 620 includes a side wall 626 which is enclosed by a cooling jacket 628. The container 620 holds a fluidized bed 632. The fluidized bed 632 is formed by particulate suspended in a flow of gas, such as argon.

The gas for suspending the particulate in the fluidized bed 632 is conducted to a plenum chamber 634 through a conduit 636. A control apparatus 638 is provided to control the flow of gas in the same manner as previously described in conjunction with the embodiment of the invention illustrated in FIG. 10. The plenum chamber 634 could have a construction similar to the construction of the plenum 212 of FIG. 8 or the plenum 380 of FIG. 11 if desired.

The gas is conducted from the plenum chamber 634 (FIG. 17) through a porous layer 640 into the fluidized bed 632. A stirrer assembly 642 is disposed adjacent to a lower end portion of the fluidized bed. A drive assembly 644 is connected with the stirrer assembly 642 and is operable to move stirrer members 646 in the lower end portion of the fluidized bed 632 to promote uniform distribution of particulate in the fluidized bed. The stirrer assembly 642 has the same construction as the stirrer assembly 150 of FIGS. 3 and 5.

The container 620 (FIG. 17) and fluidized bed 632 are raised and lowered relative to the furnace assembly 624 by operation of container drive assemblies 650 and 652. The container drive assembly 650 includes a flexible cable or elongated member 656 which is connected with a winch 658. The cable 656 extends over a pulley 660 which is mounted for rotation about an axis disposed in a fixed relationship with the furnace assembly 624. An end of the cable is connected with an upper end of the container 620.

The container drive assembly 652 has the same construction as the container drive assembly 650 and includes a cable or elongated flexible member 664 which is connected with a winch 666. The cable 664 extends over a pulley 668 which is mounted for rotation about an axis disposed in a fixed relationship with the furnace assembly 624. An end of the cable 664 is connected with an upper end portion of the container 620.

When the container 620 is to be moved to the raised position illustrated in FIG. 17, the winches 658 and 666 are operated together to wind up the cables 656 and 654 on the winches. Similarly, when the container 620 is to be lowered, the winches 658 and 666 both are operated to unwind the cables 656 and 664 and lower the container.

In the embodiment illustrated in FIG. 16, a pair of container drive assemblies 650 and 652 are illustrated as being associated with opposite sides of the container 620. It should be understood that a greater number of container drive assemblies, for example, three, could be provided if desired. It should also be understood that although the container drive assemblies 650 and 652 include the flexible cables 656 and 664, the container drive assemblies could have a different construction if desired. For example, the container drive assemblies 650 and 652 could have a ball and nut type construction similar to the ball and nut type constructions of the drive units 550 and 552 of FIG. 15.

Suspended Mold

In the embodiment illustrated in FIGS. 3 and 4, a mold support is provided at one end of a shaft to engage a lower end portion of a mold and support the mold. In the embodiment illustrated in FIG. 9, the shaft directly engages a central portion of the mold and a peripheral portion of the mold is spaced from the shaft which supports the mold. In the embodiment illustrated in FIGS. 18 and 19, the mold is suspended for movement relative to a furnace and fluidized bed. By suspending the mold, the need for a shaft which extends through the fluidized bed is eliminated.

A mold 678 (FIG. 18) is suspended by a pair of movable support members 680 and 682. The support members 680 and 682 extend through an upper end portion of a furnace assembly 686 and are movable relative to the furnace assembly to raise and lower the mold 678. A container 690 is disposed below the furnace assembly 686 and holds a fluidized bed 692. A container drive assembly 694 is operable to raise and lower the container 690 relative to the furnace assembly 686. The container drive assembly 694 may have any one of the constructions illustrated in FIGS. 1–3 or FIG. 17.

A fluidized bed 692 is formed by suspending particulate in a flow of gas. The gas for forming the fluidized bed is conducted to a plenum chamber 696 through a conduit 698. A control apparatus 700 is provided to control the flow of gas to the plenum chamber 696. The gas flows from the plenum chamber 696 through a porous layer 704 into the fluidized bed 692. A stirrer assembly 706 is disposed at a lower end portion of the fluidized bed 692 and is operable to promote uniform distribution of particulate in the fluidized bed. The general construction of the container 690 and the manner in which the fluidized bed 692 is formed in the container is the same as was previously described in conjunction with the embodiment illustrated in FIG. 3.

The support member 680 is connected with a drive assembly 712 (FIG. 19 on sheet 6 of the drawings). The drive assembly 712 includes an elongated flexible member or cable 714 which is connected with a winch 716. The cable 714 extends around a pair of pulleys 720 and 722 which are disposed above the furnace assembly 686. An end of the cable 714 is connected with the support member 680.

A stabilizing frame 726 is provided to guide movement of the support member 680 relative to the furnace assembly 686. The stabilizing frame 726 includes a tubular guide member 730. A pair of support members 732 and 734 are provided to fixedly support the guide member 730 above the furnace assembly 686.

Figure 18:
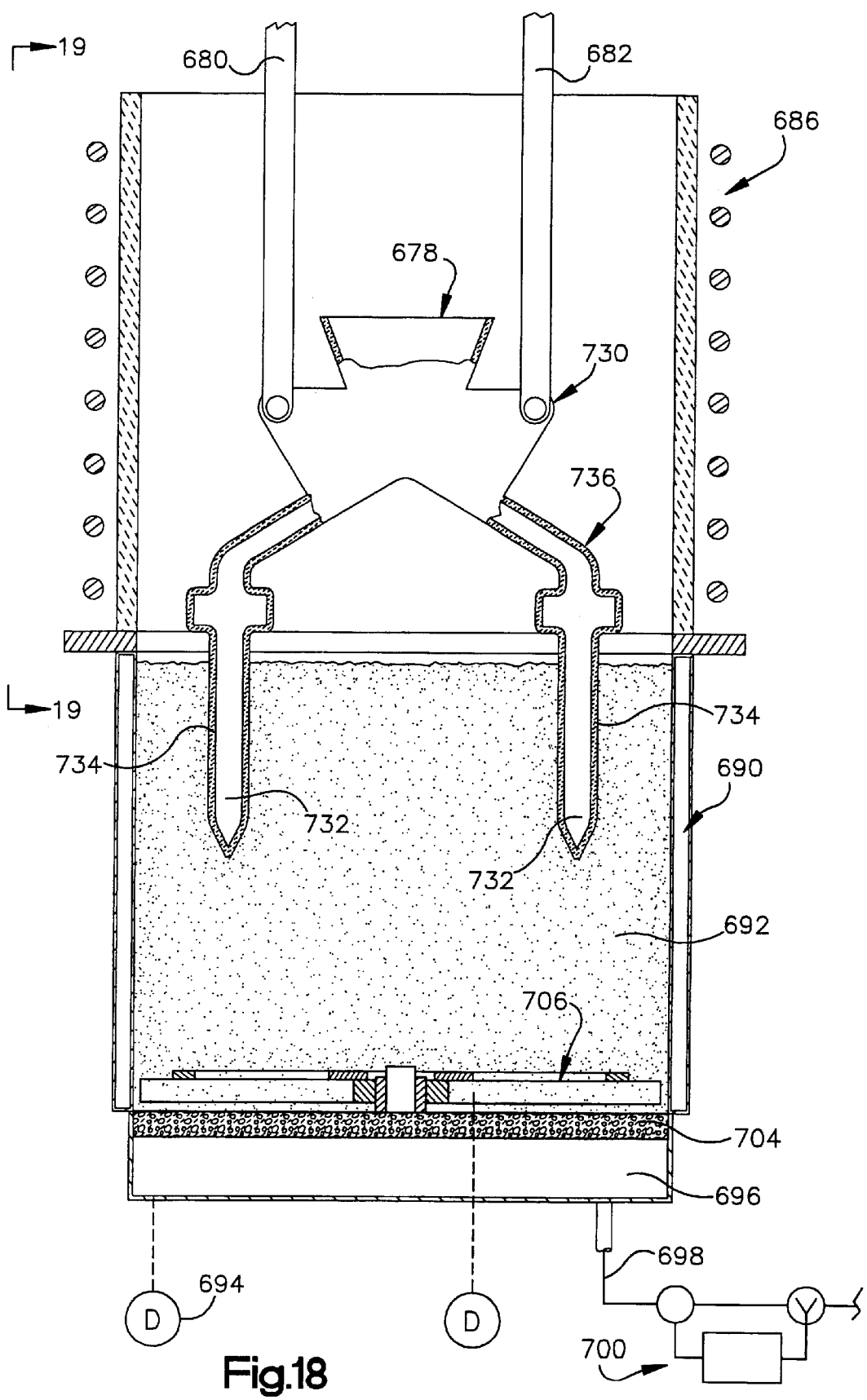
FIG. 18. is a schematic illustration, generally similar to FIG. 3, depicting the manner in which a mold may be suspended by upwardly extending members.

Although only the drive assembly 712 for raising and lowering the support member 680 is illustrated in FIG. 19, it should be understood that a similar drive assembly is provided in association with the support member 682 (FIG. 18). The drive assemblies for the support members 680 and 682 are operable to raise the mold 678 into the furnace assembly 686. After molten metal has been poured into the mold 678 in the furnace 686, the drive assemblies for the support members 680 and 682 are operable to lower the mold 678 into the fluidized bed 692. Due to the relatively hot environment of the furnace assembly 686, that is between 2,500 degrees Fahrenheit and 3,000 degrees Fahrenheit, the support members 680 and 682 may be formed of graphite.

In the embodiment illustrated in FIG. 18, the support members 680 and 682 are connected with a central portion 738 of the mold 678. The support members 680 and 682 may be connected with graphite rods which extend through passages formed in the central portion of the mold 678. A plurality of article mold cavities are formed in article mold sections 734 disposed in a circular array in a peripheral portion 736 of the mold 678. The article mold sections are spaced apart from each other to enable the gas suspended particulate of the fluidized bed 692 to engage the peripheral portion 736 of the mold around the article mold sections 734. Since the mold 678 is suspended, lower end or bottom surfaces on the article mold sections 734 are completely exposed to the particulate in the fluidized bed 692.

Although the drive assembly 712 uses cables 714 to suspend the mold 678, the mold could be suspended in a different manner if desired. For example, the support members 680 and 682 could be connected with ball nut and screw type drive assemblies if desired. Although the support members 680 and 682 are connected with cables at a location outside of the upper housing for the furnace assembly 686, the support member drives could be disposed within the upper housing, corresponding to the upper housing 32 of FIG. 1.

Mold With Through Passages

Figure 20:
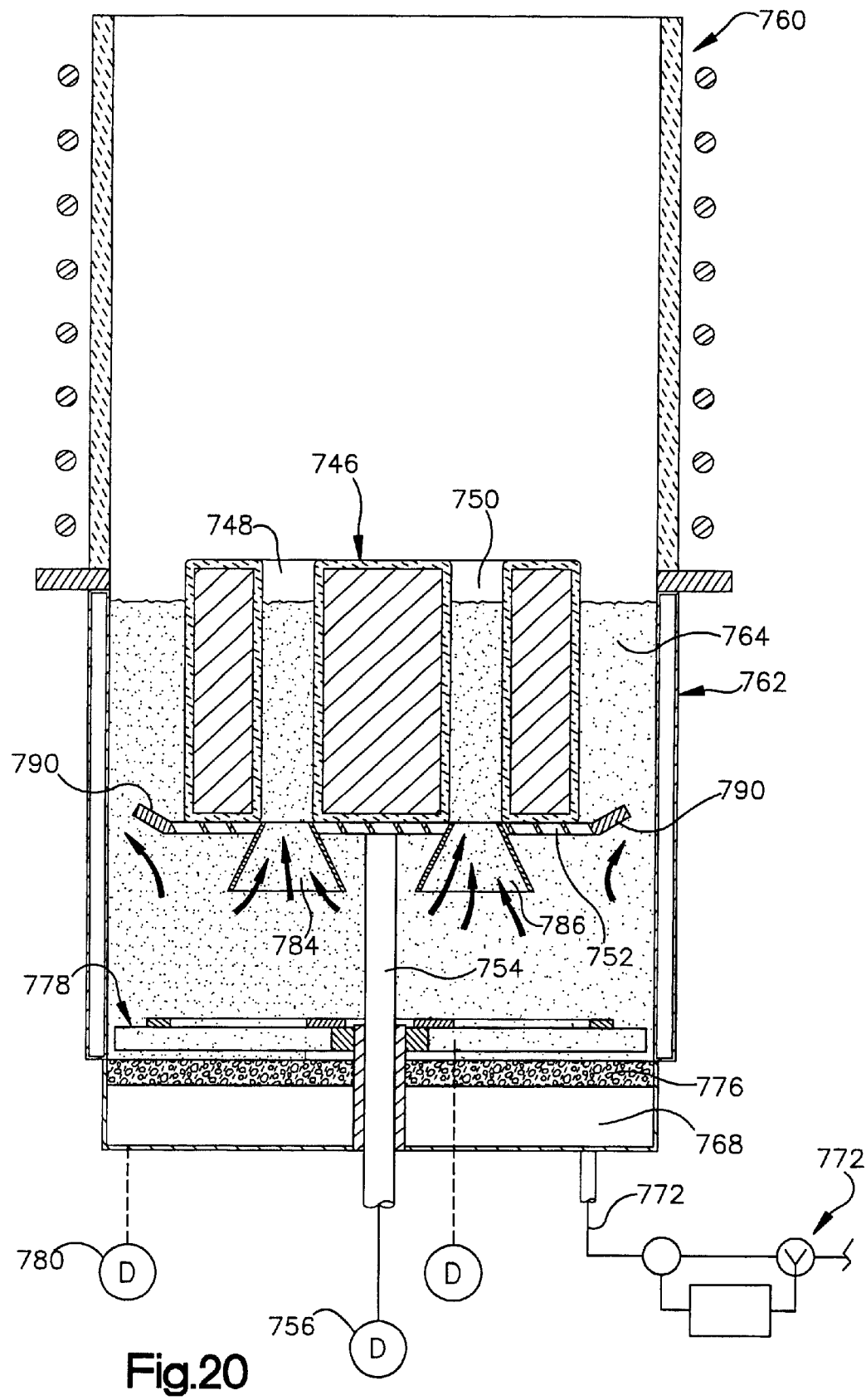
FIG. 20. is schematic illustration, generally similar to FIG. 3, depicting the manner in which a flow of gas and particulate is conducted through passages formed in a mold.

In the embodiment of FIGS. 1–19, the illustrated molds have been provided with a peripheral portion having a plurality of spaced apart article mold sections. The material of the fluidized bed flows around the outside of each of the article mold sections. In the embodiment illustrated in FIG. 20, the material of the fluidized bed flows through passages in the mold. Since the embodiment illustrated in FIG. 20 is generally similar to the embodiments illustrated in FIGS. 1–19, similar terminology will be utilized to designate similar components. It should be understood that one or more of the features of the embodiments illustrated in FIGS. 1–19 may be utilized in association with the embodiment illustrated in FIG. 20.

A mold 746 has passages 748 and 750 which extend through the mold. The mold is disposed on a mold support 752. The mold support 752 is connected with a shaft 754 which is vertically movable by a mold support drive assembly 756. The mold support drive assembly 756 is operable to raise and lower the mold 746 relative to a furnace assembly 760 and a container 762. The container 762 holds a fluidized bed 764 formed by particulate suspended in a flow of gas.

Gas is supplied to a plenum chamber 768 through a conduit 770. The flow of gas through the conduit 770 is controlled by a control apparatus 772. The control apparatus 772 is operable to control the flow of gas to the plenum chamber 768 in the same manner as previously described in conjunction with the embodiment of the invention illustrated in FIG. 10. The gas flows from the plenum chamber 768 through a porous layer 776 into the fluidized bed 764.

A stirrer assembly 778 is disposed in the lower end portion of the fluidized bed 764 to promote even distribution of particulate in the fluidized bed. A container drive assembly 780 is connected with the container 762 and is operable to raise and lower the container relative to the furnace assembly 760. The stirrer assembly 778 and container drive assembly 780 have the same construction and mode of operation as the stirrer assembly 150 and container drive assembly 84 of FIGS. 1–5.

The cylindrical passages 748 and 750 extend through the mold 746. In the embodiment of the invention illustrated in FIG. 20, it is desired to have the article solidify in the mold 746 in a direction away from the passages 748 and 750. To promote solidification of the molten metal in the mold 746 in a direction away from the passages 748 and 750, flow of gas and particulate in the fluidized bed 764 through the passages is promoted by baffles 784 and 786.

The baffles 784 and 786 have a generally frustroconical configuration and are fixedly connected with the mold support 752. The baffles 784 and 786 extend downward from the mold support 752 and flare radially outward and downward. This results in the baffles promoting a flow of gas with particulate suspended therein through the passages 748 and 750.

The relatively high rate of flow of the material of the fluidized bed 764 through the passages 748 and 750 increases the rate of heat transfer from surfaces defining the passages 748 and 750 to the fluidized bed 764. This results in the molten metal adjacent to the surfaces defining the passages 748 and 750 solidifying before the molten metal in the remainder of the mold 746.

To retard the solidification of molten metal in the mold 746 adjacent to outer side surfaces of the mold, an annular baffle 790 flares radially outward and upward from the mold support 752. The baffle 790 promotes a flow of gas and particulate in the fluidized bed 764 away from the outer side surfaces of the mold 746.

In FIG. 20, the baffles 784, 786 and 790 have been illustrated as being connected with the mold support 752. It is contemplated that the baffles could be connected with the side wall of the container 762 if desired. The baffles may be supported on struts which extend into the fluidized bed 764 from the side wall of the container. This would enable gas and particulate to flow through passages disposed between the side wall of the container and the baffles.

Mold With Baffle

Figure 21:
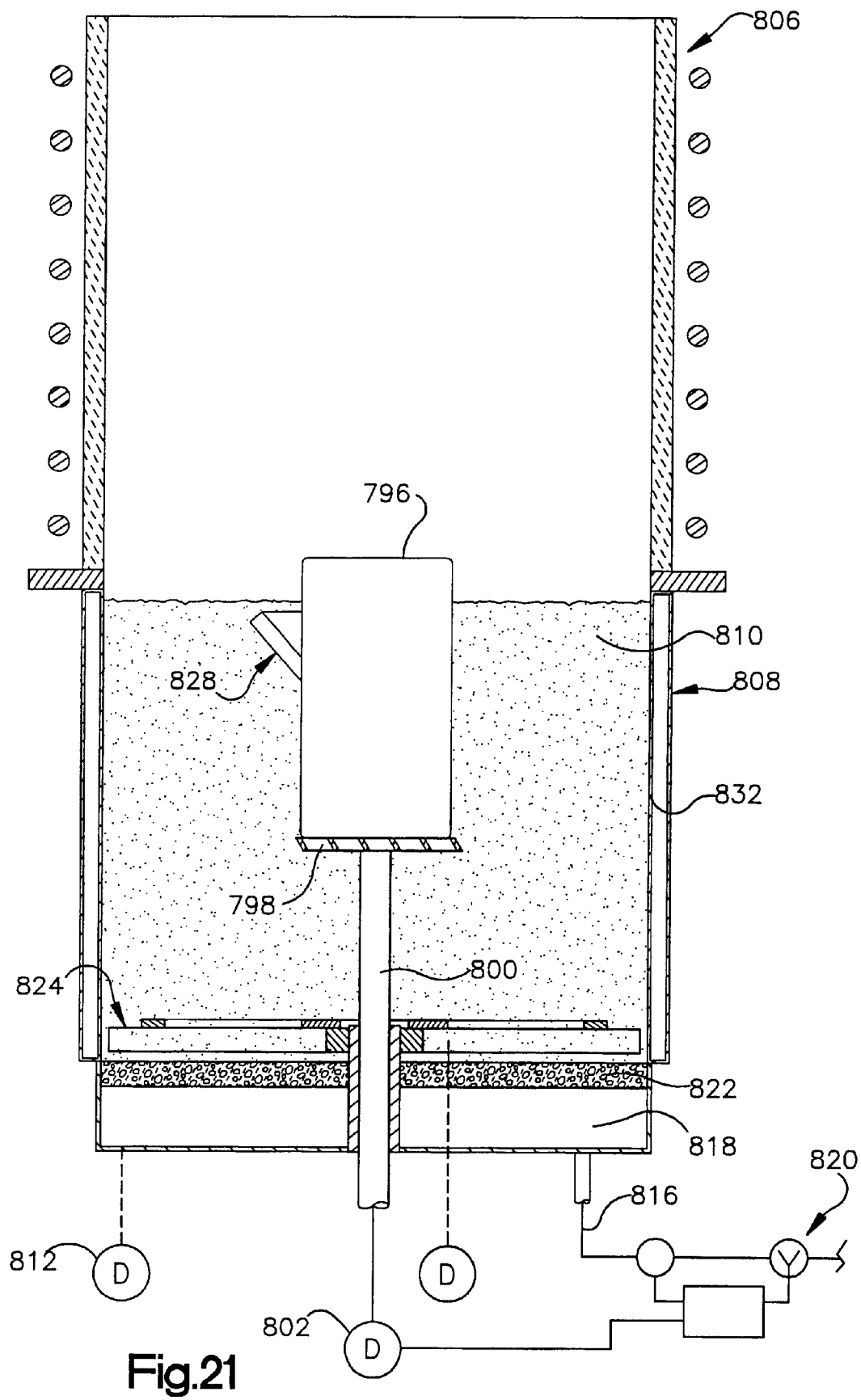
FIG. 21. is a schematic illustration, generally similar to FIG. 20, depicting the manner in which a baffle may be integrally formed with a mold to deflect a flow of gas and particulate in a fluidized bed.

In the embodiment illustrated in FIG. 20, the baffles 784, 786 and 790 are fixedly connected with the mold support 752. In the embodiment illustrated in FIG. 21, a baffle is integrally formed with the mold. Since the embodiment illustrated in FIG. 21 is generally similar to the embodiments of in FIGS. 1–20, similar terminology will be utilized to designate similar components. It should be understood that one or more of the features of the embodiments illustrated in FIGS. 1–20 may be utilized in association with the embodiment illustrated in FIG. 21.

A mold 796 is disposed on a mold support 798. The mold support 798 has the same construction as the mold support 48 of FIGS. 3 and 4. It should be understood that gas outlets could be associated with the mold support 798 in the manner illustrated schematically in FIG. 7 for the mold support 182.

The mold support 798 is disposed on the upper end of a shaft 800 connected with a mold support drive assembly 802. The mold support drive assembly 802 is operable to raise and lower the mold support 798 and mold 796 relative to a furnace assembly 806 and a container 808. The container 808 holds a fluidized bed 810. The container 803 and fluidized bed 810 can be raised and lowered relative to the furnace assembly 806 by a container drive assembly 812.

The fluidized bed 810 contains particulate suspended in a flow of gas. Gas is supplied to the fluidized bed 810 from a conduit 816. The conduit 816 is connected with a plenum chamber 818. A flow of gas, that is argon, to the plenum chamber 818 is regulated by a control apparatus 820 having the same construction and mode of operation as the control apparatus 318 of FIG. 10. The gas under pressure flows from the plenum chamber 818 through a porous layer 822 into the fluidized bed 810. A stirrer assembly 824 is provided in the lower end portion of the fluidized bed 810 and has the same construction as the stirrer assembly 150 of FIGS. 3 and 5.

In accordance with a feature of the embodiment of FIG. 21, the mold 796 is provided with a baffle 828 which extends outward from one side of the mold 796. The baffle 828 and the mold 796 are integrally formed as one piece of ceramic mold material. The baffle 828 slopes outward and upward from the mold 796. The baffle 828 directs flow of gas and suspended particulate in the fluidized bed 810 away from the mold 796. This results in a lower rate of heat transfer from the portion of the mold disposed directly above the baffle. Therefore, the molten metal in the portion of the mold 796 disposed directly above the baffle will tend to solidify slower than the molten metal in other portions of the mold.

In addition to providing baffle 828 in association with a mold, a baffle could be fixedly connected with a side wall 832 of the container 808 or with the mold support 798. Rather than deflecting a flow of gas and suspended particulate in a direction away from the mold 796, baffles connected with the mold support 798 or side wall 832 could be oriented so as to deflect the flow of gas and particulate in the fluidized bed 810 in a direction toward the mold 796. This may be accomplished in much the same manner as in which the baffles 784 and 786 of FIG. 20 direct a flow of gas and particulate in the fluidized bed 764 into the passages 748 and 750. Of course, there will be a relatively high heat transfer rate from the portion of the mold 796 (FIG. 21) toward which a flow of gas and suspended particulate in the fluidized bed 810 is directed by baffles.

It is contemplated that, in addition to baffles, insulating material may be associated with the mold 796 to promote or retard solidification of molten metal in selected portions of the mold. The insulating material may be used by itself or in conjunction with baffles. The insulating material is applied over portions of the mold 796 in which it is desired to reduce the heat transfer rate from the mold. This will result in the molten metal in portions of the mold 796 which are not covered with insulating material solidifying faster than molten metal in a portion of the mold covered by insulating material.

Casting of Thin Wall Article

Figure 22:
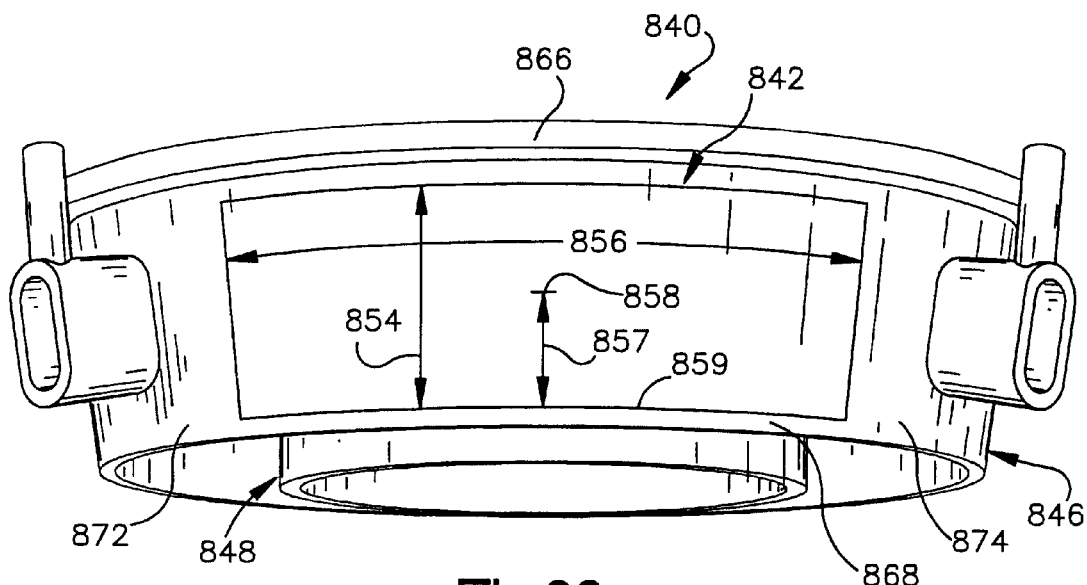
FIG. 22. is an illustration of a cast metal turbine engine component.
Figure 23:
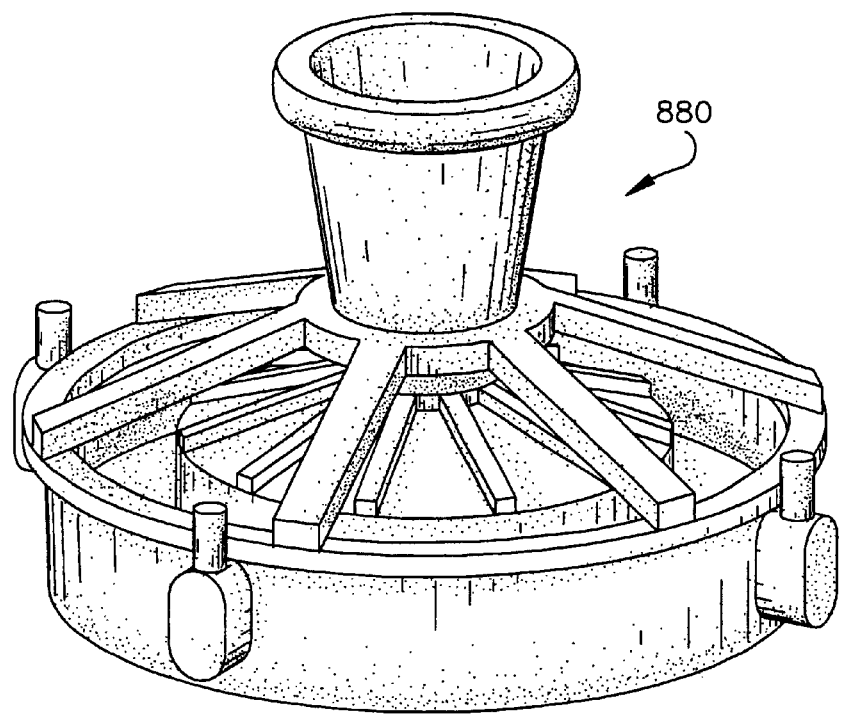
FIG. 23. is a schematic pictorial illustration of an annular mold for the turbine engine component of FIG. 22.
Figure 24:
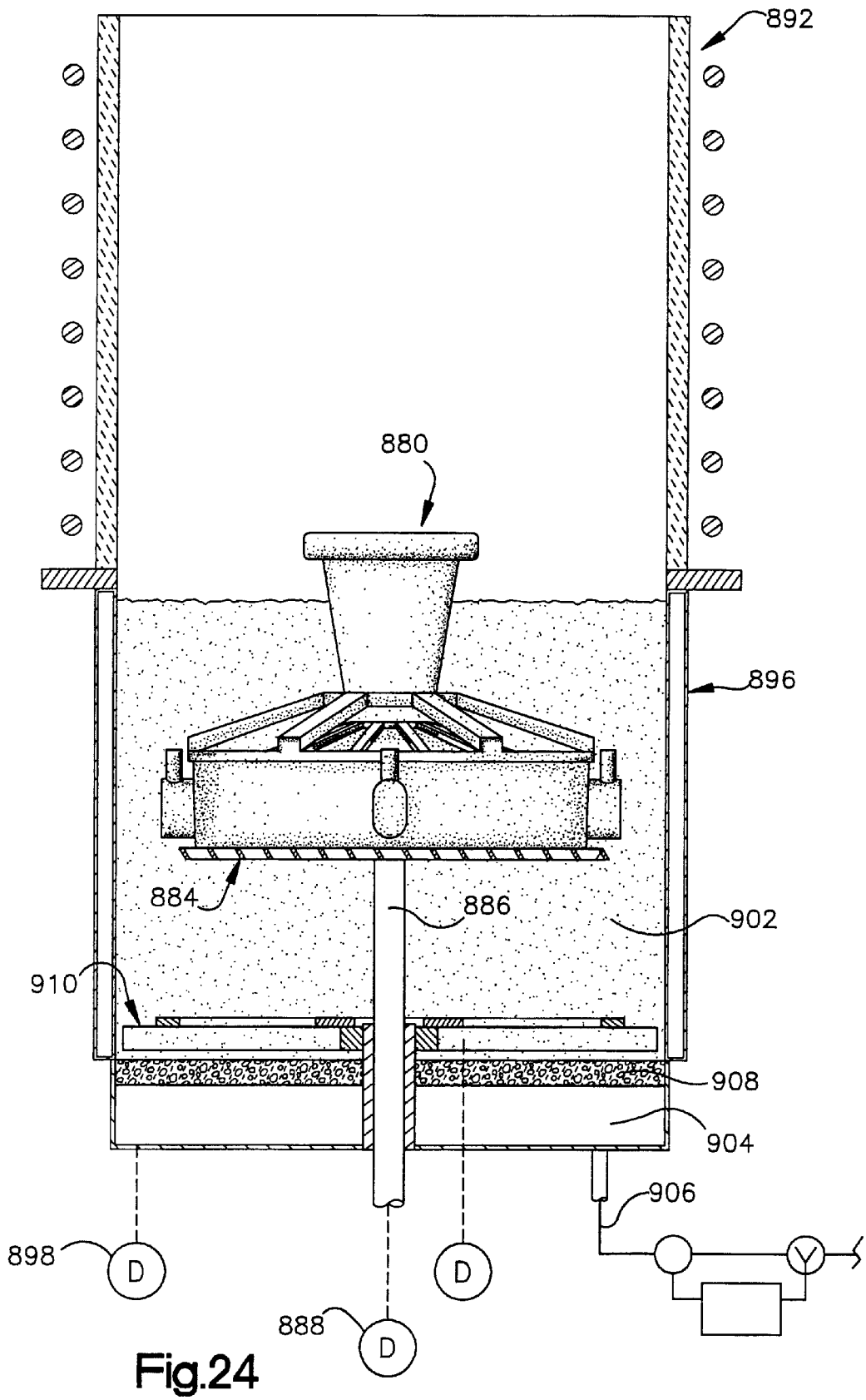
FIG. 24. is a schematic illustration, generally similar to FIG. 3, depicting the manner in which the mold of FIG. 23 is lowered from a furnace into a fluidized bed.

In the embodiment illustrated in FIGS. 1–6, a mold for casting airfoils or similar components is disclosed. It is contemplated that the mold may be constructed so as to cast many different types of articles. An article having a thin wall portion and a mold and method for casting the article are disclosed in FIGS. 22–24. Since the embodiment illustrated in FIGS. 22–24 is generally similar to the embodiments of in FIGS. 1–21, similar terminology will be utilized to designate similar components. It should be understood that one or more of the features of the embodiments illustrated in FIGS. 1–21 may be utilized with the embodiment illustrated in FIGS. 22–24.

A turbine engine component 840 having a thin wall portion 842 is cast as one piece. The cast turbine engine component 840 has a generally cylindrical outer wall 846 which circumscribes and is coaxial with a generally cylindrical inner wall 848. The inner and outer walls 846 and 848 are interconnected, in a known manner, by radially extending struts (not shown). It should be understood that although the turbine engine component 840 has been illustrated in FIG. 22, it is contemplated that the present invention may be utilized to cast articles other than turbine engine components.

The thin wall portion 842 of the turbine engine component 840 has an as-cast thickness of 0.060 of an inch or less. The as-cast thin wall portion 842 has an axial extent, indicated at 854 in FIG. 22, and a circumferential extent indicated at 856 in FIG. 22. The distance 857 from a center 858 of the thin wall portion 842 to a closest edge 859 of the thin wall portion divided by the thickness of the thin wall portion is equal to forty or more.

In the turbine engine component 840, the axial and circumferential extents 854 and 856 of the thin wall portion 842 are such that the as-cast inner and outer major side surfaces of the thin wall portion 842 have a surface area of at least sixteen square inches. The side surfaces of the thin wall portion have an extent of at least four inches along each axis of a pair of orthogonal axes. Thus, the width 854 and length 856 are both at least four inches.

The thin wall portion 842 has a uniform thickness and extends axially between a relatively thick annular upper rim or frame 866 and a relatively thick annular lower rim or frame 868. In the turbine engine component 840, the thin wall portion 842 does not extend completely around the turbine engine component but is bounded by relatively thick side or frame sections 872 and 874 which extend between the rim or frame sections 866 and 868.

The annular turbine engine component 840 has the same construction as is disclosed in U.S. Pat. No. 4,724,891. In order to avoid prolixity of description, the disclosure in the aforementioned U.S. Pat. No. 4,724,891 is hereby incorporated herein in its entirety by this reference thereto.

Although one specific turbine engine component 840 has been illustrated in FIG. 22, it should be understood that other metal articles may be cast using the advantages of the present invention. For example, the metal article could have the configuration corresponding to the configuration of a thin metal airfoil. Alternatively, the metal article could have a configuration corresponding to the configuration of a portion of a housing which could be used in association with a turbine engine. Although the article 840 has frame portions 866 and 868, the entire article could be formed by the thin wall portion 842. It is contemplated that the metal article could have the same construction as disclosed in U.S. Pat. No. 6,050,325. The disclosure in the aforementioned U.S. Pat. No. 6,050,325 is hereby incorporated herein in its entirety by this reference thereto.

The cast article, regardless of its configuration, may be formed of any desired metal, including a nickel-chrome superalloy, titanium or a titanium alloy.

When the article 840 is to be cast, a wax pattern having a configuration corresponding to the configuration of the article is formed. The wax pattern may be formed of natural or synthetic wax materials. A wax pour cup pattern and a wax gating pattern is connected with the wax pattern of the article 840.

After the wax pattern has been assembled, it is repetitively dipped in a slurry of ceramic mold material and dried to form a covering of a desired thickness over the pattern. The covering of ceramic mold material and pattern are then heated to a temperature sufficient to melt the wax forming the pattern. This wax is drained from the covering of ceramic mold material to leave a mold 880 (FIG. 23). The mold 880 has the same construction as is disclosed in the aforementioned U.S. Pat. No. 4,724,891. However, if the article to be cast has a different configuration, such as the configuration disclosed in U.S. Pat. No. 6,050,325, the mold would have a different configuration.

When the article 840 is to be cast in the mold 880, the mold is positioned on a mold support 884 disposed on the upper end of a shaft 886 (FIG. 24). The shaft 886 is connected with a mold support drive assembly 888. The mold support drive assembly 888 is operated to raise the mold 880 into a furnace assembly 892 in the same manner as previously described in conjunction with FIGS. 1 and 2 herein.

A container 896 is raised to a position immediately below the furnace 892 by a container drive assembly 898. A fluidized bed 902 is held in the container 896. The fluidized bed is formed by particulate suspended in a flow of gas.

Gas (argon) is supplied to a plenum chamber 904 at the lower end portion of the container 896 through a conduit 906. The gas flows from the plenum chamber 904 through a porous layer 908 into the fluidized bed 902. A stirrer assembly 910 is disposed at a lower end portion of the fluidized bed 902 to promote uniform distribution of particulate in the fluidized bed.

When the mold 880 has been filled with molten metal in the furnace 892 in the same manner as previously described in conjunction with the embodiment of the invention illustrated in FIGS. 1–6, the mold support drive assembly 888 is operated to lower the mold support 884 into the fluidized bed 902. As the mold 880 is lowered into the fluidized bed, the molten metal in the mold is solidified to form a cast metal article, such as the turbine engine component 840 of FIG. 22.

Bellows

Figure 25:
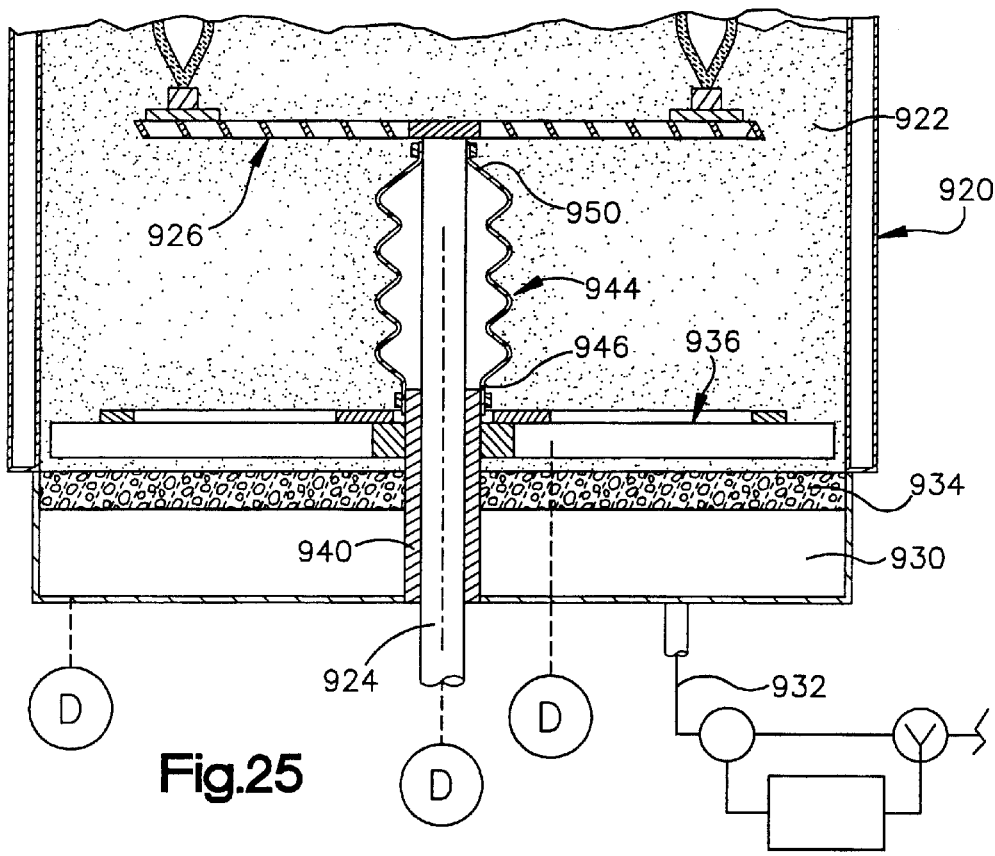
FIG. 25. is a schematic illustration depicting the manner in which a bellows may be connected with a mold support and a container for a fluidized bed.
Figure 26:
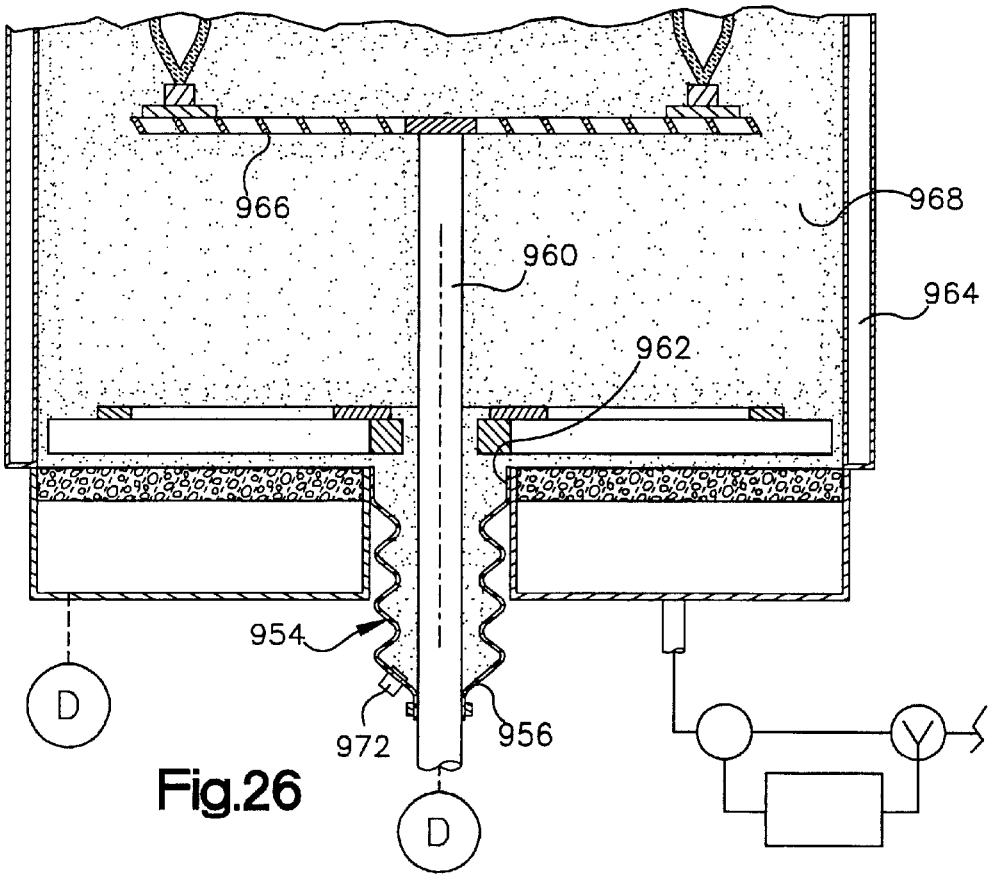
FIG. 26. is a schematic illustration, generally similar to FIG. 25, illustrating an alternative manner of connecting a bellows with a mold support and container for a fluidized bed.

In the embodiment illustrated in FIG. 3, the shaft 116 extends through a seal into the fluidized bed 86. Exposure of the seal to particulate in the fluidized bed may tend to impair the effectiveness of the seal. In the embodiment illustrated in FIGS. 25 and 26, a bellows is provided to protect the seal. Since the embodiment illustrated in FIGS. 25 and 26 is generally similar to the embodiments of in FIGS. 1–24, similar terminology will be utilized to designate similar components. It should be understood that one or more components from the embodiments illustrated in FIGS. 1–24 may be utilized with the embodiments illustrated in FIGS. 25 and 26.

A container 920 (FIG. 25) holds a fluidized bed 922. A shaft 924 has an upper end portion which is connected with a mold support 926. A mold support drive assembly is connected with the shaft 924 and is operable to raise and lower the mold support 926 relative to the container 920 and fluidized bed 922.

The fluidized bed 922 is formed by particulate suspended in a flow of gas. Gas for the fluidized bed is supplied to a plenum chamber 930 through a conduit 932. The gas flows from the plenum chamber 930 through a porous layer 934 into the fluidized bed 922. A stirrer assembly 936 is disposed in a lower end portion of the fluidized bed 922 to promote uniform distribution of particulate in the fluidized bed.

The mold support 926 has the same construction as the mold support 48 of FIGS. 3 and 4. However, it is contemplated that gas outlets could be provided in association with the mold support 926 in the same manner as previously described in conjunction with the embodiment of the invention illustrated in FIG. 7.

During operation of the mold support drive assembly to raise and lower the mold support 926, the shaft 924 moves axially relative to a combination seal and bearing member 940. In order to protect a bearing member 940 from exposure to the particulate in the fluidized bed 922, a bellows 944 extends around the shaft. A lower end portion 946 of the bellows is connected with the bearing member 940 and the lower end portion of the container 922. An upper end portion 950 of the bellows is connected with the shaft 924 and immediately beneath the mold support 926.

When the mold support 926 is lowered, the bellows 944 is contracted. Similarly, when the mold support 926 is raised, the bellows 944 is extended. The bellows 944 prevents the particulate in the fluidized bed 922 from flowing into the bearing 944 during raising and lowering of the mold support 926.

In the embodiment of the bellows illustrated in FIG. 25, the bellows has pleats formed by annular folds which extend around the bellows. It is contemplated that the bellows 944 could be formed by a flexible cloth element which would not have pleats but would merely move from an extended condition substantially free of folds to a retracted condition having randomly arranged folds. The flexible cloth element may have a construction similar to known boot seals.

In the embodiment illustrated in FIG. 25, the particulate material may tend to become packed in the folds of the bellows. When this occurs, it may be difficult to collapse the bellows 944.

In the embodiment illustrated in FIG. 26, the bellows is extended as the mold support is lowered so that packing of particulate in the folds of the bellows does not interfere with lowering of the mold support. Thus, a bellows 954 has a lower end portion 956 fixedly connected with a shaft 960. An upper end portion 962 of the bellows is fixedly connected with a container 964.

When the shaft 960 and mold support 966 are lowered, the bellows 954 expands. As this occurs, the extent of the folds in the bellows 954 decreases. The interior of the bellows 954 is connected in fluid communication with the fluidized bed 968 in the container 964. Therefore, particulate may flow from the fluidized bed 968 into the bellows.

Once the mold support 966 has been lowered, air under pressure may be conducted through an inlet 972 to the interior of the bellows. This air pressure will tend to blow the particulate out of the inside of the bellows. During subsequent use of the apparatus, the air inlet is closed.

If desired, the bellows 954, like the bellows 944 of FIG. 25, may be replaced with a flexible cloth element. The flexible element will not have pleats which define folds in a flexible wall which extends around the shaft 960.

Casting Apparatus

A casting apparatus 1030 (FIG. 27) is constructed and operated in the same general manner as was previously described in conjunction with FIGS. 1 and 2. The casting apparatus 1030 includes an upper housing 1032 and a lower housing 1034. The upper housing 1032 has a melt chamber 1038 in which a furnace assembly 1040 is disposed. The lower housing 1034 has a loading chamber 1044 in which a mold 1046 is disposed.

The mold 1046 is disposed on a movable support member 1048 which is connected with the mold 1046 in the same general manner as was previous described herein in conjunction with FIG. 9. The mold 1046 is supported above a container 1050 for an annular fluidized bed 1086. The lower housing 1034 includes a door 1054 which can be opened to provide access to the loading chamber 1044. A flapper valve or panel 1056 is pivotal to close an opening 1058 between the melt chamber 1038 and loading chamber 1044.

The furnace assembly 1040 is of the known induction type and includes an induction coil 1062. The coil is located in a surrounding relationship with a cylindrical refractory wall 1064. A cylindrical radiation liner 1066 is provided within the refractory wall 1064. A cover 1068 is advantageously provided over the upper end portion of the refractory wall 1064. Conduits 1072 and 1074 are connectable with a source of vacuum or low pressure. When the door 1054 is closed, and the flapper valve 1056 is in the open condition illustrated in FIG. 27, the conduits 1072 and 1074 are both connected to the source of low pressure to evacuate the melt chamber 1038 and lower chamber 1044. Prior to opening of the door 1054, the flapper valve 1056 is closed and the conduit 1074 is connected to atmospheric pressure. This results in the evacuated atmosphere being maintained in the melt chamber 1038 while the door 1054 is open to the atmosphere.

When the mold 1046 is to be utilized to form a cast metal article, the flapper valve 1056 is closed and the loading chamber 1044 is exhausted to atmosphere. The door 1054 to the loading chamber 1044 is then opened. The mold 1046 is positioned on the elongated mold support member 1048 in the manner illustrated in FIG. 9.

Particulate within the container 1050 is then fluidized to enable the mold 1046 to be lowered into the container 1050. Once the particulate in the container 1050 has been fluidized, a mold support drive assembly 1080 is operated to lower the mold support 1048 relative to the fluidized bed in the container 1050. This moves the mold 1046 out of the path of movement of the flapper valve 1056 between its open and closed positions. However, at this time, the flapper valve 1056 is maintained in its closed position.

The door 1054 is then sealed and the conduit 1074 is connected with a source of low pressure or vacuum to evacuate the loading chamber 1044. Once the loading chamber 1044 has been evacuated to the same pressure as the melt chamber 1038, the flapper valve 1056 is pivoted from its closed position to the open position. The mold support drive assembly 1080 is then operated to move the mold 1046 upward through the opening 1058 into the furnace assembly 1040.

Figure 27:
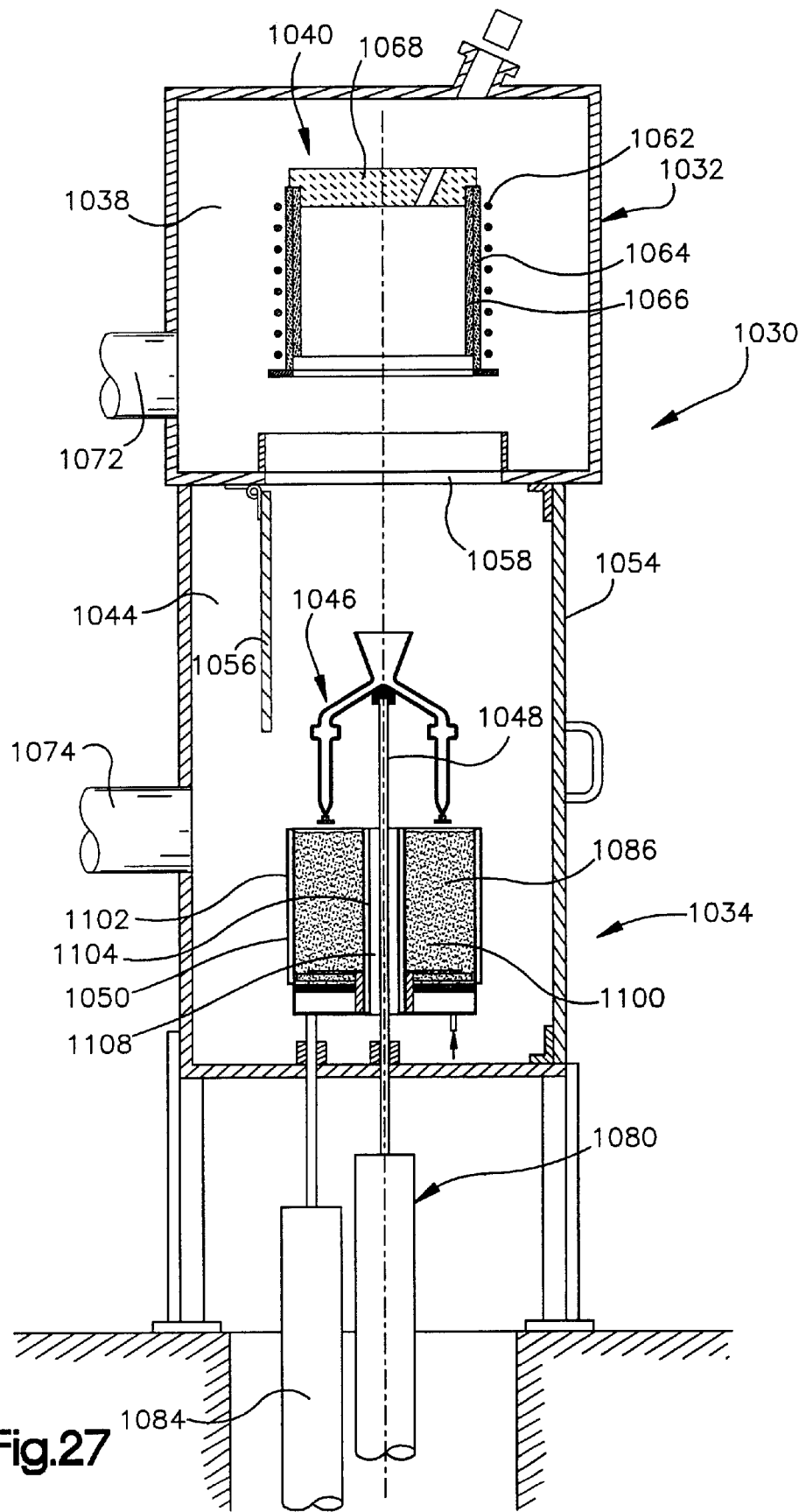
FIG. 27. is a schematic sectional view, generally similar to FIG. 1, illustrating the relationship between a furnace assembly, a mold, and a container for an annular fluidized bed.

After the mold 1046 has been moved into the furnace assembly 1040, the container 1050 is moved from the lowered position shown in FIG. 27 to a raised position disposed in the furnace assembly 1040 by operation of a container drive assembly 1084. Simultaneously with operation of the container drive assembly 1084 to raise the container 1050, the mold support drive assembly 1080 is operated to raise the mold 1046. This results in the mold 1046 moving upward with and remaining in the fluidized bed 1086.

The container drive assembly 1084 moves the container 1050 and fluidized bed 1088 to a location immediately below the furnace assembly 1040. At this time, the mold support 1048 extends through the open flapper valve 1056 and through the container 1050 to support the mold 1046 in the furnace 1040. The fluidized bed 1086 and the container 1050 is disposed immediately beneath the furnace assembly and is spaced from the mold 1046.

It is contemplated that the general manner in which the mold 1046, fluidized bed 1088, container 1050, and mold support 1048 cooperates with the furnace assembly 1040 and the upper housing 1032 and lower housing 1034 will be the same as previously described in conjunction with the embodiment illustrated in FIGS. 1 and 2. The conditions in the furnace assembly 1040 are the same as previously described in conjunction with FIGS. 1 and 2. Molten metal is poured into the mold 1046 in the manner previously described in conjunction with FIGS. 1 and 2.

It should be understood that the mold 1046 and container 1050 can be moved relative to the furnace assembly 1040 in a different manner if desired. For example, the loading chamber 1044 could be large enough to enable the flapper valve 1056 to be moved between its open and closed positions with the mold 1046 disposed above the container 1050, as illustrated in FIG. 27. If desired, the flapper valve 1056 could be constructed so as to move between its open and closed positions along a path which does not interfere with the mold 1046 when the mold is in the position shown in FIG. 27. For example, the flapper valve may move between its open and closed positions along a horizontal path.

It is contemplated that the mold 1046 may be moved into the furnace assembly 1040 before gas is conducted into the container 1050 to fluidize the particulate in the container. If this was done, the container 1050 could be moved to the raised position with the bed 1086 in a defluidized condition. The mold 1046 and container 1050 may be raised together, with the mold above the container, by effecting simultaneous operation of the mold support drive assembly 1080 and container drive assembly 1084. The bed 1086 could be fluidized, by a flow of gas into the container 1050, either before or after the container is moved from the lowered position to the raised position.

In the embodiment illustrated in FIG. 27, the container 1050 holds an annular fluidized bed 1086. The annular fluidized bed 1086 is disposed in an annular chamber 1100 in the container 1050. The annular chamber 1100 is disposed between a circular outer wall 1102 and a circular inner wall 1104 of the container 1050. The circular inner wall 1104 of the container 1050 extends around a passage 1108 extending through the container 1050 and the annular fluidized bed 1086. The mold support 1048 extends through the passage 1108. The circular inner wall 1104 of the container 1050 prevents engagement of particulate in the fluidized bed with the mold support 1048 and eliminates the need for bellows, corresponding to the bellows 944 of FIG. 25 and the bellows 954 of FIG. 26.

The circular outer wall 1102 and the circular inner wall 1104 of the container 1050 function as heat sinks. Thus, the outer wall 1102 and inner wall 1104 of the container 1050 are cooled by a flow of fluid and have the same construction as the jacket 94 of FIG. 3. The cooled outer and inner walls 1102 and 1104 of the container 1050 receive heat transferred from the mold 1046 to the fluidized 1086 when the mold is lowered from the furnace assembly 1040 into the fluidized bed. Thus, the particulate suspended in the flow of gas in the fluidized bed 1086 engages the hot outer surface of the mold 1046 and is heated by conduction and by radiation from the hot mold. The particles of the particulate engage each other in the fluidized bed 1086 and effect a transfer of heat to both the circular outer wall 1102 and the circular inner wall 1104 of the container 1050. The circular outer wall 1102 and circular inner wall 1104 of the container are cooled to promote the transfer of heat from the mold 1046 to the walls of the container.

In the embodiment illustrated in FIG. 27, the support 1048 extends through the passage 1108 and does not engage the inner wall 1104 of the container 1050. The inner wall 1104 of the container 1050 could engage the support 1048 and function as a bearing sleeve for the support. Alternatively, one or more bearing assemblies could be provided in the passage 1108 between the support 1048 and the inner wall 1104 of the container 1050.

The annular fluidized bed 1086 is formed between the outer and inner walls 1102 and 1104 of the container 1050 in the same manner as previously described in conjunction with the embodiments illustrated in FIGS. 1–9 herein. It should be understood that any of the many different features illustrated in FIGS. 1–26 may be included with the embodiment illustrated in FIG. 27 if desired. It is contemplated that various combinations of the many different features of the casting apparatus illustrated in FIGS. 1–27 may advantageously be utilized and it is not intended to exclude the use of any of the features illustrated in FIGS. 1–26 with the embodiment illustrated in FIG. 27.

Container

The container 1050 (FIG. 28) includes inner and outer walls 1102 and 1104 which cooperate to form the annular chamber 1100 in which the annular fluidized bed 1086 is disposed. In the embodiment illustrated in FIG. 28, the inner wall 1102 and outer wall 1104 are cylindrical and are disposed in a coaxial relationship with each other. However, it should be understood that the inner and outer walls 1102 and 1104 of the container 1050 could have a different configuration if desired. For example, the outer wall 1102 and the inner wall 1104 could have polygonal cross-sectional configurations. Alternatively, one of the outer and inner walls 1102 and 1104 could have a polygonal configuration while the other wall had a cylindrical configuration.

The outer and inner walls 1102 and 1104 of the container 1050 are cooled by a flow of fluid. Specifically, a flow of cold water is conducted through the outer wall 1102 of the container 1050 to cool the outer wall. Similarly, a flow of cold water is conducted through the inner wall 1104 to cool the inner wall. Of course, a different cooling liquid or even a gas could be utilized to cool the outer and inner walls 1102 and 1104 of the container 1050 if desired.

The inner wall 1104 of the container 1050 has a tubular configuration. This results in the passage 1108 extending axially through the central portion of the container 1050 in a coaxial relationship with the outer wall 1102 and inner wall 1104 of the container 1050. In the embodiment illustrated in FIG. 28, the passage 1108 has a cylindrical configuration. However, the passage 1108 could have a different configuration if desired. For example, the passage 1108 and the inner wall 1104 of the container 1050 could be formed with a polygonal cross-sectional configuration if desired.

The mold support 1048 is an elongated cylindrical rod which extends through the passage 1108 in a coaxial relationship with the outer wall 1102 and inner wall 1104 of the container 1050. In the specific embodiment illustrated in FIG. 28, nothing engages the support member 1048 as it extends through the passage 1108. However, one or more bearing arrangements could be provided to maintain the support member 1048 in a centered relationship with the container 1050. For example, a bearing assembly could be provided at a lower (as viewed in FIG. 28) end portion of the passage 1108 and extend between the support member 1048 and the inner wall 1104 of the container 1050. Similarly, a bearing assembly could be provided at an upper (as viewed in FIG. 28) end portion of the passage 1108 and extend between the inner wall 1104 of the container 1050 and the support member 1048. Alternatively, the cylindrical outer side surface of the support shaft 1048 could be disposed in a butting engagement with a cylindrical inner side surface of the inner wall 1104 of the container 1050. This would result in the inner wall 1104 of the container 1050 functioning as a bearing sleeve for the support shaft 1048.

The inner wall 1104 of the container 1050 blocks engagement of the fluidized bed 1086 with the support shaft 1048. This results in the passage 1108 being substantially free of particulate. Therefore, it is believed that it may be desired to eliminate the bellows arrangement illustrated in FIGS. 25 and 26. Of course, if desired, bellows arrangements could be provided in association with the support member 1048 and the inner wall 1104 of the container 1050. For example, a bellows arrangement could be provided between the upper (as viewed in FIG. 28) end portion of the passage 1108 and inner wall 1104 of the container 1050 and the support shaft 1048. This would have the advantage of preventing random particulate from entering the passage 1108. However, it is believed that it may be preferred to simplify the construction of the casting apparatus 1030 by eliminating the bellows arrangements illustrated in FIGS. 25 and 26.

Fluidized Bed

The fluidized bed 1086 (FIGS. 28 and 29) has a generally annular cross-sectional configuration (FIG. 29) and is disposed in the annular chamber 1100 between the circular outer wall 1102 and circular inner wall 1104 of the container 1050. Of course, if the chamber 1100 had a different cross-sectional configuration, the fluidized bed 1086 would have a different cross-sectional configuration. For example, if the annular chamber 1100 was formed by an outer wall 1102 and an inner wall 1104 having polygonal cross-sectional configurations, the annular fluidized bed 1086 would be formed as a ring with a polygonal cross-sectional configuration.

The fluidized bed 1086 is formed of particles suspended in a flow of gas. The gas may be argon. The particles may be aluminum particles 325 to 90 mesh size. Although the particles may be formed of aluminum, it is believed that it may be preferred to utilized zircon particles which have a more rounded configuration than aluminum particles. It should be understood that a gas and/or particulate other than the specific gas and/or particulate set forth herein may be utilized to form the fluidized bed 1086.

The height of the fluidized bed 1086 (FIG. 28) will vary depending upon the height of the mold 1046 in which one or more articles are to be cast. It is contemplated that the fluidized bed may have a height of between 10 and 40 inches. However, it should be understood that the height of the bed may be outside this range to accommodate a particular mold structure for the casting of a particular article.

Figure 28:
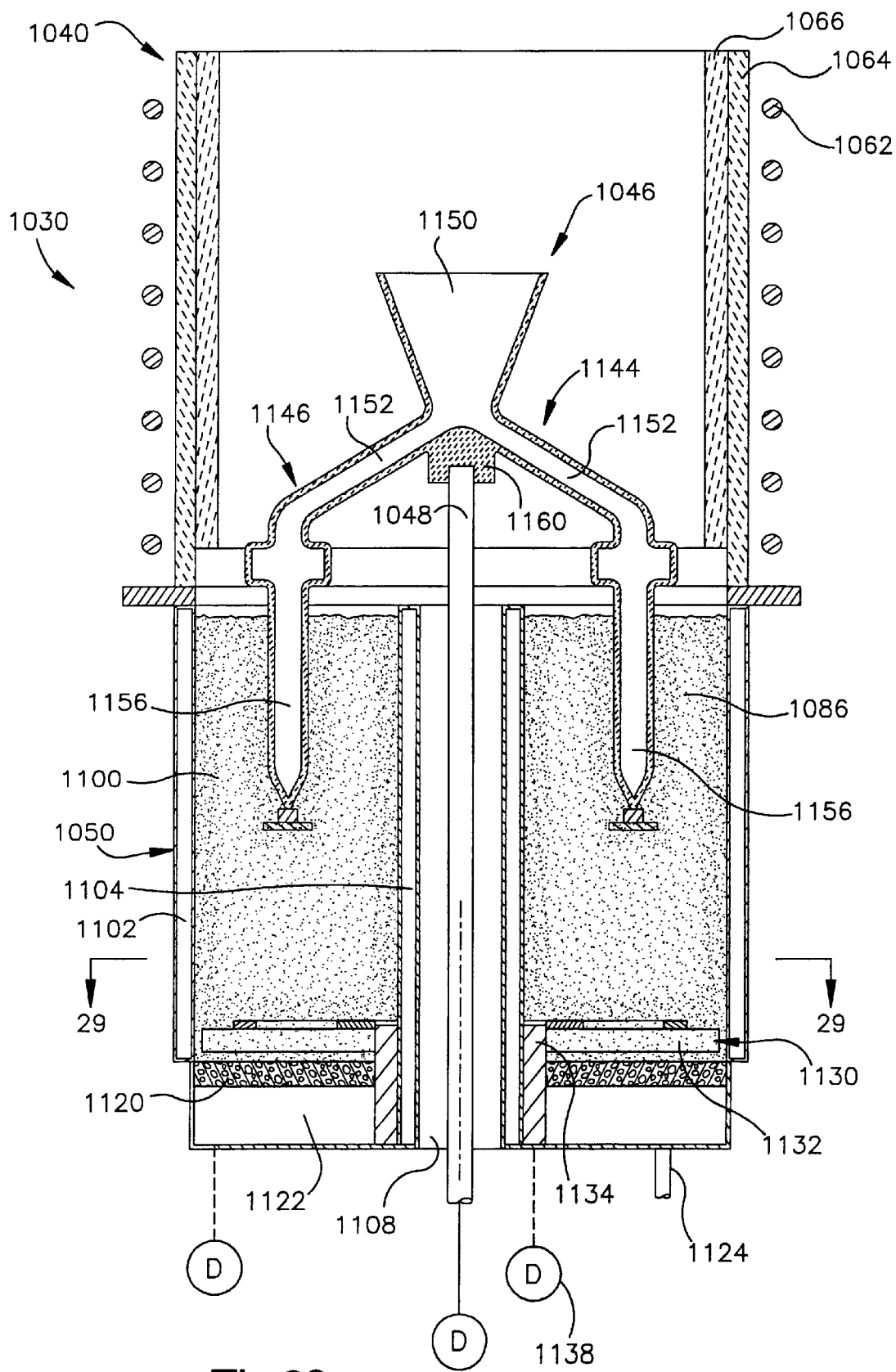
FIG. 28. is an enlarged fragmentary schematic illustration, generally similar to FIG. 3, illustrating the relationship between the furnace assembly, mold, mold support, and annular fluidized bed of FIG. 27 during movement of the mold into the fluidized bed.

Prior to fluidization of the bed 1086, particulate in the container 1050 is supported by a cylindrical porous layer 1120 (FIG. 28). When the bed 1086 is to be fluidized, gas under pressure is conducted into a plenum chamber 1122 through a conduit 1124. When a predetermined minimum pressure, which is a function of the height of the fluidized bed 1086, is obtained in the plenum chamber 1122, a flow of gas is conducted from the plenum chamber through the porous layer 1120 into the particulate. The flow of gas is effective to form the annular fluidized bed 1086. When the aforementioned bed heights of between 10 and 40 inches are utilized, the rate of gas flow from the plenum chamber 1122 into the fluidized bed may be between 5 and 100 cubic feet per hour for each square foot of a flat horizontal upper surface of the porous layer 1120.

The porous layer 1120 may be formed in many different ways, for example, the porous layer 1120 may be formed by a plurality of annular layers of screen. However, it is believed that it may be preferred to form the porous layer 1120 of an annular body of gas permeable ceramic material, such as a porous stone.

When the mold 1046 is lowered into the fluidized bed 1086, in the manner illustrated schematically in FIG. 28, the particulate suspended in the flow of gas in the fluidized bed 1086 engages both a radially outer side and a radially inner side of the annular mold 1046. The particulate in the flow of gas in the fluidized bed 1086 moves along the outer side surface of the annular mold 1046 and along the inner side surface of the annular mold. Since the particles in the fluidized bed are closely adjacent to each other and are continuously moving relative to each other in the flow of gas through the fluidized bed 1086, there is an excellent transfer of heat from the mold 1046 to the fluidized bed 1086. This transfer of heat occurs by both conduction and radiation of heat from the mold 1046 to the particulate in the fluidized bed 1086.

The heat is transferred from the particulate to the relatively cool outer wall 1102 and the relatively cool inner wall 1104 of the container 1050. Since the inner wall 1104 extends into the interior of the annular mold 1046, heat is transferred radially inward from the annular mold 1046 to the inner wall 1104. At the same time, heat is transferred radially outward from the annular mold 1046 to the outer wall 1102. This promotes a relatively uniform cooling of both radially inner and radially outer sides of the annular mold as the annular mold is lowered into the fluidized bed 1086.

Although the gas (argon) for fluidizing the particulate in the fluidized bed 1086 is conducted through the porous layer 1120, the gas could be conducted into the fluidized bed through openings in the outer wall 1102 and/or inner wall 1104 of the container 1050. The openings through which gas is directed into the fluidized bed 1086 from the outer wall 1102 and/or inner wall 1104 may be disposed at any desired level above the porous layer 1120. The openings may be constructed and supplied with gas in the same manner as previously described in conjunction with FIGS. 12–14.

The openings in the outer wall 1102 and/or inner wall 1104 may be used with the flow of gas through the porous layer 1120. Alternatively, the porous layer 1120 may be eliminated and gas for fluidizing the particulate in the fluidized bed supplied through openings in the manner illustrated in FIG. 14. In addition, gas for fluidizing the particulate may be supplied from a mold support. This may be done in the manner illustrated in FIG. 7.

Stirrer Assembly

In order to promote a more even distribution of particulate in the flow of gas through the annular fluidized bed 1086, an annular stirrer assembly 1130 (FIGS. 28 and 29) is provided in the container 1050. The stirrer assembly 1130 includes a plurality of blades or members 1132 (FIG. 29) which extend radially outward from a cylindrical collar 1134. The collar 1134 extends around the inner wall 1104 of the container 1050 and is rotatable about the central axis of the inner wall 1104 of the container 1050. The collar 1134 is disposed in a coaxial relationship with the inner wall 1104 of the container 1050 and with the mold support member 1048.

A drive assembly 1138 is connected with the stirrer members 1132 and is operable to oscillate the stirrer members along an arcuate path, through a distance of approximately 30 degrees, about the central axis of the mold support shaft 1048. The drive assembly 1138 is of the piston and cylinder type. Of course, a different type of drive assembly could be provided if desired. The drive assembly 1138 has the same general construction as the drive assembly 158 of FIG. 5.

It should be understood that the stirrer assembly 1130 could have a different construction if desired. Alternatively, the stirrer assembly 1130 could be omitted from the casting apparatus 1030 in order to simplify the construction of the casting apparatus. It is believed that it may be desired to utilize something similar to the stirrer assembly 1130 in order to promote uniform distribution of particulate in the fluidized bed 1086.

Mold Support

The mold 1046 is illustrated in FIGS. 27 and 28 as being supported in the same general manner as previously described in conjunction with the embodiment illustrated in FIG. 9. Thus, the annular mold 1046 is supported by engagement of the support member 1048 with a central portion of the mold. The annular peripheral portion of the mold is spaced from the mold support member 1048. This results in the annular peripheral portion of the mold being suspended from the central portion of the mold.

The mold 1046 has the same general construction as the mold illustrated in FIGS. 3, 4 and 9. The mold 1046 includes a central portion 1144 and a peripheral portion 1146. The central portion 1144 of the mold 1046 includes a pour cup 1150 which is connected with the peripheral portion 1146 of the mold 1046 by gating passages 1152. The gating passages 1152 extend radially outward and downward from the pour cup 1150 and connect the pour cup in fluid communication with the annular peripheral portion 1146 of the mold 1046.

A plurality of article mold cavities 1156 are disposed in an annular array and have the same construction and configuration as the article mold cavities and sections of the mold illustrated in FIG. 4. The annular peripheral portion 1146 of the mold 1046 is spaced from the inner wall 1104 of the container 1050 (FIG. 28). In addition the annular peripheral portion 1146 of the mold 1046 is spaced from the mold support member 1048. The article mold cavities 1156 are suspended from the central portion 1144 of the mold 1046.

The central portion 1144 of the mold 1046 includes a mounting section 1160 which connects the mold 1046 with a mold support shaft 1048. The mounting section 1160 is integrally formed as one piece with the remainder of the mold 1046. Thus, the mounting section 1160 is formed of ceramic mold material. The mounting section 1160 includes a socket or recess which receives the upper end portion of the mold support shaft 1048. It should be understood that the mold 1046 and shaft 1048 could be interconnected in a different manner if desired.

When the mold 1046 is to be utilized to cast metal articles in the mold cavities 1156, the mold is raised into the furnace assembly 1040 (FIG. 27) in the manner previously explained in conjunction with the embodiment of the invention illustrated in FIGS. 1–6. The mold 1046 is heated to a temperature between 2,500 degrees Fahrenheit and 3,000 degrees Fahrenheit in the furnace assembly 1040. The pressure in the melt chamber 1038 is between $6 \times 10^{-4}$ atmospheres and 1.0 atmosphere.

The container 1050 is raised to position the fluidized bed 1086 immediately beneath the furnace assembly 1040. Once the mold 1046 has been filled with molten metal, the mold is lowered into the annular fluidized bed 1086. The upper portion of the fluidized bed 1086 is exposed to the same temperature and pressure as the mold 1046 in the furnace assembly 1040.

To lower the mold 1046 into the fluidized bed 1086, the mold support shaft 1048 is lowered. As the shaft 1048 is lowered, the bottom or lower ends of the article mold cavities 1156, disposed in an annular array in the suspended peripheral portion 1146 of the mold 1046, move into the fluidized bed 1086. As this occurs, the particulate suspended in the flow of gas in the annular fluidized bed 1086 impinges against the bottom or lower end of the peripheral portion 1146 of the mold 1046. This initiates solidification of molten metal in the lower ends of the article mold cavities 1156.

As the mold 1046 is lowered into the fluidized bed 1086, the molten metal in the article mold cavities 1156 completely solidifies. The solidification of the molten metal in the article mold cavities 1156 may occur along a cellular solidification front in the manner previously explained in conjunction with the drawing of FIG. 6. Of course, the speed of lowering the mold 1046 into the annular fluidized bed 1086 could be increased so as to effect solidification of the molten metal in the article mold cavities 1156 along a dendritic solidification front.

The molten metal in the article mold cavities 1156 may be solidified with any desired crystallographic structure. Thus, the articles cast in the annular array of article mold cavities 1156 may have a single crystal, columnar grain, or equiaxed crystallographic structure.

Solidification of the molten metal in the article mold cavities 1156 with the desired crystallographic structure and along a desired solidification front, that is, along a cellular solidification front (FIG. 6) or along a dendritic solidification front, is promoted by the heat sinks formed by the liquid cooled outer wall 1102 and inner wall 1104 of the container 1050. Thus, as the annular peripheral portion 1146 of the mold 1046 is lowered into the annular fluidized bed 1086, heat is transferred radially outward from the peripheral portion 1146 of the mold to the fluidized bed 1086 and from the fluidized bed to the annular outer wall 1102 of the container 1050. At the same time, heat is transferred radially inward from the peripheral portion 1146 of the mold 1046 to the fluidized bed 1086 and from the fluidized bed to the annular inner wall 1104 of the container 1050. The combination of radially inward and radially outward heat transfer from the annular peripheral portion 1146 of the mold 1046 facilitates uniform solidification of molten metal in the article mold cavities 1156. When desired, the heat sinks 1102 and 1104 may be used to effect solidification of molten metal with a cellular solidification front in the matter previously described in connection with the drawing of FIG. 6.

It is contemplated that it may be desired to connect one or more baffles with the mold 1046 and/or container 1050. The baffle or baffles would direct a flow of gas and particulate in the fluidized bed to obtain a desired flow of particulate around the mold 1046 as the mold is lowered into the fluidized bed. If desired, the baffles could be arranged in a manner similar to the manner described in conjunction with FIGS. 20 and 21 herein. Of course, the baffle or baffles could be fixedly connected to the inside of the outer wall 1102 of the container 1050 or to the outside of the inner wall 1104, if desired.

Alternative Mold Support

Figure 29:
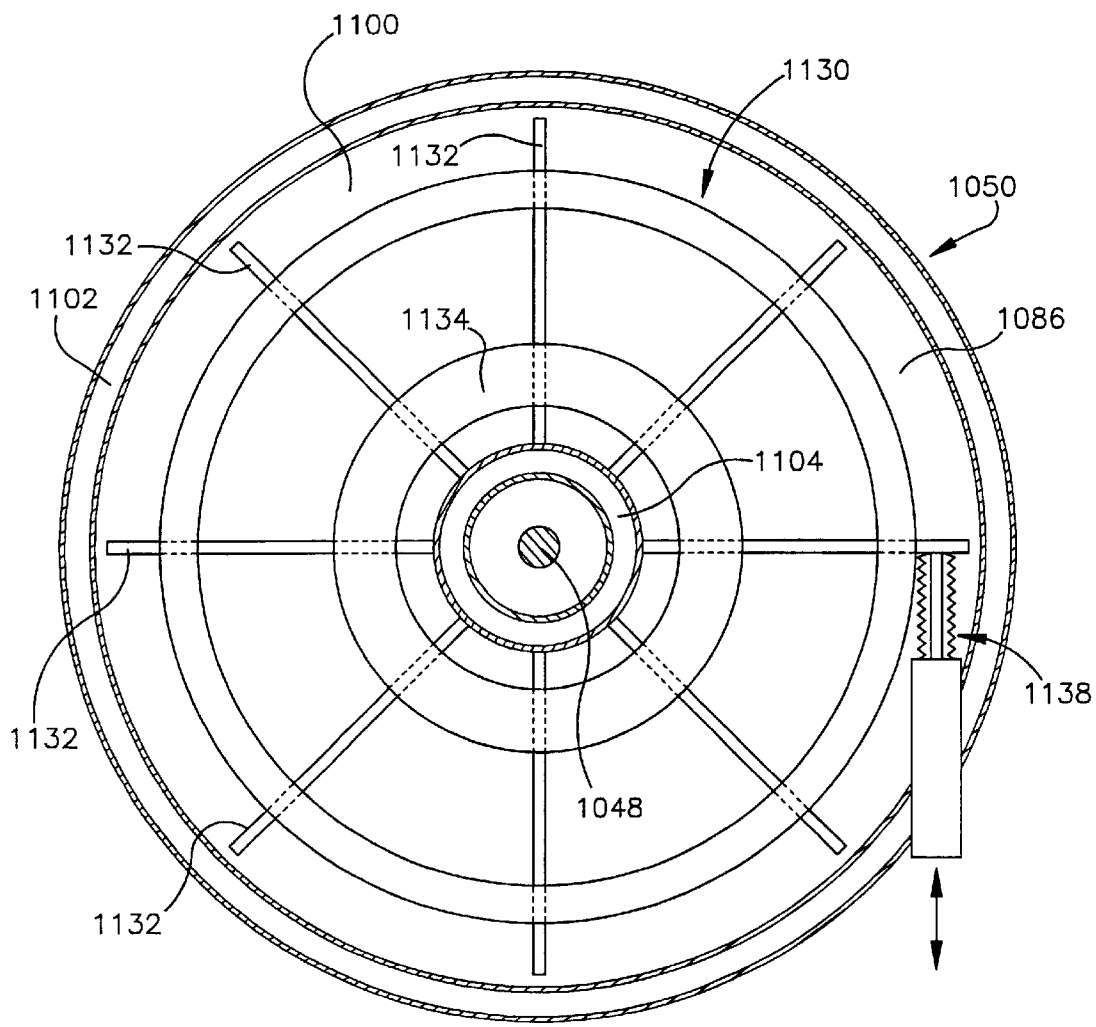
FIG. 29. is a simplified schematic view, taken generally along the line 29—29 of FIG. 28, illustrating a stirrer assembly disposed in the annular fluidized bed.
Figure 30:
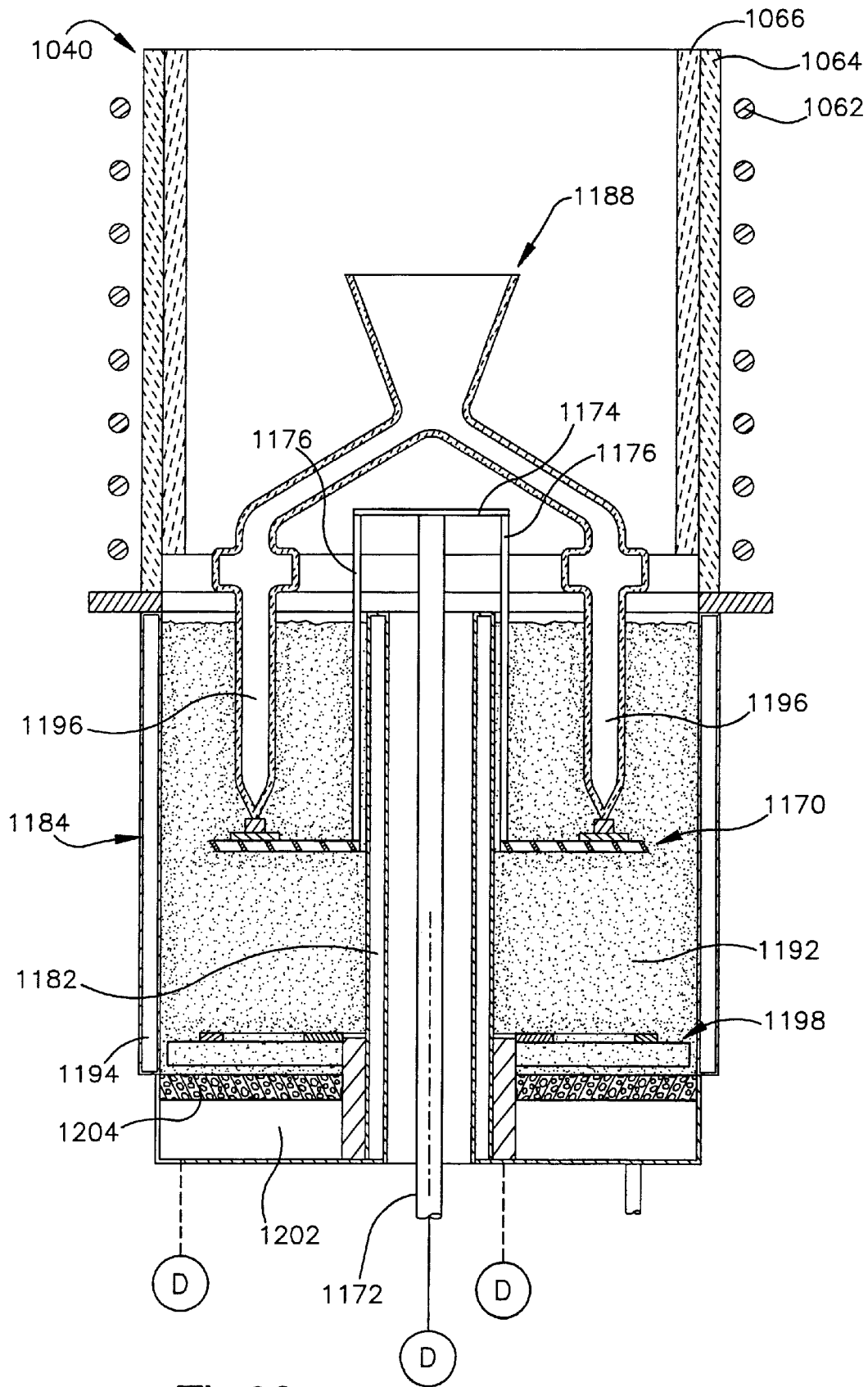
FIG. 30. is a schematic illustration depicting the manner in which a mold may be supported in an annular fluidized bed by a support assembly which extends across a central portion of a container for the annular fluidized bed.

In the embodiments of FIGS. 27–29, the mold 1046 is supported by engagement of the support member 1048 with a central portion of the mold. In the embodiment illustrated in FIG. 30, it is contemplated that the mold may be supported in the manner similar to that disclosed in FIGS. 3 and 4. Since the embodiment of FIG. 30 is generally similar to the embodiments of FIGS. 1–29, similar terminology will be utilized to designate similar components. It should be understood that any of the features of the embodiments illustrated in FIGS. 1–29 may be utilized in association the embodiment illustrated in FIG. 30.

In the embodiment illustrated in FIG. 30, an annular mold support 1170 is connected with a mold support shaft 1172. In the specific illustrated embodiment, a radially extending circular support plate 1174 is connected with an upper end of the support shaft 1172. The support plate 1174 is connected with the annular mold support 1170 by a plurality of support rods or members 1176. The support rods 1176 are spaced from and extend along a cylindrical inner wall 1182 of a container 1184.

A mold 1188 is supported on the mold support 1170. The weight of the mold 1188 and any metal in the mold is transmitted to the annular mold support 1170. Force resulting from the weight transmitted from the mold 1188 to the support 1170 is transmitted through the support rods 1176 to the support plate 1174. The force is transmitted from the support plate 1174 to the support shaft 1172.

In the embodiment illustrated in FIG. 30, the support rods 1176 are spaced from the cylindrical inner wall 1182 of the container 1184. However, it is contemplated that the support rods 1176 could slide along the outer surface of the inner wall 1182 of the container 1184 if desired. This would enable movement of the mold support 1170 to be guided by the inner wall 1182 of the container 1184.

A plurality of openings extend through the mold support 1170. The openings are formed in the mold support 1170 in the same manner as previously described in conjunction with the mold support illustrated in FIGS. 3 and 4. Of course, the mold support 1170 has an annular configuration so that the inner wall 1182 of the container 1184 can extend through the mold support.

The openings in the mold support 1170 enable gas with particulate suspended therein to flow through the mold support as the mold support is lowered into an annular fluidized bed 1192. The presence of the openings in the mold support 1170 tends to minimize resistance to movement of the mold support in the fluidized bed. The manner in which the mold support rods 1176 are connected with the mold support 1170 is generally similar to the manner previously described in conjunction with the embodiment illustrated in FIG. 15. Of course, the mold support rods 1176 are connected with the mold support 1170 at a circular opening in a central portion of the mold support rather than with a peripheral portion of the mold support.

The container 1184 has a fluid (water) cooled outer wall 1194. The cylindrical outer wall 1194 is disposed in a coaxial relationship with the cylindrical inner wall 1182 and with the support shaft 1172 for the mold 1188. The inner wall 1182 is also cooled by a flow of fluid (water). This results in the inner wall 1182 and the outer wall 1194 being heat sinks which are effective to remove heat from the particulate in the annular fluidized bed 1192 in the manner previously described in conjunction with the embodiment illustrated in FIGS. 28 and 29. Therefore, there is a relatively high rate of heat transfer both radially inward and radially outward from the annular array of article mold cavities 1196.

A stirrer assembly 1198 is disposed adjacent to the lower end portion of the annular fluidized bed 1192 to promote an even distribution of particulate in a flow of gas through the fluidized bed. A plenum chamber 1202 is disposed beneath a porous layer 1204 through which gas (argon) under pressure is conducted into the fluidized bed 1192. If desired, the plenum chamber 1202 could have annular sections or chambers which are supplied with fluid at different pressures in the manner previously described in conjunction with the embodiment illustrated in FIG. 8.

In the embodiment illustrated in FIG. 30, the mold support 1170 is an annular metal grid having a plurality of openings formed therein. However, it is contemplated that the mold support 1170 could be constructed so that it would be effective to dispense gas to promote fluidization of the bed 1192 in the manner previously described in conjunction with the embodiment of the invention illustrated in FIG. 7. A fluid discharged from the mold support 1170 may be used with the fluid discharged from the plenum chamber 1202 to effect fluidization of the bed 1192. Alternatively, the fluid discharged from the mold support 1170 may be sufficient to fluidize the bed. Of course, if desired, the mold support 1170 may have the construction illustrated in FIG. 30 so that it would not discharge fluid into the fluidized bed 1192.

Alternative Container Construction

Figure 31:
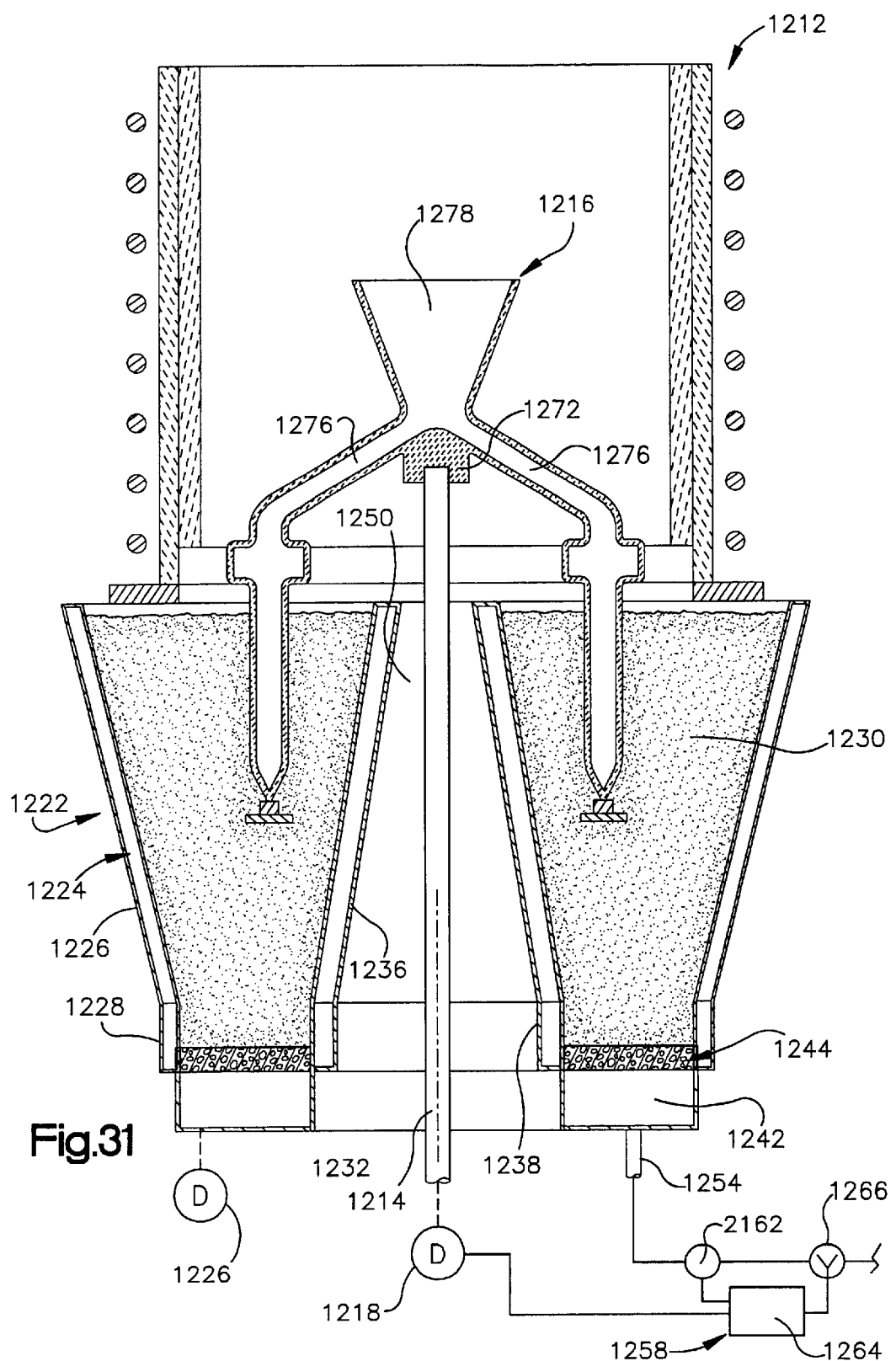
FIG. 31. is a fragmentary schematic illustration, generally similar to FIG. 10, illustrating the manner in which an outer side wall of a container for an annular fluidized bed may flare upward and outward and an inner side wall of the container for the annular fluidized bed may flare upward and inward.

In the embodiment illustration in FIGS. 28 and 30, the containers 1050 and 1184 are provided with cylindrical side walls to form an annular chamber for the fluidized bed. In the embodiment illustrated in FIG. 31, the walls of the container have a sloping configuration to enable the fluidized bed to expand in an upward direction from a lower end portion of the fluidized bed. Since the embodiment illustrated in FIG. 31 is generally similar to the embodiments illustrated in FIGS. 1–30, similar terminology will be utilized to designate similar components in the embodiment illustrated in FIG. 31. It should be understood that the features of any of the embodiments illustrated in FIGS. 1–30 may be used with the embodiment illustrated in FIG. 31.

The casting apparatus of FIG. 31 includes a furnace assembly 1212 having the same construction as the furnace assembly of FIGS. 1–3 and 27. A cylindrical mold support shaft 1214 is provided to support a mold 1216 in the same manner as is illustrated in FIGS. 9 and 28. The mold support shaft 1214 is connected with a mold support drive assembly 1218. The mold support drive assembly 1218 is operable to move the mold support shaft 1214 axially relative to the furnace assembly 1212 in the manner previously explained in conjunction with the embodiments illustrated in FIGS. 1–6, 27 and 28. It should be understood that the apparatus of FIG. 31 could have a construction which is different than the construction of the apparatus illustrated in FIGS. 1–6, 27 and 28 if desired.

A container 1222, corresponding to the container 1050 of FIG. 28, can be raised and lowered by a container drive assembly 1226. The container drive assembly 1226 has the same construction as the container drive assembly 84 of FIGS. 1–3. Although the embodiment illustrated in FIG. 31 does not have a stirrer assembly at the lower end portion of the container 1222, a stirrer assembly having the same construction as the stirrer assembly 150 of FIGS. 3 and 5 could be utilized to promote distribution of particulate in an annular fluidized bed 1230. The annular fluidized bed 1230 is formed by the suspension of particulate in a flow of gas in the same manner as previously described in conjunction with the fluidized bed 86 of FIG. 3 and the fluidized bed 298 of FIG. 10.

The container 1222 has an outer wall 1224 which slopes upward and outward from a lower end portion of the container. The outer wall 1224 has an upper portion 1226 which is formed as a frustrum of a right circular cone and a lower portion 1228 which has a generally cylindrical configuration and is coaxial with the upper portion 1226. The central axis of the outer wall 1224 is coincident with the central axis of the mold support shaft 1214 and the mold 1216. Since the upper portion 1226 of the outer wall 1224 slopes upward and outward, the cross-sectional area of the fluidized bed 1230, as viewed in a horizontal plane, increases in a direction away from the lower portion 1228 of the outer wall 1224. The general construction of the outer wall 1224 of the container 1222 is the same as was previously described in conjunction with the embodiment illustrated in FIG. 10.

In addition, the container 1222 has an inner wall 1232 which is disposed in a coaxial relationship with the outer wall 1224. The inner wall 1232 includes an upper portion 1236 which slopes upward and radially inward from a lower end portion 1238 of the inner wall 1232. The upper portion 1236 of the inner wall 1232 is formed as a frustrum of a right circular cone. The lower portion 1238 of the inner wall 1232 has a cylindrical configuration and is disposed in a coaxial relationship with the upper portion 1236 of the inner wall and in a coaxial relationship with the outer wall 1224. By having the upper portion 1236 of the inner wall 1232 sloped upward and inward, the cross-sectional area of the fluidized bed 1230, as viewed on a horizontal plane, increases in a direction away from the lower portion 1238 of the inner wall 1232.

Since the fluidized bed 1230 has a relatively small cross-section at the lower end portion of the fluidized bed, there is greater fluidization of the particulate in the lower portion of the fluidized bed than in the upper portion of the fluidized bed. This is because the speed at which the gas flows upward away from an annular porous layer 1244 at the lower portion of the container 1222 will decrease as the cross-sectional area of the container increases. This promotes a greater extent of fluidization of the particulate in the lower portion of the container 1222 than in the upper end portion of the container without boiling of the fluidized bed 1230 at the upper portion of the container 1222. The manner in which the gas and particulate moves in the upwardly expanding fluidized bed 1230 is the same as previously discussed in conjunction with the embodiment of FIG. 10. If desired, baffles may be connected with the container 1222 and/or mold 1216.

The outer wall 1224 and inner wall 1232 of the container 1222 are cooled by a flow of cooling fluid, specifically, water. This enables the outer wall 1224 and the inner wall 1232 of the container 1222 to act as heat sinks which cool the annular fluidized bed 1230 and promote transfer of heat from the mold 1216 as the mold is lowered into the fluidized bed.

A passage 1250 is formed in the container by the tubular inner wall 1232. The lower portion of the passage 1250 has a cylindrical configuration. The upper portion of the passage 1250 is coaxial with the lower portion of the passage and has a frustro conical configuration.

The mold support shaft 1214 extends through the passage 1250 and is coaxial with the passage. The mold support shaft 1214 is spaced from the inner wall 1232 of the container 1222. However, suitable bearing assemblies could be provided between the inner wall 1232 of the container 1222 and the mold support shaft 1214 to guide axial movement of the mold support shaft 1214 relative to the container 1222.

During operation of the apparatus illustrated in FIG. 31, there is a continuous flow of gas through the conduit 1254 into the plenum chamber 1242. A control apparatus 1258 is provided to maintain a desired rate of flow of gas into the plenum chamber 1242. As was previously mentioned, when the fluidized bed 1230 in the container 1222 is at a vertical height of between 10 and 40 inches, it is contemplated that the rate of flow of gas from the plenum chamber 1242 may be advantageously in a range between 5 and 100 cubic feet per hour for each square foot of a horizontal upper side surface of the porous layer 1244. The control apparatus 1258 is effective to monitor the rate of flow of gas to the plenum chamber 1242 and to maintain the desired flow rate of gas to the plenum chamber.

The control apparatus 1258 includes a gas flow measurement device 1262 which provides an output to a microprocessor 1264 indicative of the rate of flow of gas through the conduit 1254. The microprocessor 1264 is operable to control a valve 1266 to maintain a desired rate of flow of gas through the conduit 1254.

It is contemplated that it may be desired to vary the rate of flow of gas through the conduit 1254 as the mold 1216 is lowered into the fluidized bed 1230. Thus, as the mold support shaft 1214 and mold 1216 are lowered, there may be a tendency for the rate of flow of gas through the conduit 1254 to decrease as the mold 1216 restricts the flow of gas through the fluidized bed 1230. When this occurs, the gas flow measuring device 1262 provides a signal to the controller 1264 indicative of the decrease of the rate of flow of gas through the annular fluidized bed 1230. In response to this signal, the controller 1264 operates the valve 1266 to increase the rate of flow.

As the mold 1216 is lowered into the fluidized bed 1230, the particulate in the fluidized bed engages the mold and heat is transferred from the mold to the particulate. In addition, the particulate in the fluidized bed 1230 engages the fluid cooled outer side wall 1224 and the fluid cooled inner side wall 1232 of the container 1222. The relatively cool side walls 1224 and 1232 of the container 1222 function as heat sinks through which heat is transmitted as the mold 1216 moves into the fluidized bed 1230.

In order to increase the rate of heat transfer from the mold to the fluidized bed 1230, the controller 1264 may be programmed to operate the valve 1266 to increase the rate of flow of gas as the mold 1216 is lowered. To enable the controller 1264 to detect the position of the mold 1216 relative to the fluidized bed 1230, a transducer, not shown, may be connected with the mold support shaft 1214 and provide an output signal which is indicative of the position of the shaft and the mold 1216 relative to the porous layer 1244 at the lower end of the container 1222.

The output from the transducer connected with mold support shaft 1214 enables the controller 1264 to either increase or decrease the rate of flow of gas to the plenum chamber 1306 and the fluidized bed 1230 as a function of the extent to which the mold 1216 is lowered into the fluidized bed. For example, the greater the distance which the mold 1216 is lowered into the fluidized bed 1230, the greater may be the rate of gas flow through the conduit 1254 to the plenum chamber 1242 and fluidized bed. Therefore, as the mold 1216 is lowered into the fluidized bed 1230, the extent of fluidization of the bed is varied to promote the transfer of heat from the mold to the fluidized bed. The control apparatus 1258 may have a construction and mode of operation which is similar to the construction and mode of operation of the control apparatus 318 of FIG. 10.

Although the plenum chamber 1242 has a single annular compartment, it is contemplated that the plenum chamber could be divided by an annular wall to form two or more coaxial plenum chamber compartments in a manner illustrated in FIGS. 8 and 11. Gas at different pressures could be conducted to the plenum chambers. This would enable gas to flow at different rates through different portions of the porous layer 1244. By directing gas at higher pressures toward areas of the fluidized bed where the particulate tends to aggregate or become packed, uniform fluidization of the annular fluidized bed 1230 can be promoted. A control apparatus similar to the control apparatus 388, 408 and 426 of FIG. 11 may be used with the compartments of the plenum chamber.

A flow of gas and particulate in the fluidized bed 1230 may be altered by the use of one or more baffles. The baffles may be secured to the outer wall 1224 and/or the inner wall 1232 of the container 1222. The baffles may be connected with the mold 1216 for movement relative to the container 1222. The baffles may have a construction similar to the construction of the baffles described in conjunction with FIGS. 20 and 21 herein. In addition, gas outlets may be provided in the outer wall 1224 and/or inner wall 1232 of the container 1222 (see FIGS. 12–14).

In the embodiment illustrated in FIG. 31, a stirrer assembly is not provided in the lower portion of the fluidized bed adjacent to the porous layer 1244. However, if desired, a stirrer assembly having a construction similar to the stirrer assembly of FIGS. 3, 5 and 28 could be provided in the lower portion of the annular fluidized bed 1230 to promote a more even distribution of particulate and the flow of gas through the fluidized bed. A stirrer assembly would include a plurality of stirrer members which would be available along an upper surface of the porous layer 1244 by a suitable drive assembly. The stirrer assembly may be used with or without baffles and/or gas outlets on the walls 1224 and 1232 of the container 1222.

In the embodiment illustrated in FIG. 31, the mold support shaft 1214 includes a mounting section 1272 which connects the mold 1216 with the mold support shaft 1214. The mounting section 1272 is integrally formed as one piece with the remainder of the mold 1216. Thus, the mounting section 1272 is formed of ceramic mold material in the same manner as previously described herein in conjunction with FIGS. 9 and 28.

The mounting section 1272 forms a socket or recess in which an end of the mold support shaft 1214 is received. It should be understood that the mold 1216 and mold support shaft 1214 could be interconnected in a different manner if desired. For example, suitable support prongs or arms could be provided on the mold support shaft 1214 to engage the central portion of the mold in which gating passages 1276 are formed. Alternatively, a down pole from the pour cup 1278 could be received in a socket connected with the shaft 1214.

Rather than utilizing the mold support arrangement illustrated in FIG. 31, it is contemplated that any one of the mold support arrangements previously mentioned herein could be utilized to support the mold 1216 as it is moved into the annular fluidized bed 1230. For example, a mold support similar to the mold support 1048 of FIG. 3 could be utilized to support the mold as it moves into the fluidized bed 1230. Alternatively, mold 1216 could be supported by a mold support which extends over the inner wall 1232 of the container 1222 in the manner indicated schematically in FIG. 30. If the mold was supported in this manner, the mold support could be constructed in the manner shown in either FIG. 15 or FIG. 16 herein. Alternatively, the mold 1216 could be suspended in a manner similar to that illustrated in FIG. 18.

The fluidized bed 1230 has a relatively small annular lower portion and a relatively large annular upper portion. However, the fluidized bed 1230 could have a relatively large annular lower portion and a relatively small annular upper portion, if desired. This could be accomplished by constructing the container 1222 with an outer wall 1224 having a configuration similar to the outer wall 356 of the container 352 of FIG. 11. If this was done, the inner wall 1232 (FIG. 31) of the container 1222 could have the cylindrical configuration of the inner wall 1104 of the container 1050 of FIG. 28. Alternatively, the outer wall 1224 of the container 1222 could have an upward and radially inward sloping configuration and the inner wall 1232 could have an upward and radially outward sloping configuration.
Suspended Mold In the embodiment illustrated in FIGS. 28, 30 and 31, a mold support is provided at one end of a mold support shaft to support the mold. In the embodiment illustrated in FIG. 32, the mold is suspended for movement relative to a furnace and annular fluidized bed. By suspending the mold, the need for a shaft to extend through the annular fluidized bed is eliminated.

A mold 1290 (FIG. 32) is suspended by a pair of movable support members 1292 and 1294. The support members 1292 and 1294 extend through upper end portions of a furnace assembly 1298 and are movable relative to the furnace assembly to raise and lower the mold 1290. A container 1302 is disposed below the furnace assembly 1298 and holds an annular fluidized bed 1304. A container drive assembly 1306 is operable to raise and lower the container 1302 relative to the furnace assembly 1298. The container drive assembly 1306 may have any one of the constructions illustrated in FIGS. 1–3 or FIG. 17.

The annular fluidized bed 1304 is formed by suspending particulate in a flow of gas. The gas for forming the fluidized bed is connected to an annular plenum chamber 1310 through a conduit 1312. A control apparatus, similar to the control apparatus 700 of FIG. 18 and the control apparatus of FIGS. 10 and 11, is provided to control the flow of gas to the plenum chamber 1310. If desired, the plenum chamber 1310 may be divided into a plurality of annular compartments in the same general manner as previously disclosed in conjunction with FIGS. 8 and 11. Gas outlets and/or baffles may be provided in association with the container 1302 in the manner described in conjunction with FIGS. 12–14, 20 and 21.

The gas (argon) flows from the plenum chamber 1310 through a porous layer 1316 into the annular fluidized bed 1304. A stirrer assembly 1318 is disposed at a lower end portion of the annular fluidized bed 1304 and is operable to promote uniform distribution of particulate in the fluidized bed in the manner previously described in conjunction with FIGS. 3, 5 and 28. It should be understood that the stirrer assembly 1318 may be omitted if desired. The general construction of the container 1302 and the manner in which the fluidized bed 1304 is formed in the container is the same as was previously described in conjunction with the embodiment illustrated in FIG. 28.

The upwardly extending support member 1292 is connected with a drive assembly, similar to the drive assembly illustrated in FIG. 19 (on sheet 6 of the drawings). A similar drive assembly is connected with the upwardly extending support member 1294. It should be understood that the drive assemblies for the support members 1292 and 1294 could have a construction which is different than the construction illustrated in FIG. 19. For example, the drive assemblies connected with the support members 1292 and 1294 could be of the rack and pinion gear type. Alternatively, piston and cylinder type drive assemblies could be connected with the support members 1292 and 1294.

The drive assemblies for the support members 1292 and 1294 are operable to raise the mold 1290 into the furnace assembly 1298. It should be understood that the furnace assembly 1298 forms a portion of a casting apparatus having the same general construction as the casting apparatus 1030 of FIG. 27 and the casting apparatus 30 of FIG. 1. After molten metal has been poured into the mold 1290 in the furnace 1298, the drive assemblies for the support members 1292 and 1294 are operable to lower the mold 1290 into the annular fluidized bed 1304. Due to the relatively hot environment of the furnace assembly 1298, that is between 2,500 degrees Fahrenheit and 3,000 degrees Fahrenheit, the support members 692 and 694 may be formed of graphite.

Figure 32:
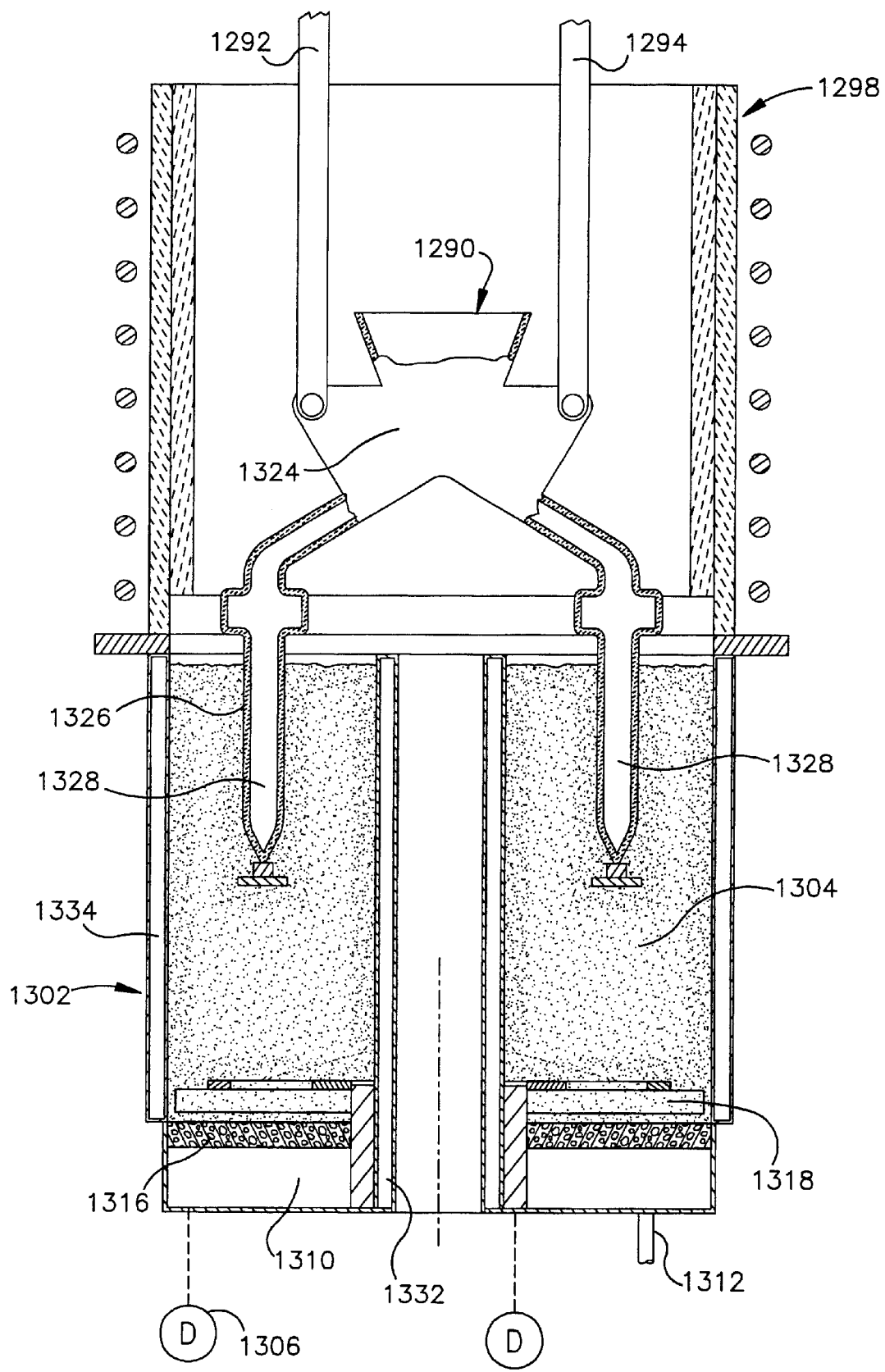
FIG. 32. is a schematic illustration, generally similar to FIG. 18, depicting the manner in which a mold may be suspended in an annular fluidized bed by upwardly extending members.

In the embodiment illustrated in FIG. 32, support members 1292 and 1294 are connected with a central portion 1324 of the mold 1290. The plurality of article mold cavities are formed in article mold sections disclosed in an annular array in a peripheral portion 1326 of the annular mold 1290. The article mold sections are spaced apart from each other and contain an annular array of article mold cavities 1328 which extend around a cylindrical inner wall 1332 of the container 1302. A cylindrical outer wall 1334 of the container 1302 extends around the annular peripheral portion 1326 of the mold 1290. When the mold 1290 is suspended in the annular fluidized bed 1304 in the manner illustrated in FIG. 32, the inner and outer walls 1332 and 1334 of the container 1302 function as heat sinks in the same manner as previously discussed in conjunction with the embodiment illustrated in FIG. 28.

Figure 33:
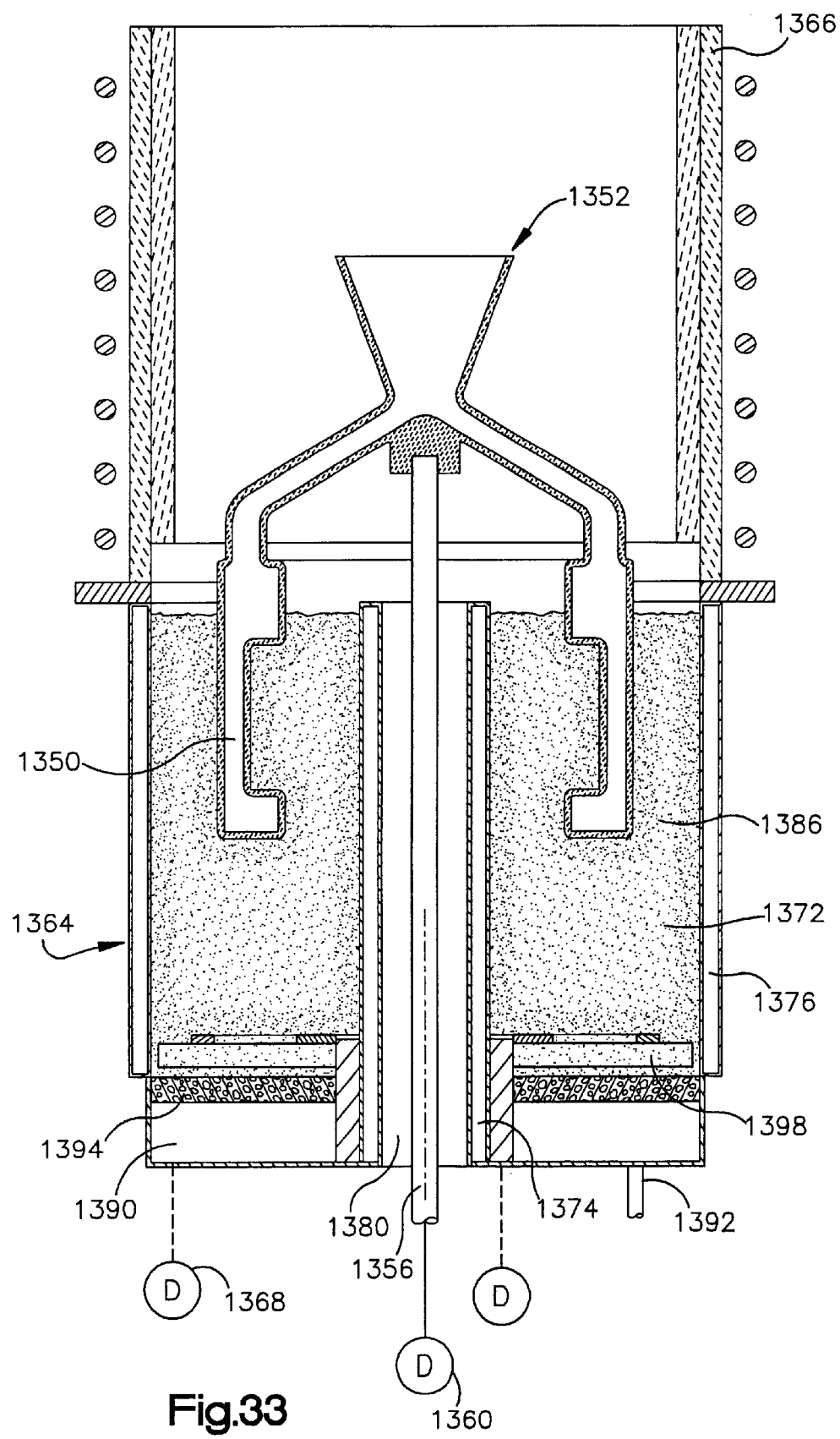
FIG. 33. is a schematic illustration depicting the relationship between a furnace assembly, annular mold, mold support, and fluidized bed, the mold support being effective to engage the central portion of a mold having an annular mold cavity.

It should be understood that a suspended mold may be used in association with any of the containers and fluidized beds disclosed herein. Thus, the container 1222 of FIG. 31 could be substituted for the container 1302 of FIG. 32. Alternatively, any one of the containers illustrated in FIGS. 3, 8, 10, 11, 14 or 15 could be utilized with the suspended mold 1290 of FIG. 32 if desired.
Casting of Annular Article In the embodiment illustrated in FIGS. 27–32, a mold for casting a plurality of articles, such as airfoils, is disclosed. Airfoils or similar articles are cast in mold cavities which may be disposed in an annular array which includes two or more mold cavities. However, it is contemplated that the mold may be constructed so as to cast an annular article in a manner illustrated schematically in FIG. 33. Since the embodiment illustrated in FIG. 33 is generally similar to the embodiments illustrated in FIGS. 1–32, similar terminology will be utilized to designate similar components. It should be understood that one or more of the features of any of the embodiments illustrated in FIGS. 1–32 may be utilized with the embodiment illustrated in FIG. 33.

An annular turbine engine component may be cast in an annular mold cavity 1350 of a mold 1352. The cast turbine engine component cast in the mold cavity 1350 has a generally cylindrical outer wall in the manner previously described in conjunction with the turbine engine component of FIG. 22. A turbine engine component cast in the mold cavity 1350 may have a thin wall portion in the same manner as previously described in conjunction with the turbine engine component of FIG. 22. However, it should be understood that the present invention may be utilized to cast annular articles other than turbine engine components.

The turbine engine component cast in the mold cavity 1350 is formed of metal. The turbine engine component may be formed of any desired metal including a nickel-chrome super alloy, titanium or a titanium alloy. The mold 1352 for the turbine engine component is formed in the manner previously described herein in conjunction with the mold of FIG. 23.

When the annular article, whether a turbine engine component or other article, is to be cast in the mold 1352, the mold is positioned on a mold support shaft 1356. The shaft 1356 is connected with a mold support drive assembly 1360. The mold support drive assembly 1360 is operable to raise and lower the mold support shaft 1356 and the mold 1352 in the same manner as previously described herein conjunction with FIGS. 1, 2 and 27. Although the mold support shaft 1356 is connected with the mold 1352 in the same manner as previously described herein in conjunction with FIGS. 10 and 31, it is contemplated that the mold could be connected with the support shaft in a different manner if desired. For example, the mold 1352 could be supported in the manner illustrated schematically in FIG. 30 herein. Alternatively, the mold 1352 could be suspended in the manner illustrated schematically in FIG. 32.

A container 1364 is raised to a position immediately below a furnace assembly 1366 of a casting apparatus having the same construction as the casting apparatus of FIGS. 1, 2 and 27, by a container drive assembly 1368. The container 1364 has the same construction as the container 1050 of FIG. 28. The container 1364 has an annular chamber 1372 disposed between a cylindrical inner wall 1374 and a cylindrical outer wall 1376. The coaxial inner and outer walls 1374 and 1376 of the container 1364 are fluid cooled, by flow of water. The container walls 1374 and 1376 function as heat sinks in the manner previously described in conjunction with the embodiments illustrated in FIGS. 28 through 32. The cylindrical inner wall 1374 extends around the mold support shaft 1356 and forms a passage 1380 for which the mold support shaft 1356 extends. Suitable bearings may be provided between the mold support shaft 1356 and the inner wall 1374 of the container 1364 to guide the mold support shaft 1356 during relative movement between the mold support shaft and the container 1364.

An annular fluidized bed 1386 is disposed in the container 1364. The fluidized bed 1386 extends around the cylindrical inner wall 1374 of the container 1364. The cylindrical outer wall 1376 of the container 1364 extends around the annular fluidized bed 1386. The inner and outer walls 1374 and 1376 of the container 1364, the fluidized bed 1386, and the mold support shaft 1356 are disposed in a coaxial relationship with each other and with the furnace assembly 1366.

Gas (argon) is supplied from an annular plenum chamber 1390 at the lower end portion of the container 1364 through a conduit 1392. The gas flows from the plenum chamber 1390 through an annular porous layer 1394 into the annular fluidized bed 1386. A stirrer assembly 1398 is disposed at a lower end portion of the fluidized bed 1386 to promote uniform distribution of particulate in the fluidized bed. If desired, the stirrer assembly 1398 may be omitted. It should also be understood that the container 1364 may have a construction similar to the construction of the container 1222 of FIG. 31 to expand the fluidized bed in an upward direction and promote greater fluidization of particulate at the lower end portion of the fluidized bed without boiling of the fluidized bed at the upper end portion of the fluidized bed.

It is contemplated that one or more baffles may be connected with the mold 1352 and/or side walls 1374 and 1376 of the container 1364, if desired. It is also contemplated that gas outlets may be provided in the side walls 1374 and 1376 of the container 1364. The baffles and gas outlets may be used in combination with each other or may be used separately.

When the mold 1352 has been filled with molten metal in the furnace 1366 in the same manner as previously described in conjunction with the embodiment illustrated in FIGS. 1–6 and FIGS. 27 and 28, the mold support drive assembly 1360 is operated to lower the mold support shaft 1356. As the mold support shaft is lowered, the mold 1352 moves into the annular fluidized bed 1386. As the mold 1352 is lowered into the annular fluidized bed, the molten metal in the mold is solidified to form an annular cast metal article, such as the turbine engine component of FIG. 22. As the mold 1352 is moved into the fluidized bed, heat is conducted radially inward and radially outward to heat links formed by the inner and outer walls 1374 and 1376 of the container 1364.

Cooling of Fluidized Bed

In the embodiments illustrated in FIGS. 1 through 33, the fluidized bed is disposed beneath and closely adjacent to the lower end portion of a furnace assembly immediately prior to movement of the mold containing molten metal into the fluidized bed and during movement of the mold into the fluidized bed (see FIGS. 2, 3, 9–11, 14, 15, 18, 21, 28 and 30–33 ). This may result in transfer of heat from the furnace assembly to the fluidized bed and heating of the upper end portion of the fluidized bed to a temperature which is greater than the temperature of the lower end portion of the fluidized bed. Of course, heat is transferred to the upper end portion of the fluidized bed as a mold containing molten metal is moved into the upper end portion of the fluidized bed.

Figure 34:
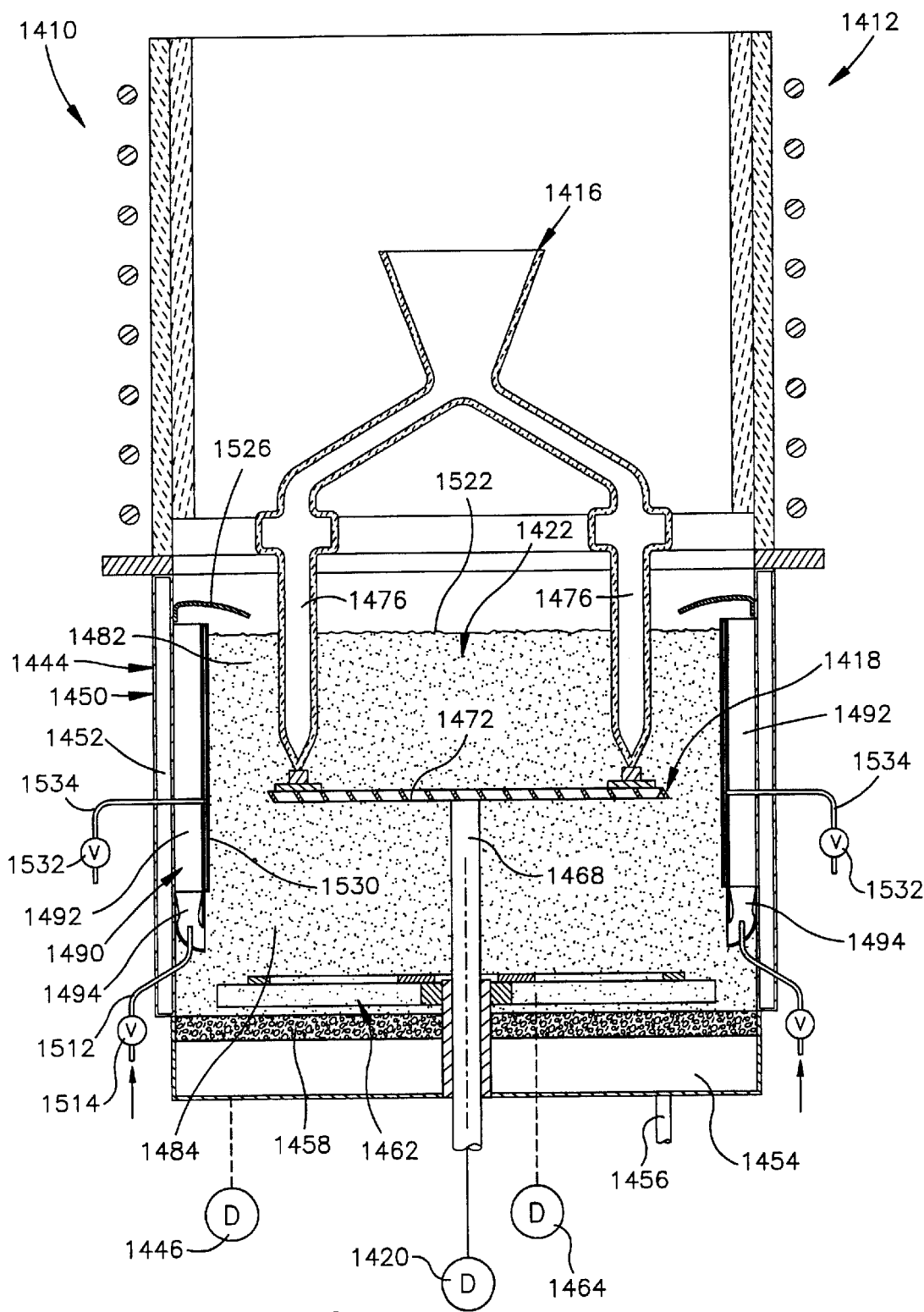
FIG. 34. is a fragmentary schematic illustration, generally similar to FIG. 3, illustrating the relationship between a furnace assembly, a mold, a fluidized bed, and an apparatus for conducting a flow of particulate suspended in gas from a lower end portion of the fluidized bed to an upper end portion of the fluidized bed.
Figure 35:
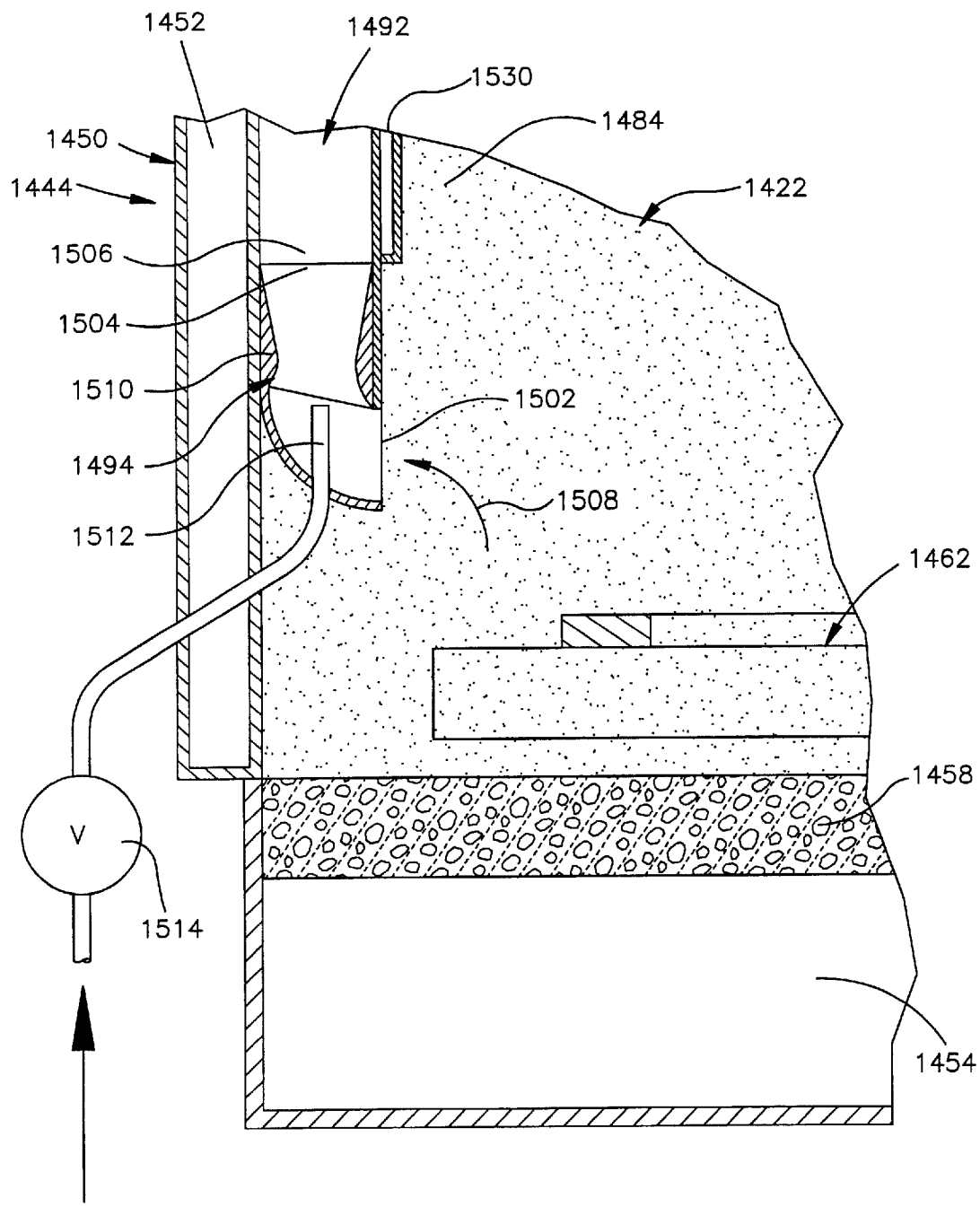
FIG. 35. is an enlarged fragmentary schematic illustration of a portion of FIG. 34 and illustrating the manner in which particulate suspended in gas is induced to flow from the lower end portion of the fluidized bed into a conduit connected in communication with the upper end portion of the fluidized bed.
Figure 36:
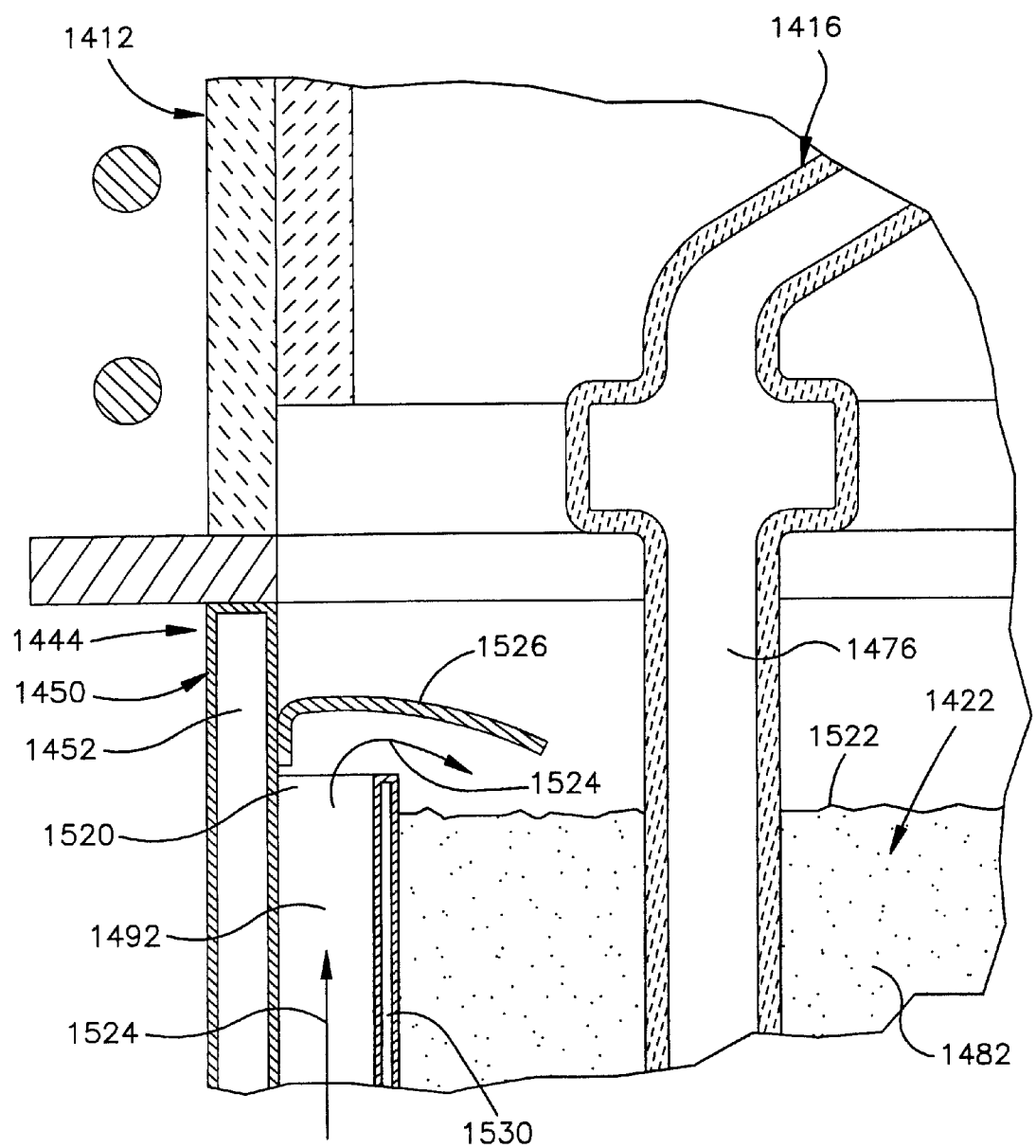
FIG. 36. is an enlarged fragmentary schematic illustration of a portion of the apparatus of FIG. 34 and illustrating the manner in which a flow of particulate suspended in gas is conducted from the conduit to the upper end portion of the fluidized bed.

In accordance with one of the features of the embodiment of the invention illustrated in FIGS. 34–36, a flow of relatively cool particulate suspended in gas is conducted between a lower end portion of a fluidized bed and an upper end portion of the fluidized bed to cool the upper end portion of the fluidized bed. Since the embodiment of the invention illustrated in FIGS. 34–36 is generally similar to the embodiments illustrated in FIGS. 1–33, similar terminology will be utilized to designate similar components. It should be understood that any of the features of the embodiments illustrated in FIGS. 1–33 may be utilized with the embodiment of the invention illustrated in FIGS. 34–36.

A casting apparatus 1410 (FIG. 34) is used with a housing assembly which includes upper and lower housings corresponding to the upper and lower housings 32 and 34 of FIGS. 1 and 2. A furnace assembly 1412 (FIG. 34) is disposed in a melt chamber in an upper housing corresponding to the upper housing 32 of FIGS. 1 and 2. The furnace assembly 1412 has the same construction and mode of operation as the furnace assembly 40 of FIGS. 1–3.

A mold 1416 is disposed on a movable mold support 1418. The mold 1416 has the same construction as the mold 46 of FIGS. 3 and 4. A mold support drive assembly 1420 is operable to raise and lower the mold 1416 and mold support 1418. The mold support 1418 and mold support drive assembly 1420 have the same construction and mode of operation as the mold support 48 and mold support drive assembly 80 of FIGS. 1–4.

A fluidized bed 1422 (FIG. 34) is disposed in a container 1444. A container drive assembly 1446 is operable to raise and lower the container 1444 and fluidized bed 1422 relative to the furnace assembly 1412. The fluidized bed 1422 is formed and utilized in the same manner as the fluidized bed 86 of FIGS. 1–3. The container 1444 may have any one of the constructions previously described herein in conjunction with FIGS. 1–26.

Particulate within the container 1444 is fluidized to enable the mold 1416 to be lowered into the container 1444. Once the particulate in the container 1444 has been fluidized, the mold support drive assembly 1420 is operated to lower the mold support 1418 and mold 1416 into the fluidized bed 1422 in the container 1444. The container drive assembly 1446 and mold support drive assembly 1420 are then operated together to raise both the container 1444 and mold 1416 to a position immediately beneath the furnace assembly (FIG. 34).

The mold support drive assembly 1420 (FIG. 34) is operated to raise the mold 1416 from the container 1444 into the furnace assembly 1412. If desired, the mold 1416 may be moved into the furnace assembly 1412 before the container 1444 is moved to the raised position disposed immediately beneath the furnace assembly in the manner illustrated in FIG. 34. The container 1444 and fluidized bed 1422 cooperate with the mold 1416 and furnace assembly 1412 in the same manner as previously described in conjunction with the embodiments illustrated in FIGS. 1–6. The mold 1416 may be moved into the furnace assembly 1412 either before or after the fluidized bed 1422 is established in the container 1444.

Once the mold 1416 has been heated to a desired temperature in the furnace assembly 1412, the mold is filled with molten metal. Although the molten metal may be any desired metal, in the specific embodiment illustrated in FIG. 34, the molten metal may be a nickel-chrome superalloy. Shortly after the mold 1416 is filled with molten metal, the mold is lowered into the fluidized bed 1422. To lower the mold 1416 into the raised fluidized bed 1422, the mold support drive assembly 1420 is operated. Operation of the mold support drive assembly 1420 lowers the mold support 1418 while the container 1444 is stationary relative to the furnace assembly 1412.

The container 1444 (FIG. 34) has a cylindrical side wall 1450. The side wall 1450 of the container 1444 includes a water cooling passage or jacket 1452 which functions as a heat sink. The cooling jacket 1452 extends completely around the container 1444 and cools the fluidized bed 1422. The container 1444 may have any one of the constructions previously described herein. For example, the container 1444 may have the construction illustrated in FIG. 10 or 11 if desired.

The fluidized bed 1422 is formed of particles suspended in a flow of gas. The gas may be argon. The particles may be alumina particles of 325 to 90 mesh size. Although the particles may be formed of alumina, it is believed that is may be preferred to utilize zircon particles which have a more rounded configuration. It should be understood that a gas and/or particulate other than the specific gas and/or particulate set forth herein may be used to form the fluidized bed 1422. The manner in which the fluidized bed 1422 is established and the size of the fluidized bed is the same as previously described herein in conjunction with the fluidized bed 86 of FIG. 3. However, it is contemplated that the fluidized bed 1422 may be established in many different ways and have many different sizes.

To fluidized particles in the container 1444, gas is conducted to a cylindrical plenum chamber 1454 (FIG. 34) through a conduit 1456. The flow of gas from the plenum chamber 1454 is effective to form the fluidized bed 1422 in the same manner as previously described in conjunction with the embodiment illustrated in FIGS. 1–6. A circular porous layer 1458 is provided between the plenum 1454 and the fluidized bed 1422.

When the bed 1422 is to be fluidized, gas, such as argon, is conducted under pressure from the plenum chamber 1454 through the porous layer 1458. The manner in which this is accomplished is the same as was previously described in conjunction with FIGS. 1–6.

A stirrer assembly 1462 (FIG. 34) is provided adjacent to the upper side of the porous layer 1458. The stirrer assembly 1462 has the same construction and manner of operation as the stirrer assembly 150 of FIGS. 3 and 5. A drive assembly 1464 is connected with the stirrer assembly 1462 and is operable to oscillate stirrer members along an arcuate path in the same manner as previously described in conjunction with the drive assembly 158 of FIGS. 3 and 5. It should be understood that the stirrer assembly 1462 could have a different construction or could be omitted if desired.

The mold support 1418 (FIG. 34) is disposed on a shaft 1468 connected with the mold support drive assembly 1420. The cylindrical shaft 1468 has a longitudinal central axis which is coincident with a central axis of the container 1444 and with the furnace assembly 1412. The mold support 1418 includes a circular support member 1472 in which a plurality of generally rectangular openings are formed. The perforated support 1472 may be formed by an expanded metal grid. However, the mold support member 1472 may have a different construction as desired. The manner in which the mold support member 1472 supports the mold 1416 is the same as previously explained in conjunction with the embodiment of the invention illustrated in FIGS. 3 and 4.

Although the mold 1416 has been illustrated in FIG. 34 as being supported on the perforated support 1418, the mold may be supported in a different manner if desired. For example, the mold 1416 may be supported by engagement of a support member, such as the shaft 1468, with a central portion of the mold in the manner illustrated in FIG. 9. Alternatively, the mold 1416 may be suspended in the manner illustrated in FIG. 18.

As the mold 1416 (FIG. 34) is moved into the fluidized bed 1422, molten metal in the mold solidifies. Due to rapid cooling of the portion of the mold which becomes immersed in fluidized bed 1422, a generally horizontal line of solidification occurs across a plurality of article mold cavities 1476 disposed in the mold 1416. The horizontal solidification front results in directional solidification of the molten metal in the article mold cavities 1476. The molten metal solidifies upward from the lower ends of the article mold cavities to a gating passage in a central portion of the mold 1416 as the mold is lowered into the fluidized bed.

The molten metal in the article mold cavities 1476 may solidify with a single crystal grain structure, a columnar grain structure or an equiaxed grain structure. The particular type of grain structure which is obtained will depend upon many different factors, including the composition of the molten metal in the mold 1416, the configuration of the mold, the rate of movement of the mold into the fluidized bed 1422, and whether or not a single crystal selector is provided in association with the mold. It should be understood that the casting apparatus 1410 may be utilized in conjunction with the casting of many different types of articles in many different types of molds. The molten metal may solidify in any one of these molds with any one of many known crystallographic structures. It is believed that it may be desired to have the molten metal solidify in the mold 1416 in the same manner as previously explained in conjunction with FIG. 6 and the mold of FIGS. 1–3.

In accordance with one of the features of the embodiment of the invention illustrated in FIG. 34, an upper end portion 1482 of the fluidized bed 1422 is cooled. In the embodiment of the invention illustrated in FIG. 34, the upper end portion 1482 of the fluidized bed 1422 is cooled by conducting a flow of relatively cool particulate suspended in gas from a lower end portion 1484 of the fluidized bed 1422 to the upper end portion 1482 of the fluidized bed. However, the upper end portion 1482 of the fluidized bed 1422 may be cooled in a different manner if desired.

The upper end portion 1482 (FIG. 34) of the fluidized bed 1422 tends to be hotter than the lower end portion 1484 of the fluidized bed. This is because the upper end portion 1482 of the fluidized bed 1422 is disposed relatively close to the furnace assembly 1412. The interior of the furnace assembly 1412 is at a relatively high temperature. In addition, the mold 1416, containing molten metal, is moved directly from the furnace assembly 1412 into the upper end portion 1482 of the fluidized bed 1422.

The lower end portion 1484 of the fluidized bed 1422 is at a relatively low temperature since it is spaced from the furnace assembly 1412. The lower end portion 1484 of the fluidized bed is also cooler because the mold 1416 and metal therein cools before being moved into the lower end portion of the fluidized bed. By conducting a flow of relatively cool particulate suspended in gas between the lower end portion 1484 of the fluidized bed 1422 and the upper end portion 1482 of the fluidized bed, the temperature of the upper end portion of the fluidized bed is reduced.

By reducing the temperature of the upper end portion 1482 of the fluidized bed, the temperature differential between molten metal in an article mold cavity 1476 in the mold 1416 and the upper end portion of the fluidized bed 1422 is maximized. By maximizing the temperature differential between the article mold cavity 1476 and the upper end portion 1482 the fluidized bed 1422, the speed of withdrawal of the mold 1416 from the furnace assembly 1412 can be increased. In addition, the obtaining of a casting with a fine dendritic structure is facilitated.

A fluidized bed cooling apparatus 1490 (FIG. 34) includes a conduit 1492 which extends between the lower end portion 1484 and the upper end portion 1482 of the fluidized bed. A pump 1494 is connected in fluid communication with the lower end portion 1484 of the fluidized bed 1422 and the conduit 1492. The pump 1494 is operable to induce a flow of particulate suspended in gas between the lower end portion 1484 of the fluidized bed 1422 and the upper end portion 1482 of the fluidized bed through the conduit 1492. Heat is transmitted to the cooling jacket 1452 from the flow of particulate suspended in gas in the conduit 1492. The conduit 1492 maintains the flow of particulate from the lower end portion 1484 of the fluidized bed 1422 separate from the particulate in the fluidized bed.

Although only a pair of pumps 1494 and conduits 1492 have been illustrated schematically in FIG. 34, it should be understood that a greater or lesser numbers of pumps and conduits may be provided in the fluidized bed cooling apparatus 1490. For example, an annular array of conduits 1492 may be disposed around the fluidized bed 1422. A pump 1494 may be connected with each of the conduits 1492 in the annular array of conduits. Alternatively, a single pump 1494 may be connected with a plurality of conduits 1492.

Although the conduits 1492 and pumps 1494 have been illustrated schematically in FIG. 34 as being disposed between the side wall 1450 of the container 1444 and the fluidized bed 1422, it is contemplated that the conduits and pumps may be disposed outside of the side wall 1450 of the container 1444. With such an arrangement, the pumps 1494 would be connected in fluid communication with the lower end portion 1484 of the fluidized bed 1422 through the side wall 1450 of the container 1444. Similarly, the conduits 1492 would be connected in fluid communication with the upper end portion 1482 of the fluidized bed 1422 through the side wall 1450 of the container 1444.

It is also contemplated that the conduits 1492 may be located within the cooling jacket 1452. If this is done, the pumps 1494 may be located either within the cooling jacket 1452 or within the fluidized bed 1422. By positioning the conduits 1492 in the cooling jacket 1452, the flow of liquid coolant (water) in the cooling jacket 1452 may be more effective in cooling the particulate and gas conducted through the conduit 1492 from the lower end portion 1484 of the fluidized bed 1422 to the upper end portion 1482 of the fluidized bed.

The pump 1494 (FIG. 35) has an inlet 1502 which is exposed to the lower end portion 1484 of the fluidized bed 1422. The pump 1494 has an outlet 1504 which is connected in fluid communication with an inlet 1506 to the conduit 1492. The pump 1494 is effective to induce a flow of particulate suspended in gas from the lower end portion 1484 of the fluidized bed 1422 into the conduit 1492. The flow of particulate suspended in gas from the container 1444 into the pump 1494 has been indicated schematically by an arrow 1508 in FIG. 35.

The pump 1494 is of the fluid ejector type. The pump 1494 is effective to aspirate a flow 1508 of particulate suspended in gas from the lower end portion 1484 of the fluidized bed 1422. The flow 1508 particulate suspended in gas aspirated into the pump 1494 flows through the conduit 1492 to the upper end portion 1482 of the fluidized bed 1422.

The pump 1494 includes a convergent—divergent venturi nozzle or diffuser 1510 (FIG. 35) into which a flow of transport gas under pressure is directed from a conduit 1512. The flow of high pressure gas from the conduit 1512 into the nozzle 1510 causes the gas to accelerate with a resulting reduction in pressure. This pressure reduction induces a flow of particulate suspended in gas from the lower portion 1484 of the fluidized bed 1422 into the pump 1494 with an aspirating action. The pressure of the transport gas conducted through the conduit 1512 is substantially greater than the fluid pressure in the lower end portion 1484 of the fluidized bed 1422.

The pump 1494 may have a construction and/or mode of operation similar to the construction and/or mode of operation of the pumps disclosed in U.S. Pat. Nos. 2,790,595; 3,659,962; 6,017,195; and/or 6,450,775. Although it is believed that an ejector type pump may advantageously be utilized due to its simple construction and lack of moving parts, other known types of pumps may be utilized if desired. For example, a rotary vane type pump may be substituted for the pump 1494 if desired.

The conduit 1512 (FIG. 35) is connected with a source of transport gas (argon) under pressure. A valve 1514 is operable to control the rate of flow of transport gas (argon) through the conduit 1512. An actuator (not shown) for the valve 1514 may be connected with a computer having an input from a temperature sensor. The temperature sensor is exposed to the upper end portion 1482 of the fluidized bed 1422. The temperature sensor is effective to sense the temperature of the upper end portion 1482 of the fluidized bed.

When the temperature of the upper end portion 1482 of the fluidized bed 1422 exceeds a predetermined temperature, the computer effects operation of an actuator connected with the valve 1514 (FIG. 35) to open the valve and initiate operation of the pump 1494. The pump 1494 is then effective to pump a flow 1508 of particulate suspended in gas from the lower end portion 1484 of the fluidized bed 1422 through the conduit 1492 to the upper end portion 1482 of the fluidized bed. Since the temperature of the lower end portion 1484 of the fluidized bed 1422 is usually lower than the temperature of the upper end portion 1482 of the fluidized bed, the flow 1508 of particulate suspended in gas from the lower end portion 1484 of the fluidized bed 1422 to the upper end portion 1482 of the fluidized bed is effective to lower the temperature of the upper end portion of the fluidized bed.

Rather than effecting operation of the pump 149 when the temperature of the upper end portion 1482 of the fluidized bed 1422 exceeds a predetermined temperature, the computer may initiate operation of the pump 1494 in response to establishment of a predetermined temperature differential between the upper end portion 1482 and lower end portion 1484 of fluized bed. If this is done, one temperature sensor would be exposed to the upper end portion 1482 of the fluidized bed and a second temperature sensor would be exposed to the lower end portion 1484 of the fluidized bed. The two temperature sensors would be connected with the computer.

When a temperature differential between the upper and lower end portions 1482 and 1484 of the fluidized bed 1422 exceeds a predetermined amount, the computer effects operation of the actuator connected with the valve 1514 (FIG. 35) to open the valve and initiate operation of the pump 1494. The pump 1494 is then effective to pump a flow 1508 of particulate suspended in gas from the lower end portion 1484 of the fluidized bed 1422 through the conduit 1492 to the upper end portion 1482 of the fluidized bed. The flow of relatively cool particulate from the lower end portion 1484 of the fluidized bed 1422 is effective to cool the upper end portion 1482 of the fluidized bed. Depending upon the rate of heat transfer to the upper end portions 1482 of the fluidized bed 1422, this may reduce the temperature of the upper end portion of the fluidized bed.

The conduit 1492 extends along the side wall 1450 of the container 1444 to an outlet 1520 (FIG. 36) which is disposed above an upper surface 1522 of the fluidized bed 1422. The flow of particulate suspended in gas is conducted from the pump 1494 (FIG. 35) through the conduit 1492 to an outlet 1520 (FIG. 36) from the conduit. The flow of particulate suspended in gas from the conduit 1492 has been indicated schematically by arrows 1524 in FIG. 36. The conduit 1492 is effective to separate the flow of particulate in the conduit from the particulate in the fluidized bed 1422.

The flow 1524 of particulate suspended in gas from the outlet 1520 is deflected by a baffle 1526. The baffle 1526 extends radially inward from and is fixedly secured to the cylindrical side wall 1450 of the container 1444. The baffle 1526 extends across the outlet 1520 from the conduit 1492. The baffle 1526 is effective to direct the flow 1524 of particulate suspended in gas from the conduit 1492 toward the upper surface 1522 of the fluidized bed 1422 and toward the mold 1416.

The baffle 1526 is effective to direct the flow of particulate suspended in gas conducted through the conduit 1492 toward the upper surface 1522 of the fluidized bed 1422 at a location spaced from the mold 1416. The flow 1524 of particulate suspended in gas from the conduit 1492 does not impinge directly against the mold 1416. However, if desired, the baffle 1526 could be configured in such a manner as to direct the flow of particulate suspended in gas from the conduit 1492 against an outer side surface of the mold 1416.

If there is a series of spaced apart conduits 1492, a plurality of separate baffles 1526 may be connected with the side wall 1450 of the container 1444 at spaced apart locations along the side wall of the container. When this is done, each of the baffles 1526 would be disposed directly over the outlet 1520 from one of a plurality of conduits 1492. When there is an annular array of conduits 1492 disposed in a side-by-side relationship about the interior of the cylindrical side wall 1452 of the container 1444, a single annular baffle 1526 may be provided. This annular baffle would extend across the outlets from all of the conduits 1492 in the annular array of conduits. The annular baffle would be disposed in a coaxial relationship with the container 1444.

When there is an annular array of conduits 1492 and pumps 1494 disposed along the side wall 1450 of the container 1444, the pumps for some of the conduits may be operated while the pumps for other conduits are not being operated. This would result in a flow of particulate suspended in gas from some of the conduits 1492 while there would be no flow of particulate suspended in gas from other conduits. By varying the number of conduits 1492 through which a flow of particulate suspended in gas is conducted from the lower end portion 1484 (FIG. 34) of the fluidized bed 1422 to the upper end portion 1482 of the fluidized bed, the rate of cooling of the upper end portion 1482 of the fluidized bed can be varied.

It is contemplated that a thermocouple or other temperature sensor may be utilized to provide a control signal indicative of the temperature of the upper end portion of the fluidized bed 1422. A computer responds to the output from the temperature sensor to vary the number of pumps 1494 which are operated as a function of the temperature of the upper end portion 1482 of the fluidized bed 1422. The higher the temperature of the upper portion of the fluidized bed, the greater would be the number of pumps 1494 which are operated by the computer.

It is also contemplated that one thermocouple or other temperature sensor may be utilized to sense the temperature of the upper end portion 1482 of the fluidized bed 1422 and a second thermocouple or other temperature sensor may be used to sense the temperature of the lower end portion 1484 of the fluidized bed. The outputs from the two temperature sensors are transmitted to a computer. The computer determines when a predetermined temperature differential exists between the temperature of the lower end portion 1484 and the upper end portion 1482 of the fluidized bed. When the predetermined temperature differential exists or is exceeded, the computer effects operation of the pump 1494 to pump relatively cool particulate suspended in gas from the lower end portion 1484 of the fluidized bed 1422 to the upper end portion 1482 of the fluidized bed.

Although the flow of particulate suspended in gas from the lower end portion 1484 (FIG. 34) of the fluidized bed is relatively cool, it may be desired to cool the flow of particulate suspended in gas as it is conducted through the conduit 1492. To cool the particulate material suspended in a flow of gas as it is conducted through the conduit 1492, a cooling jacket 1530 (FIGS. 34–36) may be provided in association with the conduit 1492. A valve 1532 is operable to control a flow of cooling liquid (water) through a conduit 1534 to the cooling jacket 1530 (FIG. 34).

The cooling jacket 1530 is disposed between the conduit 1492 and the fluidized bed 1422. Therefore, the cooling jacket 1530 is effective to insulate a relatively cool flow of particulate suspended in gas from the lower end portion 1484 of the fluidized bed from the relatively hot upper portion of the fluidized bed as the flow of particulate suspended in gas is conducted through the conduit 1492.

It is contemplated that the cooling jacket 1530 may have any one of many different configurations. For example, the cooling jacket 1530 may be formed by a pipe or conduit connected with the conduit 1492 and extend over only a portion of the periphery of the conduit 1492. If this is done, the pipe or conduit forming the cooling jacket 1530 may have a series of U-shaped segments which extend in zigzag fashion along the surface of a plurality of conduits 1492 connected with the side wall 1450 of the container 1444. Alternatively, the cooling jacket 1530 may have a configuration corresponding to the configuration of the conduit 1492 and extend across the portion of the conduit 1492 which is disposed adjacent to the fluidized bed 1422. When there is a series of adjacent conduits 1492 disposed along the side wall 1450 of the container 1444, the cooling jacket 1530 may have a cylindrical configuration and be disposed in a coaxial relationship with the cylindrical outer cooling jacket 1452.

If the conduits 1492 are disposed in the cooling jacket 1452, the use of a separate cooling jacket 1530 for the conduits 1492 may be omitted. If the conduits 1492 are disposed on the outside of the side wall 1450 of the container 1444, a separate cooling jacket, corresponding to the cooling jacket 1530 may be provided for the conduits 1492. If this is done, the conduits 1492 would be disposed between the cooling jacket 1452 and an outer cooling jacket corresponding to the cooling jacket 1530. Alternatively, when the conduits 1492 are disposed outside of the side wall 1450 of the container 1444, the use of a separate cooling jacket, corresponding to the cooling jacket 1530, may be omitted.

It is contemplated that the relatively hot particulate suspended in a flow of gas may be conducted from the upper end portion 1482 of the fluidized bed 1422 to the lower end portion 1484 of the fluidized bed. This would result in upward movement, in the fluidized bed 1422, of the relatively cool particulate suspended in a flow of gas. The relatively cool particulate would move upward from the lower end portion 1484 of the fluidized bed 1422 to the upper end portion 1482 of the fluidized bed as the relatively cool particulate is displaced by a flow of relatively hot particulate from the upper end portion of the fluidized bed.

The flow of relatively hot particulate suspended in a flow of gas conducted from the upper end portion 1482 of the fluidized bed 1422 to the lower end portion 1484 of the fluidized bed would cause the relatively cool particulate suspended in a flow of gas in the lower portion of the fluidized bed to circulate in an upward direction in the fluidized bed. In addition, there would be a mixing of the flow of relatively hot particulate suspended in a flow of gas from the upper end portion 1482 of the fluidized bed 1422 with the relatively cool particulate suspended in a flow of gas in the lower portion 1484 of the fluidized bed. This upward movement of relatively cool particulate from the lower end portion 1484 of the fluidized bed toward the upper end portion 1482 of the fluidized bed would be promoted by the flow of gas through the porous layer 1458 (FIG. 34).

When a flow of relatively hot particulate suspended in gas is to be conducted from the upper end portion 1482 of the fluidized bed 1422 to the lower end portion 1484 of the fluidized bed, the orientation of the fluidized bed cooling apparatus 1490 would be changed by one hundred and eighty degrees from the orientation illustrated in FIG. 34. The pump 1494 would be positioned adjacent to the upper end portion 1482 of the fluidized bed at a level below the upper surface 1522 of the fluidized bed. The conduit 1492 would extend downward from the pump 1494 to the lower end portion 1484 of the fluidized bed.

The outlet 1520 (FIG. 36) from the conduit 1492 would be located at a level above the stirrer assembly 1462. The baffle 1526 would be disposed below the outlet 1520 from the conduit 1492. The baffle 1526 would direct a flow of relatively hot particulate suspended in gas upward and toward a central portion of the lower end portion 1484 of the fluidized bed 1422.

By using the pump 1494 to induce a flow of relatively hot particulate suspended in gas from the upper end portion 1482 to the lower end portion 1484 of the fluidized bed 1422, turbulence adjacent to the upper surface 1522 of the fluidized bed 1422 tends to be minimized. At the same time, mixing of the particulate with the flow of gas from the plenum chamber 1454 in the lower portion 1484 of the fluidized bed 1422 tends to be maximized. The flow of hot particulate suspended in gas and conducted downward through the conduit 1492 may be cooled by a cooling jacket corresponding to the cooling jacket 1530. The pump 1494 may be a rotary vane or gear pump.

In the embodiment of the invention illustrated in FIGS. 34–36, the fluidized bed cooling apparatus 1490 is utilized in association with a casting apparatus 1410 which may have the same general construction or mode of operation as any one of the embodiments of the casting apparatus illustrated in FIGS. 1 through 26. It should be understood that any of the features of the embodiments of the invention illustrated in FIGS. 1 through 26 may be utilized with the casting apparatus 1410 of FIG. 34. For example, the plenum chamber 1454 may be supplied with gas at different pressures to obtain different flow rates through different portions of the porous layer 1458 in the manner previously described in conjunction with the embodiments of the invention illustrated in FIGS. 8 and 11.

If desired, gas for fluidizing the particulate may be supplied to the side and/or bottom walls of the container 1444 in the manner previously described in conjunction with the embodiments of the invention illustrated in FIGS. 12 through 14. It may be particularly advantageous to direct a flow of cool gas through the sidewall 1450 at the lower end portion 1484 of the fluidized bed 1422 when the hot particulate is conducted from the upper end portion 1482 of the fluidized bed to the lower end portion of the fluidized bed.

It is contemplated that baffles may advantageously be provided in association with the container 1444 and fluidized bed 1422 to direct the flow of particulate suspended in gas in the fluidized bed either toward or away from one or more portions of the mold 1416. The baffles may be connected with the mold support 1418 in the manner illustrated schematically in FIG. 20. However, the baffles may be connected with the side wall 1450 of the container 1444. The baffles may be supported on struts which extend into the fluidized bed from the side wall 1450 of the container. Of course, the baffles may be connected with the mold 1416 in the manner previously described in conjunction with the embodiment of the invention illustrated in FIG. 21. It should be understood that any of the features of the embodiments previously described herein may be utilized in association with the embodiment of the invention illustrated FIGS. 34–36.

Annular Fluidized Bed With Cooling

Figure 37:
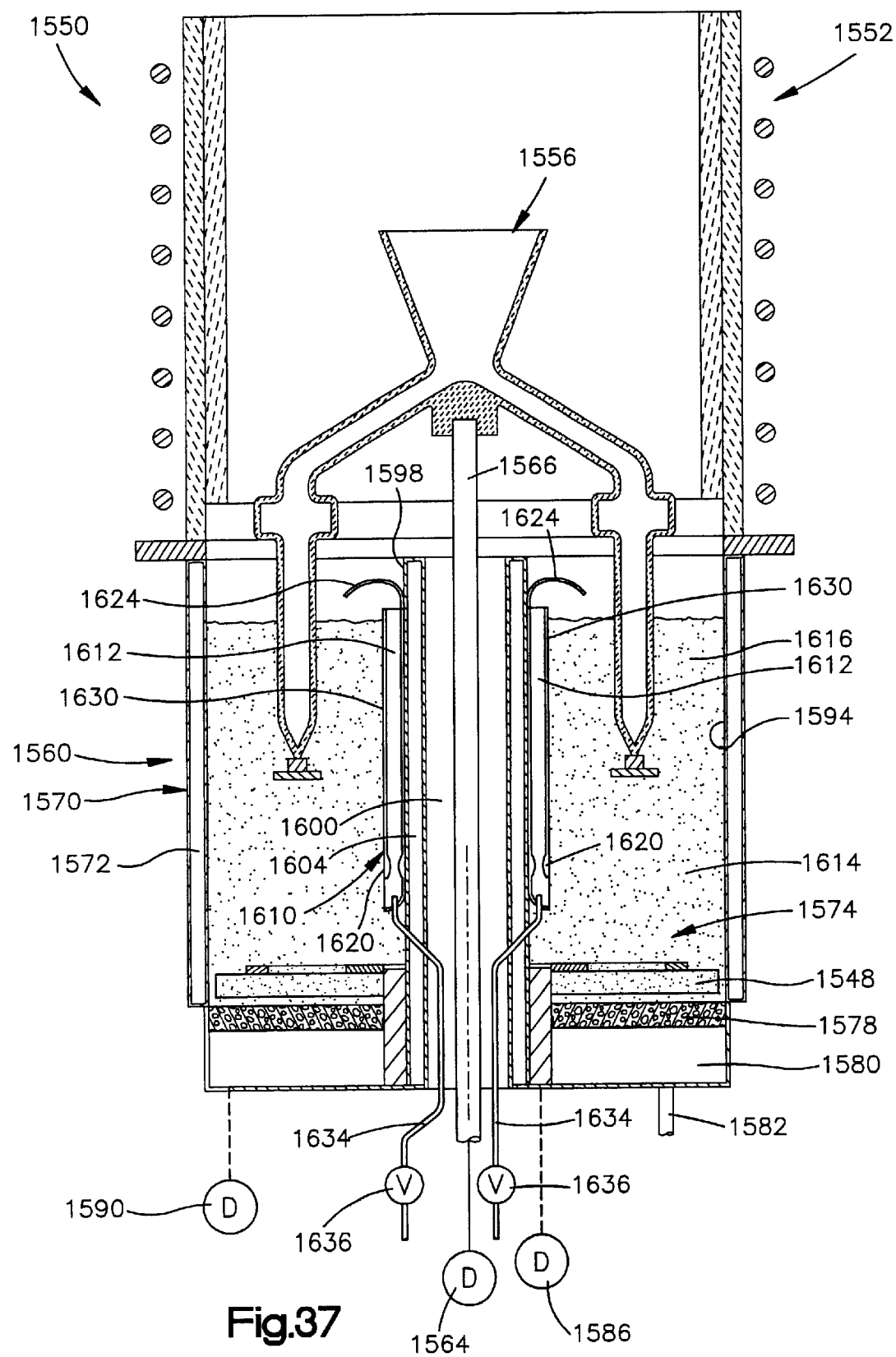
FIG. 37. is a fragmentary schematic illustration, generally similar to FIG. 28, illustrating the relationship between a furnace assembly, a mold, an annular fluidized bed, and an apparatus for conducting a flow of particulate suspended in gas from a lower end portion of the annular fluidized bed to an upper end portion of the annular fluidized bed.

A casting apparatus 1550 is illustrated schematically in FIG. 37. The casting apparatus 1550 includes a furnace assembly 1552. The casting apparatus 1550 may include a housing having the same construction as the housing illustrated in FIGS. 1 and 27 and having an upper housing and a lower housing. The furnace assembly 1552 is disposed in the upper housing.

A mold 1556 and a container 1560 are movable relative to the furnace assembly 1552 in the same manner as previously described in conjunction with the embodiments of the invention illustrated in FIGS. 1–6 and FIGS. 27 and 28. A mold support drive assembly 1564 is connected with the mold 1556 by a mold support member or shaft 1566. The mold 1556 is supported by engagement of the support member 1566 with a central portion of the mold in the same manner as previously described in conjunction with the embodiments of the invention illustrated in FIGS. 9 and 28. However, it should be understood that the mold 1556 may be suspended in the manner disclosed in FIG. 18 or supported on a perforated support member in the manner illustrated in FIGS. 3, 4 and 34.

The container 1560 (FIG. 37) has a cylindrical side wall 1570. A cooling jacket 1572 extends around the outside of the container 1560. A fluidized bed 1574 is disposed in the container 1560.

The fluidized bed 1574 is formed of particles suspended in a flow of gas. The gas may be argon. The particles may be alumina particles of 325 to 90 mesh size. Although the particles may be formed of alumina, it is believed that it may be preferred to utilize zircon particles which have a more rounded configuration than alumina particles.

Prior to fluidization of the bed, the particulate is held in the container 1560. The particulate may rest on a porous layer 1578 disposed within the container 1560. Gas to fluidized the particulate in the container 1560 is supplied to a plenum chamber 1580 through a conduit 1582 in the same manner as previously discussed in conjunction with the embodiments of the invention illustrated in FIGS. 1 and 27.

A stirrer assembly 1548 may be provided adjacent to the porous layer 1578. However, if desired, the stirrer assembly 1548 may be omitted. A drive assembly 1586 is connected with the stirrer assembly and is effective to rotate the stirrer assembly in the container 1560.

A drive assembly 1590 is connected with the container 1560. The drive assembly 1590 is operable to raise and lower the container 1560 relative to the furnace assembly 1552 in the same manner as previously described in conjunction with the embodiments of the invention illustrated in FIGS. 1 through 36.

The fluidized bed 1574 has an annular configuration similar to the annular configuration of the fluidized beds illustrated in FIGS. 28 through 33. The annular fluidized bed 1574 is disposed in an annular chamber 1594 in the container 1560. The annular chamber 1594 is disposed between the cylindrical outer side wall 1570 and a cylindrical inner wall 1598 of the container 1560. The circular inner wall 1598 of the container 1560 extends around a passage 1600 and is coaxial with the outer wall 1570.

The passage 1600 has a cylindrical configuration that extends through the container 1560 and the annular fluidized bed 1574. The support member 1566 extends through the passage 1600. The cylindrical support member 1566 is disposed in a coaxial relationship with the passage 1600, container 1560 and furnace assembly 1552.

The coaxial cylindrical outer wall 1570 and the cylindrical inner wall 1598 of the container 1560 function as heat sinks. Thus, the outer wall 1570 is cooled by a flow of liquid through the cooling jacket 1572. Similarly, the inner wall 1598 is cooled by a flow of liquid through a cooling jacket 1604. The container 1560 has the same construction as the container 1050 illustrated in FIG. 28.

The fluidized bed 1574 has a generally annular cross sectional configuration and is disposed in the annular chamber 1594. Of course, if the chamber 1594 had a different cross sectional configuration, the fluidized bed 1574 would have a different cross sectional configuration.

A fluidized bed cooling apparatus 1610 is disposed adjacent to the inner wall 1598 of the container 1560. The fluidized bed cooling apparatus 1610 has the same construction and mode of operation as the fluidized bed cooling apparatus 1490 of FIG. 34. If desired, additional fluidized bed cooling apparatus may be located adjacent to the outer wall 1570 of the container 1560 in the manner illustrated in FIG. 34.

The fluidized bed cooling apparatus 1610 (FIG. 37) includes a conduit 1612 which conducts a flow of particulate suspended in gas between a lower end portion 1614 of the fluidized bed 1574 and an upper end portion 1616 of the fluidized bed. The conduit 1612 separates the fluidized bed 1574 from the flow of particulate between lower and upper end portions 1614 and 1616 of the fluidized bed. A pump 1620 is operable to induce a flow of particulate suspended in gas from the lower end portion 1614 of the fluidized bed 1574 through the conduit 1612 to the upper end portion 1616 of the fluidized bed.

A baffle 1624 extends across an outlet from the conduit 1612 to direct the flow of particulate suspended in gas from the conduit toward the upper end portion of the fluidized bed 1574 in the same manner as previously described in conjunction with the embodiment of FIGS. 34–36. The baffle 1624 may direct the flow of particulate into the fluidized bed 1574 without engaging the mold 1556. Alternatively, the baffle 1624 may direct at least a portion of the flow of particulate suspended in gas against an outer surface of the mold 1556.

A cooling jacket 1630 is provided between the conduit 1612 and the fluidized bed 1574. The cooling jacket 1630 conducts a flow of cooling fluid (water). The cooling jacket 1630 is effective to prevent transfer of heat from the fluidized bed 1574 to the flow of particulate suspended in gas conducted through the conduit 1612. The cooling jacket 1630 is also effective to cool the flow of particulate suspended in gas conducted through the conduit 1612.

The pumps 1620 are ejector pumps having the same construction as the pump 1494 of FIG. 35. A flow of high pressure transport gas (argon) is conducted through a conduit 1634 to the pump 1620. A valve 1636 is operable to control the transport fluid flow through the conduit 1634.

As was previously mentioned in conjunction with the embodiment of the invention illustrated in FIGS. 34–36, an actuator for the valve 1636 may be controlled by a computer. A temperature sensor provides an output to the computer indicative of the temperature of the upper end portion 1616 of the fluidized bed 1574. When the temperature of the upper end portion 1616 of the fluidized bed 1574 exceeds a predetermined temperature, the computer effects operation of the actuator to open the valve 1636. This results in a flow of high pressure transport gas through the pump 1620 with a resulting aspiration of particulate suspended in gas from the lower end portion 1614 of the fluidized bed 1574 into the pump 1620. The flow of particulate suspended in gas is conducted from the pump 1620 through the conduit 1612 to the upper end portion 1616 of the fluidized bed.

A pair of temperature sensors may provide outputs to the computer indicative of the temperature differential between the lower and upper end portions 1614 and 1616 of the fluidized bed 1574. When the temperature differential between the lower and upper end portions 1614 and 1616 of the fluidized bed exceeds a predetermined magnitude, the computer effects operation of the actuator to open the valve 1636. This results in a flow of relatively cool particulate suspended in gas into the pump 1620 and a pumping of relatively cool particulate suspended in gas through the conduit 1612 to the upper end portion 1616 of the fluidized bed 1574.

Although the fluidized bed cooling apparatus 1610 is illustrated in FIG. 37 as including only two conduits 1612 and two pumps 1620, it should be understood that the fluidized bed cooling apparatus 1610 could include a greater or lesser number of conduits 1612 and pumps 1620. For example, a circular array of conduits 1612 may be provided in a side-by-side relationship about the inner wall 1598 of the container 1560. Alternatively, a series of spaced apart conduits 1612 may be disposed about the cylindrical inner wall 1598 of the container 1560. In addition, conduits 1612 and pumps 1620 may be provided along the outer wall 1520 of the container 1560 in the same manner as described in conjunction with the embodiment of FIG. 34.

In the embodiment of the invention illustrated in FIG. 37, the conduits 1612 and pumps 1620 of the fluidized bed cooling apparatus 1610 are illustrated as being disposed on the outside of the cylindrical inner wall 1598. However, if desired, the conduits 1612 and pumps 1620 may be disposed in the passage 1600 formed by the inner wall 1598 of the container 1560. Alternatively, the conduits 1612 may be disposed in the cooling jacket 1604 connected with the inner wall 1598 of the container 1560. As was previously mentioned, conduits 1612 and pumps 1620 may be provided in association with the outer wall 1520 of the container 1560 in a manner similar to the manner previously described in conjunction with FIGS. 34–36.

The manner in which the pumps 1620 cooperate with the conduits 1612 and baffles 1624 to direct a flow of particulate suspended in gas from the relatively cool lower end portion 1614 of the fluidized bed to the relatively hot upper end portion 1616 of the fluidized bed is the same as was previously described in conjunction with the embodiment of the invention illustrated in FIGS. 34–36. It is believed that fluid ejector type pumps 1620 may be preferred due to their simplicity of construction and lack of moving parts. However, other known types of pumps may be utilized if desired. For example, a rotary vane pump or a gear pump may be utilized.

It is contemplated that the relatively hot particulate suspended in a flow of gas may be conducted from the upper end portion 1616 of the fluidized bed to 1574 to the lower end portion 1614 of the fluidized bed. This would result in upward movement, in the fluidized bed 1574, of the relatively cool particulate suspended in a flow of gas from the lower end portion 1614 of the fluidized bed to the upper end portion 1616 of the fluidized bed. The flow of relatively hot particulate suspended in a flow of gas conducted from the upper end portion 1616 of the fluidized bed 1574 to the lower end portion 1614 of the fluidized bed would cause the relatively cool particulate suspended in a flow of gas in the lower portion of the fluidized bed to circulate in an upward direction in the fluidized bed. In addition, there would be a mixing of the flow of relatively hot particulate suspended in a flow of gas from the upper end portion 1616 of the fluidized bed 1574 with the relatively cool particulate suspended in a flow of gas in the lower portion 1614 of the fluidized bed.

When a flow of relatively hot particulate suspended in gas is to be conducted from the upper end portion 1616 of the fluidized bed 1574 to the lower end portion 1614 of the fluidized bed, the orientation of the fluidized bed cooling apparatus 1610 would be changed by one hundred and eighty degrees from the orientation illustrated in FIG. 37. The pump 1620 would be positioned adjacent to the upper end portion 1616 of the fluidized bed 1574 at a level below the upper surface of the fluidized bed. The conduit 1612 would extend downward from the pump 1620 to the lower end portion 1614 of the fluidized bed. The outlet from the conduit 1612 would be located at a level above the stirrer assembly 1548. The baffle 1624 would be disposed below the outlet from the conduit 1612 and would direct a flow of relatively hot particulate suspended in gas toward a central portion of the lower end portion 1614 of the fluidized bed 1574.

By using the pump 1620 to induce a flow of relatively hot particulate suspended in gas from the upper end portion 1616 to the lower end portion 1614 of fluidized bed 1574, turbulence adjacent to the upper surface of the fluidized bed 1574 tends to be minimized. At the same time, mixing of the particulate with the flow of gas from the plenum chamber 1580 in the lower portion 1614 of the fluidized bed 1574 tends to be maximized. The flow of hot particulate suspended in gas and conducted downward through the conduit 1612 may be cooled by a cooling jacket corresponding to the cooling jacket 1630.

It should be understood that any of the features of the embodiments of the invention illustrated in FIGS. 1 through 36 may be utilized with the embodiment of the invention illustrated in FIG. 37. Specifically, one or more of the features of the embodiments of the invention illustrated in FIGS. 28 through 33 and relating to annular fluidized beds may be utilized in association with the annular fluidized bed 1574 of FIG. 37. Of course, various features of the embodiments of the invention illustrated in FIGS. 1 through 27 may be utilized in association with the annular fluidized bed 1574 of FIG. 37. For example, the plenum chamber 1580 may be supplied with gas at different pressures to obtain different flow rates through different portions of the porous layer 1578 in the manner previously explained in conjunction with the embodiments of the invention illustrated in FIGS. 8 and 11. Similarly, baffles may be connected with the container 1560 and/or mold 1556 to direct a flow of particulate suspended in gas toward and/or away from various portions of the mold 1556.

Alternative Fluidized Bed Cooling Apparatus

In the embodiments of the invention illustrated in FIGS. 34, 36, and 37, and flow of particulate suspended in gas is conducted from a lower end portion of a fluidized bed and directed onto an upper surface of an upper end portion of a fluidized bed. However, it is contemplated that the flow of particulate suspended in gas may be directed into the upper end portion of the fluidized bed at a location below the upper surface of the fluidized bed.

To enable a flow of particulate suspended in gas to be directed from a conduit 1650 into a fluidized bed 1562 at a location below an upper surface 1654 of the fluidized bed (FIG. 38), the conduit has an outlet 1658 which directs the flow of particulate suspended in gas into the upper end portion of the fluidized bed. The outlet 1658 may be disposed any desired distance below the upper side surface 1654 of the fluidized bed 1650.

Figure 38:
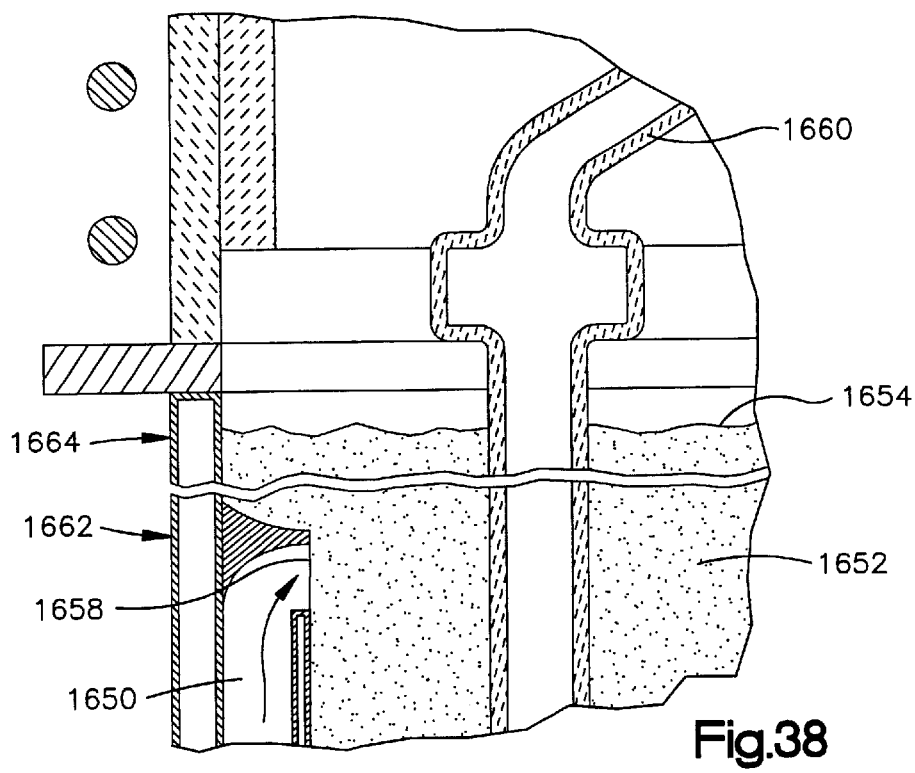
FIG. 38. is a fragmentary schematic illustration, generally similar to FIG. 36, illustrating the manner in which a flow of particulate suspended in gas is directed from a conduit into an upper portion of the fluidized bed at a location below an upper surface of the fluidized bed.

The embodiment of the invention illustrated in FIG. 38 has the same construction and mode of operation as the embodiment of the invention illustrated in FIGS. 34–36. However, in the embodiment of the invention illustrated in FIGS. 34–36 the outlet 1520 from the conduit 1492 is disposed above the upper surface 1522 of the fluidized bed 1422. In the embodiment of the invention illustrated in FIG. 38, the outlet from the conduit 1650 is disposed below the surface 1654 of the fluidized bed 1652.

The flow of particulate suspended in gas is directed from the conduit outlet 1658 toward the mold 1660. This results in a stream of the particulate suspended in a flow of gas flowing from the outlet 1658 around a portion of the mold 1660. The stream or current of particulate suspended in a flow of gas flows through openings in a peripheral portion of the mold 1660 into a central portion of the mold.

Although only a single conduit 1650 and outlet 1658 is shown in FIG. 38, a plurality of conduits and outlets may be provided along the cylindrical side wall 1662 of the container 1664. This results in streams of particulate suspended in a flow of gas moving from the conduits through a plurality of openings disposed in an annular array in the mold 1660. Each of the streams of particulate move into an open central portion of the mold 1660.

If desired, a baffle may be provided in association with the outlet 1658. The baffle may be disposed below the outlet 1658 and direct a flow of particulate suspended in a flow of gas upward in the fluidized bed 1652. The baffle may be configured to direct the flow of particulate suspended in a flow of gas from the outlet 1658 upward and away from the mold 1660. Alternatively, the baffle may be configured to direct the flow of particulate suspended in a flow of gas upward and toward the mold 1660.

The conduit 1650 is illustrated in FIG. 38 adjacent to a side wall 1662 of a container 1664 having the same construction as the container 1444 of FIG. 34. However, if desired, the container 1664 may have an annular construction corresponding to the annular construction of the container 1560 of FIG. 37. If this is done, the conduit 1650 may be disposed adjacent to either the inner wall of the container, in the manner illustrated schematically in FIG. 37 or the outer wall of the container in the manner illustrated 38. Of course, conduits corresponding to the conduit 1650 may be mounted adjacent to both the inner and outer walls of an annular container.

In the embodiment of the invention illustrated in FIGS. 34 through 38, a flow of particulate suspended in gas has been conducted between a lower end portion of a fluidized bed and an upper end portion of the fluidized bed in order to cool the upper end portion of the fluidized bed. In the embodiment of the invention illustrated in FIG. 39, a flow of particulate suspended in gas is conducted from a source outside of the fluidized bed to the upper end portion of the fluidized bed.

A movable container 1670 is disposed beneath a stationary furnace assembly 1672. The container 1670 and furnace assembly 1672 may have the same construction as the container and furnace assembly of the embodiments illustrated in FIGS. 1 through 26. Alternatively, the container 1670 may have the annular construction of the embodiments illustrated in FIGS. 27 through 33.

The container 1670 has a cylindrical side wall 1676. A cooling jacket 1678 extends around the side wall 1676. The container 1670 holds a fluidized bed 1682. A mold 1684 containing molten metal may be lowered into the fluidized bed 1682. It should be understood that the mold 1684 and fluidized bed 1682 cooperated in the same manner as previously explained in conjunction with the embodiments illustrated in FIGS. 1 through 38.

Figure 39:
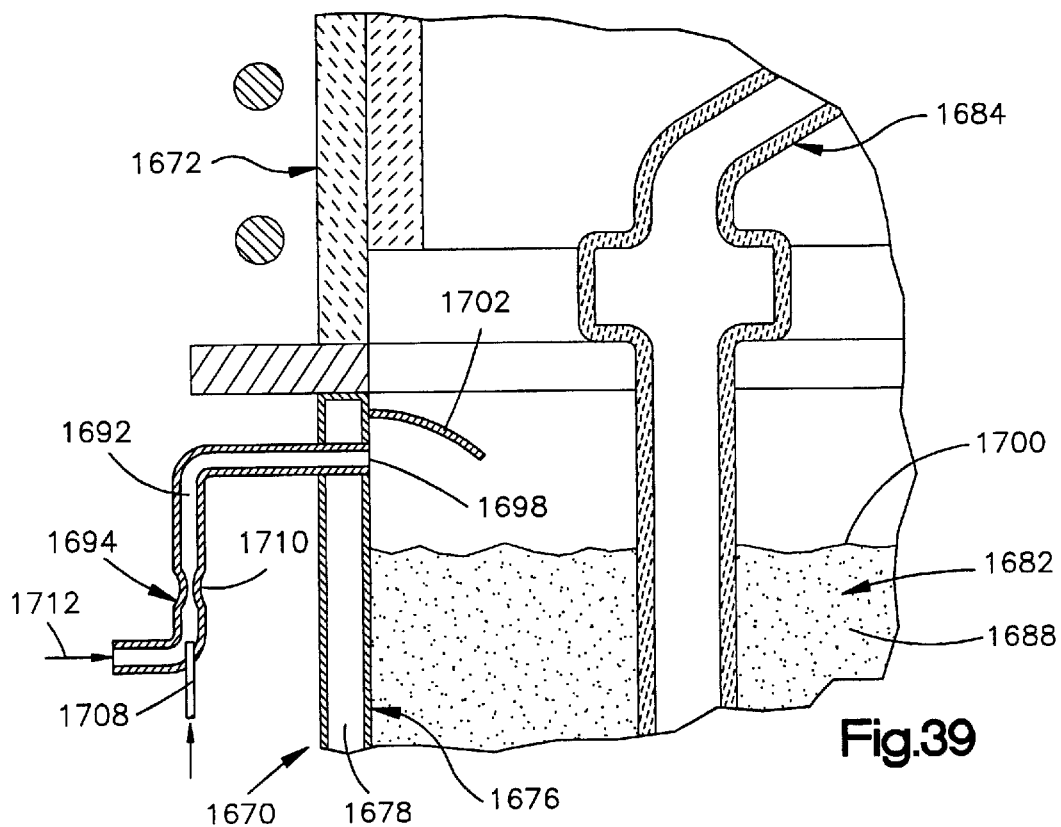
FIG. 39. is a fragmentary schematic illustration, generally similar to FIG. 36, illustrating a manner in which a flow of particulate suspended in gas is conducted from a location outside of the fluidized bed to an upper end portion of the fluidized bed.

In accordance with a feature of the embodiment of the invention illustrated in FIG. 39, relatively cool particulate suspended in a flow of relatively cool gas is conducted from a location outside of the container 1670 to the fluidized bed 1682 in the container. The flow of relatively cool particulate and gas into the fluidized bed 1682 is effective to cool the upper end portion 1688 of the fluidized bed. The flow of relatively cool particulate suspended in relatively cool gas is conducted into the container 1670 through a conduit 1692.

A fluid ejector type pump 1694 is operable under the same manner as the pump 1494 of FIG. 34 to induce a flow of particulate suspended in gas through the conduit 1692 into the container 1670. Of course, a different type of pump may be utilized if desired. For example, either a rotary vane pump or a gear pump may be utilized rather than a fluid injector type pump.

In the embodiment of the invention illustrated in FIG. 39, an outlet 1698 from the conduit 1692 is disposed at a location above an upper surface 1700 of the fluidized bed 1682. A baffle 1702 is effective to direct the flow of particulate suspended in gas from the outlet 1698 of the conduit 1692 downward toward the upper surface 1700 of the fluidized bed 1682. If desired, the outlet 1698 and baffle 1702 may be located beneath the upper surface 1700 the fluidized bed 1682.

The illustrated pump 1694 is of the fluid ejector type. A conduit 1708 conducts a flow of transport gas (argon) under pressure to the pump 1694. The flow of transport gas from the conduit 1708 is directed into a venturi type nozzle 1710 in the pump 1694. The resulting acceleration of the gas at the nozzle 1710 induces a flow of particulate suspended in gas into the pump 1694 with an aspirating action in the manner indicated schematically by an arrow 1712 in FIG. 39.

Although only a single conduit 1692 is illustrated in FIG. 39, it should be understood that there are a plurality of conduits 1692 which extend from locations outside of the container 1670 through the side wall 1676 of the container. A relatively cool flow of particulate suspended in gas is conducted through each of the conduits and is directed onto the upper surface 1700 of the fluidized bed 1682 by baffles corresponding to the baffle 1702. If desired, conduits 1692 may direct the flow of relatively cool particulate suspended in gas into a container 1670 at locations above the upper surface 1700 of the fluidized bed and at locations below the upper surface of the fluidized bed. If the fluidized bed 1682 and container 1670 have an annular configuration, as previously described in conjunction with FIG. 37, conduits 1692 may be provided in association with an inner wall of the container or with both inner and outer walls of the container.

Conclusion

The present invention relates to a new and improved method and apparatus (FIGS. 34–37) for use in casting one or more metal articles. During casting of a metal article, a mold 1416, 1556, 1660, 1684 may be moved into a fluidized bed. The fluidized bed 1422, 1574, 1652, 1682 may be formed of particulate materials suspended in a flow of gas. As the mold is moved into the fluidized bed, molten metal in the mold solidifies.

In accordance with one of the features of the present invention, an upper end portion 1482, 1616, 1652, 1688 of the fluidized bed 1422, 1574, 1652, 1682 may be cooled. Cooling of the upper end portion of the fluidized bed may be accomplished by conducting a flow of relatively cool particulate suspended in gas to the upper end portion of the fluidized bed. The flow of particulate suspended in gas may be conducted from a lower end portion 1484, 1614 of the fluidized bed to an upper end portion 1482, 1616, 1652 of a fluidized bed. Alternatively, the flow of relatively cool particulate suspended in gas may be conducted from a location outside of the fluidized bed 1682 to the upper end portion 1688 of the fluidized bed. If desired, the flow of particulate suspended in gas may be conducted from the upper end portion 1482, 1616, 1652 of the fluidized bed to the lower end portion 1484, 1614 of the fluidized bed.

It should be understood that any one of the features of the invention may be utilized by itself or in combination with other features of the invention. It should also be understood that the invention is not to be limited to any one of the specific embodiments disclosed herein. This is because there are many different ways in which the various features of the invention may be used together or separately and in which they may be changed from the specific embodiments disclosed herein.

Having described the invention, the following is claimed:

1. A method of casting a metal article, said method comprising the steps of providing a fluidized bed formed of particulate suspended in a flow of gas, conducting a flow of particulate suspended in gas between a lower end portion of the fluidized bed and an upper end portion of the fluidized bed along a flow path which is separate from the particulate which is suspended in the flow of gas in the fluidized bed, moving a mold containing molten metal into the fluidized bed, and solidifying molten metal in the mold as the mold moves into the fluidized bed.

2. A method as set forth in claim 1 further including the step of supporting the mold containing molten metal on a perforated support, said step of moving the mold into the fluidized bed includes flowing gas and particulate through openings in the perforated support.

3. A method as set forth in claim 1 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

4. A method as set forth in claim 1 further including the step of moving a stirrer member in the fluidized bed about an axis which extends along a path which the mold is moved into the fluidized bed to promote uniform distribution of particulate in the flow of gas.

5. A method as set forth in claim 1 further including the step of directing a flow of gas into the peripheral portion of the fluidized bed at a plurality of locations disposed above a lower end portion of the fluidized bed during performance of said step of moving the mold into the fluidized bed.

6. A method as set forth in claim 1 wherein the fluidized bed has an annular configuration, said method includes the step of supporting the mold above the fluidized bed with an elongated member which extends through a central portion of the annular fluidized bed and is spaced from the particulate material suspended in the flow of gas, said step of moving the mold into the fluidized bed is performed with the elongated member spaced from the particulate material suspended in the flow of gas.

7. A method as set forth in claim 1 wherein the fluidized bed is disposed in an annular chamber in a container, said method further includes the step of supporting the mold above the fluidized bed with a support member which extends through the fluidized bed and is outside the annular chamber, said step of moving the mold into the fluidized bed includes lowering the support member relative to the container while the support member remains outside the annular chamber.

8. A method as set forth in claim 1 further including the step of increasing speed of movement of gas and particulate in the fluidized bed as the gas and particulate flow from a lower portion of the fluidized bed to an upper portion of the fluidized bed by forming the fluidized bed with a relatively large cross-sectional area at a lower portion of the fluidized bed and a relatively small cross sectional area at an upper portion of the fluidized bed.

9. A method as set forth in claim 1 further including the step of decreasing speed of movement of gas and particulate in the fluidized bed as the gas and particulate flow from a lower portion of the fluidized bed to an upper portion of the fluidized by forming the fluidized bed with a relatively small cross-sectional area at a lower portion of the fluidized bed and relatively large cross-sectional area at an upper portion of the fluidized bed.

10. A method as set forth in claim 1 wherein the mold includes a pour cup connected in fluid communication with a plurality of article mold cavities, said method further includes supporting the mold on an upper end portion of a support column having a central axis which extends through the mold with portions of the mold in which the article mold cavities are disposed spaced from the support column and with the mold free of engagement with any support structure other than the upper end portion of the support column.

11. A method as set forth in claim 1 further including the step of deflecting flow of gas and particulate with a baffle disposed adjacent to the mold during performance of said step of moving the mold into the fluidized bed.

12. A method as set forth in claim 1 further including the steps of moving the mold into a furnace assembly, moving a container toward the furnace assembly, and establishing the fluidized bed in the container.

13. A method as set forth in claim 1 wherein said step of solidifying the molten metal in the mold includes solidifying at least a portion of the molten metal in the mold with a cellular solidification front disposed between molten and solid metal.

14. A method as set forth in claim 1 wherein gas is conducted through the fluidized bed at a flow rate of between 5 and 100 cubic feet per hour for each square foot of fluidized bed disposed in a horizontal plane extending through a lower end portion of the fluidized bed.

15. A method as set forth in claim 1 wherein a passage extends through the fluidized bed, said step of conducting a flow of particulate between the lower end portion of the fluidized bed and the upper end portion of the fluidized bed includes conducting the flow of particulate through at least a portion of a passage in a central portion of the fluidized bed.

16. A method as set forth in claim 1 further including the step of providing a heat sink adjacent to the path of flow of particulate between the lower end portion of the fluidized bed and the upper end portion of the fluidized bed.

17. A method as set forth in claim 1 wherein the fluidized bed is disposed in an annular chamber disposed between inner and outer side walls of a container, said step of conducting a flow of particulate suspended in gas between a lower end portion of the fluidized bed and an upper end portion of the fluidized bed includes conducting the flow of particulate suspended in gas along at least one of the side walls of the container.

18. A method as set forth in claim 1 further including the step of deflecting a flow of gas and particulate in the fluidized bed with a stationary baffle as the mold is moved into the fluidized bed.

19. A method as set forth in claim 1 wherein said step of conducting a flow of particulate suspended in gas between the lower end portion of the fluidized bed and an upper portion of the fluidized bed includes conducting the flow of particulate through at least a portion of a passage which extends along a wall of a container which holds the fluidized bed.

20. A method as set forth in claim 1 further including the step of cooling the flow of particulate suspended in gas as the flow of particulate moves between the lower end portion of the fluidized bed and an upper end portion of the fluidized bed.

21. A method as set forth in claim 20 wherein said step of cooling the flow of particulate suspended in gas includes conducting a flow of cooling liquid along the flow path of particulate between the lower end portion of the fluidized bed and the upper end portion of the fluidized bed.

22. A method as set forth in claim 20 wherein said step of cooling the flow of particulate suspended in gas includes conducting the flow of particulate along a wall of a container which holds the fluidized bed and transmitting heat from the flow of particulate to the wall of the container.

23. A method as set forth in claim 22 wherein said step of cooling the flow of particulate suspended in gas includes conducting a flow of cooling liquid along the wall of the container to which heat is transmitted from the flow of particulate.

24. A method as set forth in claim 1 wherein said step of conducting a flow of particulate suspended in gas between a lower end portion of the fluidized bed and an upper end portion of the fluidized bed includes conducting a flow of a transport gas under pressure into a passage having an inlet connected in fluid communication with one end portion of the fluidized bed and an outlet adjacent to another end portion of the fluidized bed, and inducing a flow of particulate suspended in gas from the fluidized bed, through the inlet to the passage and through the outlet from the passage under the influence of the flow of transport gas.

25. A method as set forth in claim 24 wherein the flow of particulate suspended in gas is cooled during flow from the inlet to the passage to the outlet from the passage.

26. A method as set forth in claim 1 wherein said step of conducting a flow of particulate suspended in gas between the lower end portion of the fluidized bed and an upper end portion of the fluidized bed includes pumping a flow of particulate suspended in gas between the lower end portion of the fluidized bed and the upper end portion of the fluidized bed.

27. A method as set forth in claim 1 further including the step of engaging the flow of particulate suspended in gas with a baffle disposed adjacent to one end portion of the fluidized bed to direct the flow of particulate suspended in gas into the one end portion of the fluidized bed.

28. A method as set forth in claim 1 wherein the fluidized bed has a generally annular cross sectional configuration in a plane perpendicular to a central axis of the fluidized bed, said step of conducting a flow of particulate suspended in gas between a lower end portion of the fluidized bed and an upper end portion of the fluidized bed includes conducting the flow of particulate suspended in gas along a path which extends along the central axis of the fluidized bed.

29. A method as set forth in claim 1 wherein the fluidized bed is disposed in a container having a generally annular cross sectional configuration in a plane perpendicular to a central axis of the fluidized bed, said step of conducting a flow of particulate suspended in gas between a lower end portion of the fluidized bed and an upper end portion of the fluidized bed includes conducting the flow of particulate suspended in gas through a conduit which is connected with an inner wall of the container and conducting the flow of particulate suspended in gas through a conduit which is connected with an outer wall of the container.

30. A method as set forth in claim 1 wherein said step of conducting a flow of particulate suspended in gas between a lower end portion of the fluidized bed and an upper end portion of the fluidized bed includes conducting a flow of particulate suspended in gas from the lower end portion of the fluidized bed to the upper end portion of the fluidized bed.

31. A method as set forth in claim 30 wherein said step of conducting a flow of particulate suspended in gas from the lower end portion of the fluidized bed to the upper end portion of the fluidized bed includes conducting a flow of particulate suspended in gas from the lower end portion of the fluidized bed into a pump and conducting a flow of particulate suspended in gas from the pump through a conduit toward the upper end portion of the fluidized bed.

32. A method as set forth in claim 1 wherein said step of conducting a flow of particulate suspended in gas between a lower end portion of the fluidized bed and an upper end portion of the fluidized bed includes conducting a flow of particulate suspended in gas from the upper end portion of the fluidized bed to the lower end portion of the fluidized bed.

33. A method as set forth in claim 32 wherein said step of conducting a flow of particulate suspended in gas from the upper end portion of the fluidized bed to the lower end portion of the fluidized bed includes conducting a flow of particulate suspended in gas from the upper end portion of the fluidized bed into a pump and conducting a flow of particulate suspended in gas from the pump through a conduit toward the lower end portion of the fluidized bed.

34. A method as set forth in claim 1 further including the steps of sensing temperature of at least one end portion of the fluidized bed, and controlling a rate of flow of particulate suspended in gas between the lower end portion of the fluidized bed and an upper end portion of the fluidized bed as a function of the sensed temperature.

35. A method as set forth in claim 1 further including the steps of sensing temperature of the lower end portion of the fluidized bed, sensing temperature of the upper end portion of the fluidized bed, and controlling a rate of flow of particulate suspended in gas between the lower end portion of the fluidized bed and the upper end portion of the fluidized bed as a function of a temperature differential between the lower and upper end portions of the fluidized bed.

36. A method of casting a metal article, said method comprising the steps of providing a fluidized bed formed of particulate material suspended in a flow of gas, cooling an upper end portion of the fluidized bed by conducting a flow of particulate suspended in gas into the upper end portion of the fluidized bed, moving a mold containing molten metal from a furnace assembly into the fluidized bed, solidifying the molten metal in the mold as the mold moves into the fluidized bed, and moving the fluidized bed away from the furnace assembly with the mold at least partially disposed in the fluidized bed.

37. A method as set forth in claim 36 wherein said step of conducting a flow of particulate suspended in gas into the upper end portion of the fluidized bed includes conducting a flow of particulate suspended in gas from a lower end portion of the fluidized bed into the upper end portion of the fluidized bed.

38. A method as set forth in claim 37 further including the step of transmitting heat from the flow of particulate suspended in gas before the flow of particulate suspended in gas moves into the upper end portion of the fluidized bed.

39. A method ass et forth in claim 36 wherein said step of conducting a flow of particulate suspended in gas into the upper end portion of the fluidized bed is initiated prior to initiating movement of a mold containing molten metal from the furnace assembly into the fluidized bed.

40. A method as set forth in claim 36 wherein said step of conducting a flow of particulate suspended in gas into an upper end portion of the fluidized bed includes conducting the flow of particulate suspended in gas along a side wall of a container in which the fluidized bed is disposed.

41. A method as set forth in claim 36 wherein said step of conducting a flow of particulate suspended in gas into an upper portion of the fluidized bed includes conducting a flow of particulate suspended in gas from a location spaced from the fluidized bed into the upper portion of the fluidized bed.

42. A method as set forth in claim 36 wherein the fluidized bed has an annular configuration in a plane perpendicular to a central axis of the fluidized bed and is disposed between inner and outer walls of a container, said step of conducting a flow of particulate into the fluidized bed includes conducting the flow of particulate suspended in gas through a first conduit which is connected with the inner wall of the container and conducting the flow of particulate suspended in gas through a second conduit which is connected with the outer wall of the container.

43. A method of casting a metal article, said method comprising the steps of providing a fluidized bed formed of particulate suspended in a flow of gas, moving a mold containing molten metal into an upper end portion of the fluidized bed, transferring heat from the mold to the fluidized bed to promote solidification of the molten metal in the mold, and cooling the upper end portion of the fluidized bed by flowing particulate suspended in gas from a lower end portion of the fluidized bed into a pump and pumping particulate suspended in gas from the pump to the upper end portion of the fluidized bed.

44. A method as set forth in claim 43 further including the step of sensing a temperature of the upper end portion of the fluidized bed and initiating performance of said step of cooling the upper end portion of the fluidized bed in response to sensing that the temperature of the upper end portion of the fluidized bed is a predetermined temperature.

45. A method as set forth in claim 43 further including the step of supporting the mold containing molten metal on a perforated support, said step of moving the mold into the fluidized bed includes flowing gas and particulate through openings in the perforated support.

46. A method as set forth in claim 43 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

47. A method as set forth in claim 43 further including the step of moving a stirrer member in the fluidized bed about an axis which extends along a path which the mold is moved into the fluidized bed to promote uniform distribution of particulate in the flow of gas.

48. A method as set forth in claim 43 further including the step of directing a flow of gas into a peripheral portion of the fluidized bed at a plurality of locations disposed above a lower end portion of the fluidized bed during performance of said step of moving the mold into the fluidized bed.

49. A method as set forth in claim 43 wherein the fluidized bed has an annular configuration, said method includes the step of supporting the mold above the fluidized bed with an elongated member which extends through a central portion of the annular fluidized bed and is spaced from the particulate material suspended in the flow of gas, said step of moving the mold into the fluidized bed is performed with the elongated member spaced from the particulate material suspended in the flow of gas.

50. A method as set forth in claim 43 wherein the fluidized bed is disposed in an annular chamber in a container, said method further includes the step of supporting the mold above the fluidized bed with a support member which extends through the fluidized bed and is outside the annular chamber, said step of moving the mold into the fluidized bed includes lowering the support member relative to the container while the support member remains outside the annular chamber.

51. A method as set forth in claim 43 further including the step of increasing speed of movement of gas and particulate in the fluidized bed as the gas and particulate flow from a lower portion of the fluidized bed to an upper portion of the fluidized bed by forming the fluidized bed with a relatively large cross-sectional area at a lower portion of the fluidized bed and a relatively small cross sectional area at an upper portion of the fluidized bed.

52. A method as set forth in claim 43 further including the step of decreasing speed of movement of gas and particulate in the fluidized bed as the gas and particulate flow from a lower portion of the fluidized bed to an upper portion of the fluidized by forming the fluidized bed with a relatively small cross-sectional area at a lower portion of the fluidized bed and relatively large cross-sectional area at an upper portion of the fluidized bed.

53. A method as set forth in claim 43 wherein the mold includes a pour cup connected in fluid communication with a plurality of article mold cavities, said method further includes supporting the mold on an upper end portion of a support column having a central axis which extends through the mold with portions of the mold in which the article mold cavities are disposed spaced from the support column and with the mold free of engagement with any support structure other than the upper end portion of the support column.

54. A method as set forth in claim 43 further including the step of deflecting flow of gas and particulate with a baffle disposed adjacent to the mold during performance of said step of moving the mold into the fluidized bed.

55. A method as set forth in claim 43 further including the steps of moving the mold into a furnace assembly, moving a container toward the furnace assembly, and establishing the fluidized bed in the container.

56. A method as set forth in claim 43 further including the step of solidifying at least a portion of the molten metal in the mold with a cellular solidification front disposed between molten and solid metal.

57. A method as set forth in claim 43 wherein gas is conducted through the fluidized bed at a flow rate of between 5 and 100 cubic feet per hour for each square foot of fluidized bed disposed in a horizontal plane extending through a lower end portion of the fluidized bed.

58. A method as set forth in claim 43 wherein a passage extends through the fluidized bed, said step of pumping particulate suspended in gas from the lower end portion of the fluidized bed to the upper end portion of the fluidized bed includes conducting a flow of particulate through a conduit disposed in the passage.

59. A method as set forth in claim 43 further including the step of providing a heat sink adjacent to the path of flow of particulate between the lower end portion of the fluidized bed and the upper end portion of the fluidized bed.

60. A method as set forth in claim 43 wherein the fluidized bed is disposed in an annular chamber disposed between inner and outer side walls of a container, said step of pumping particulate suspended in gas from the pump to the upper end portion of the fluidized bed includes conducting a flow of particulate suspended in gas along at least one of the side walls of the container.

61. A method as set forth in claim 43 further including the step of deflecting a flow of gas and particulate in the fluidized bed with a baffle as the mold is moved into the fluidized bed.

62. A method as set forth in claim 43 wherein said step of pumping particulate suspended in gas from a the pump to the upper portion of the fluidized bed includes conducting a flow of particulate through a conduit which extends along a wall of a container which holds the fluidized bed.

63. A method as set forth in claim 43 further including the step of cooling the particulate suspended in gas as the particulate moves between the pump and the upper end portion of the fluidized bed.

64. A method as set forth in claim 63 wherein said step of cooling the particulate suspended in gas includes conducting a flow of cooling liquid along a flow path of the particulate between the pump and the upper end portion of the fluidized bed.

65. A method as set forth in claim 63 wherein said step of cooling particulate suspended in gas includes conducting a flow of particulate along a wall of a container which holds the fluidized bed and transmitting heat from the flow of particulate to the wall of the container.

66. A method as set forth in claim 65 wherein said step of cooling the particulate suspended in gas includes conducting a flow of cooling liquid along the wall of the container to which heat is transmitted from the particulate.

67. A method as set forth in claim 43 further including the step of engaging a pumped flow of particulate suspended in gas with a baffle disposed adjacent to the upper end portion of the fluidized bed to direct the flow of particulate suspended in gas into the upper end portion of the fluidized bed.

68. A method as set forth in claim 43 wherein the fluidized bed has a generally annular cross sectional configuration in a plane perpendicular to a central axis of the fluidized bed, said step of pumping particulate suspended in gas to the upper end portion of the fluidized bed includes conducting a flow of particulate suspended in gas along a path which extends along the central axis of the fluidized bed.

69. A method as set forth in claim 43 wherein the fluidized bed is disposed in a container having a generally annular cross sectional configuration in a plane perpendicular to a central axis of the fluidized bed, said step of pumping particulate suspended in gas to the upper end portion of the fluidized bed includes conducting a flow of particulate suspended in gas through a conduit which is connected with an inner wall of the container and conducting a flow of particulate suspended in gas through a conduit which is connected with an outer wall of the container.

* * * * *

UNITED STATES PATENT AND TRADEMARK OFFICE
CERTIFICATE OF CORRECTION

PATENT NO. : 6,695,034 B2
DATED : February 24, 2004
INVENTOR(S) : Lawrence D. Graham It is certified that error appears in the above-identified patent and that said Letters Patent is hereby corrected as shown below:

<u>Column 64,</u>
Line 10, after "fluidized" insert -- bed --.

<u>Column 66,</u>
Line 66, after "method" delete "ass et" and insert -- as set --.

<u>Column 68,</u>
Line 26, after "fluidized" insert -- bed --.

<u>Column 69,</u>
Line 11, after "from" delete -- a --.

Signed and Sealed this

Sixteenth Day of November, 2004

JON W. DUDAS
*Director of the United States Patent and Trademark Office*